United States Patent
Luther et al.

(10) Patent No.: US 10,941,165 B2
(45) Date of Patent: Mar. 9, 2021

(54) PEROVSKITE NANOCRYSTALS AND METHODS OF MAKING THE SAME

(71) Applicant: Alliance for Sustainable Energy, LLC, Golden, CO (US)

(72) Inventors: Joseph Matthew Luther, Boulder, CO (US); Abhijit Hazarika, Lakewood, CO (US)

(73) Assignee: Alliance for Sustainable Energy, LLC, Golden, CO (US)

(*) Notice: Subject to any disclaimer, the term of this patent is extended or adjusted under 35 U.S.C. 154(b) by 0 days.

(21) Appl. No.: 16/540,592

(22) Filed: Aug. 14, 2019

(65) Prior Publication Data

US 2020/0055882 A1 Feb. 20, 2020

Related U.S. Application Data

(60) Provisional application No. 62/719,769, filed on Aug. 20, 2018.

(51) Int. Cl.
*H01B 1/06* (2006.01)
*C07F 7/24* (2006.01)
(Continued)

(52) U.S. Cl.
CPC ............ *C07F 7/24* (2013.01); *H01B 1/00* (2013.01); *H01B 1/06* (2013.01); *H01G 9/2063* (2013.01);
(Continued)

(58) Field of Classification Search
CPC ..... H01B 1/00; H01B 1/06; C07F 13/00; C07F 7/24; C01G 21/006; C01G 21/16
See application file for complete search history.

(56) References Cited

U.S. PATENT DOCUMENTS

2020/0148711 A1* 5/2020 Leijtens ............... H01L 51/422

FOREIGN PATENT DOCUMENTS

WO 2016198889 A1 12/2016
WO 2017089819 A1 6/2017

OTHER PUBLICATIONS

Wang et al "Stability of perovskite solar cells: A prospective on the substitution of the A cation and X anion", Angew. Chem. Int. Ed. 2017, 56, 1190-1212.*

(Continued)

*Primary Examiner* — Mark Kopec
(74) *Attorney, Agent, or Firm* — Michael A. McIntyre

(57) ABSTRACT

The present disclosure relates to a perovskite that includes $A_{1-x}A'_xBX_3$, where A is a first cation, A' is a second cation, B is a third cation, X is a first anion, and $0<1-x\le1$. In some embodiments of the present disclosure, the perovskite may further include a second anion (X') such that the perovskite includes $A_{1-x}A'_xB(X_{1-z}X'_z)_3$, where $0<z\le1$. In some embodiments of the present disclosure, the perovskite may further include a fourth cation (A*) such that the perovskite includes $A_{1-x-y}A'_xA*_yB(X_{1-z}X'_z)_3$, where $0<y\le1$. In some embodiments of the present disclosure, the perovskite may further include a fifth cation (B') such that the perovskite includes $A_{1-x-y}A'_xA*_yB_{1-a}B'_a(X_{1-z}X'_z)_3$, where $0<a\le1$.

15 Claims, 61 Drawing Sheets

(51) Int. Cl.
H01L 31/032 (2006.01)
H01L 51/00 (2006.01)
H01G 9/20 (2006.01)
H01B 1/00 (2006.01)
H01L 51/42 (2006.01)
(52) U.S. Cl.
CPC ........ *H01L 31/032* (2013.01); *H01L 51/0077* (2013.01); *H01L 51/42* (2013.01)

(56) References Cited

OTHER PUBLICATIONS

Pazoki et al "Electronic structure of organic-inorganic lanthanide iodide perovskite solar cell materials", Journal of Materials Chemistry A, 2017, 5, 23131.*
Aharon et al "Temperature dependence of hole conductor free formation lead iodide perovskite based solar cells", J. Mater. Chem. A., 2015, 3, 9171.*
Yi et al "Entropic stabilization of mixed A-cation ABX3 metal halide perovskites . . . ", Energy Environ. Sci., 2016, 9, 656.*
Luo et al "Fabrication of CsxFA1-xPbI3 Mixed-Cation Perovskites . . . ", ACS Applied Materials & Interfaces 2017, 9, 42708-42716.*
Akkerman, Q. et al., "Tuning the Optical Properties of Cesium Lead Halide Perovskite Nanocrystals by Anion Exchange Reactions," Journal of the American Chemical Society, vol. 137, 2015, pp. 10276-10281.
Akkerman, Q. et al., "Genesis, challenges and opportunities for colloidal lead halide perovskite nanocrystals," Nature Materials, vol. 17, May 2018, pp. 394-405.
Beberwyck, B. et al., "Ion Exchange Synthesis of III-V Nanocrystals," Journal of the American Chemical Society, vol. 134, 2012, pp. 19977-19980.
Bekenstein, Y. et al., "Highly Luminescent Colloidal Nanoplates of Perovskite Cesium Lead Halide and Their Oriented Assemblies," Journal of the American Chemical Society, vol. 137, 2015, pp. 16008-16011.
Bi, C. et al., "Room-Temperature Construction of Mixed-Halide Perovskite Quantum Dots with High Photoluminescence Quantum Yield," Journal of Physical Chemistry C, vol. 122, 2018, pp. 5151-5160.
Deroo, J. et al., "Highly Dynamic Ligand Binding and Light Absorption Coefficient of Cesium Lead Bromide Perovskite Nanocrystals," ACS Nano, vol. 10, 2016, pp. 2071-2018.
De Trizio, L. et al., "Cu3-xP Nanocrystals as a Material Platform for Near-Infrared Plasmonics and Cation Exchange Reactions," Chemistry of Materials, vol. 27, 2015, pp. 1120-1128.
Endres, J. et al., "Valence and Conduction Band Densities of States of Metal Halide Perovskites: A Combined Experimental-Theoretical Study," Journal of Physical Chemistry Letters, vol. 7, 2016, pp. 2722-2729.
Eperon, G. et al., "Inorganic caesium lead iodide perovskite solar cells," Journal of Materials Chemistry A, vol. 3, 2015, pp. 19688-19695.
Giustino, F. et al., "Toward Lead-Free Perovskite Solar Cells," ACS Energy Letters, 2016, vol. 1, pp. 1233-1240.
Khadka, D. et al., "Tailoring the Open-Circuit Voltage Deficit of Wide-Band-Gap Perovskite Solar Cells Using Alkyl Chain-Substituted Fullerene Derivatives," Applied Materials and Interfaces, vol. 10, 2018, pp. 22074-22082.
Kieslich, G. et al., "Solid-state principles applied to organic-inorganic perovskites: new tricks for an old dog," Chemical Science, vol. 5, 2014, pp. 4712-4715.
Kieslich, G. et al., "An extended Tolerance Factor approach for organic-inorganic perovskites," Chemical Science, vol. 6, 2015, pp. 3430-3433.
Koscher, B. et al., "Surface-vs Diffusion-Limited Mechanisms of Anion Exchange in CsPbBr3 Nanocrystal Cubes Revealed through Kinetic Studies," Journal of the American Chemical Society, vol. 138, 2016, pp. 12065-12068.
Li, Z. et al., "Stabilizing Perovskite Structures by Tuning Tolerance Factor: Formation of Formamidinium and Cesium Lead Iodide Solid-State Alloys," Chemistry of Materials, vol. 28, 2016, pp. 284-292.
Lignos, I. et al., "Exploration of Near-Infrared-Emissive Colloidal Multinary Lead Halide Perovskite Nanocrystals Using an Automated Microfluidic Platform," ACS Nano, vol. 12, 2018, pp. 5504-5517.
Lin, Y. et al., "Matching Charge Extraction Contact for Wide-Bandgap Perovskite Solar Cells," Advanced Materials, vol. 29, 2017, 8 pages.
Luther, J. et al., "Synthesis of PbS Nanorods and Other Ionic Nanocrystals of Complex Morphology by Sequential Cation Exchange Reactions," Journal of American Chemical Society, vol. 131, 2009, pp. 16851-16857.
Nedelcu, G. et al., Fast Anion-Exchange in Highly Luminescent Nanocrystals of Cesium Lead Halide Perovskites (CsPbX3, X=Cl, Br, I), ACS Nano Letters, 2015, vol. 15, pp. 5635-5640.
Pietryga, J. et al., "Utilizing the Lability of Lead Selenide to Produce Heterostructured Nanocrystals with Bright, Stable Infrared Emission," Journal of the American Chemical Society, 2008, vol. 130, pp. 4879-4885.
Pool, V. et al., "Thermal engineering of FAPbI3 perovskite material via radiative thermal annealing and in situ XRD," Nature Communications, 2016, 8 pages.
Prathapani, S. et al., "Electronic band structure and carrier concentration of formamidinium-cesium mixed cation lead mixed halide hybrid perovskites," Applied Physics Letters, 2018, vol. 112, 4 pages.
Protesescu, L. et al., "Dismantling the "Red Wall" of Colloidal Perovskites: Highly Luminescent Formamidinium and Formamidinium-Cesium Lead Iodide Nanocrystals," ACS Nano, 2017, vol. 11, pp. 3119-3134.
Protesescu, I. et al., "Nanocrystals of Cesium Lead Halide Perovskites (CsPbX3, X=Cl, Br, and I): Novel Optoelectronic Materials Showing Bright Emission with Wide Color Gamut," Nano Letters, vol. 15, 2015, pp. 3692-3696.
Ramasamy, P. et al., "All-inorganic cesium lead halide perovskite nanocrystals for photodetector applications," ChemComm Communication, vol. 52, 2016, pp. 2067-2070.
Rivest, J. et al., "Cation exchange on the nanoscale: an emerging technique for new material synthesis, device fabrication, and chemical sensing," Chem. Soc. Rev., vol. 42, 2013, pp. 89-96.
Routzahn, A. et al., "Single-Nanocrystal Reaction Trajectories Reveal Sharp Cooperative Transitions," NanoLetters, vol. 14, 2014, pp. 987-992.
Sanehira, E. et al., "Enhanced mobility CsPbI3 quantum dot arrays for record-efficiency, high-voltage photovoltaic cells," Science Advances, vol. 3, 2017, 8 pages.
Shannon, R.D., "Revised Effective Ionic Radii and Systematic Studies of Interatomic Distances in Halides and Chalcogenides," Acta Cryst., vol. 32, 1976, 17 pages.
Son, D. et al., "Cation Exchange Reactions in Ionic Nanocrystals," Science, 2004, vol. 306, 5 pages.
Stoumpos, C. et al., "Semiconducting Tin and Lead Iodide Perovskites with Organic Cations: Phase Transitions, High Mobilities, and Near-Infrared Photoluminescent Properties," Inorganic Chemistry, vol. 52, 2013, pp. 9019-9038.
Swarnkar, A. et al., "Colloidal CsPbBr3 Perovskite Nanocrystals: Luminescence beyond Traditional Quantum Dots," Angewandte Communications, International Edition, vol. 54, 2015, pp. 15424-15428.
Swarnkar, A. et al., "Quantum dot-induced phase stabilization of α-CsPbI3 perovskite for high-efficiency photovoltaics," Science, vol. 354, Issue 6308, Oct. 2016, 5 pages.
Weller, M. et al., "Cubic Perovskite Structure of Black Formamidinium Lead Iodide, α-[HC(NH2)2]PbI3, at 298 K," Journal of Physical Chemistry Letters, vol. 6, 2015, pp. 3209-3212.

(56) References Cited

OTHER PUBLICATIONS

Werner, J. et al., "Complex Refractive Indices of Cesium-Formamidinium-Based Mixed-Halide Perovskites with Optical Band Gaps from 1.5 to 1.8 eV," ACS Energy Letters, 2018, vol. 3, pp. 742-747.

Wheeler, L. et al., "Dynamic Evolution of 2D Layers within Perovskite Nanocrystals via Salt Pair Extraction and Reinsertion," Journal of Physical Chemistry C, vol. 122, 2018, pp. 14029-14038.

Xu, X. et al., "Air-processed mixed-cation $Cs_{0.15}Fa_{0.85}PbI_3$ planar perovskite solar cells derived from a $PbI_2$-CsI-FAI intermediate complex," Journal of Materials Chemistry A, 2018, vol. 6, pp. 7731-7740.

Yi, C. et al., "Entropic stabilization of mixed A-cation $ABX_3$ metal halide perovskites for high performance perovskite solar cells," Energy & Environmental Science, vol. 9, 2016, pp. 656-662.

Zhu, X. et al., "Computed and Experimental Absorption Spectra of the Perovskite $Ch_3NH_3PbI_3$," Journal of Physical Chemistry Letters, vol. 5, 2014, pp. 3061-3065.

Jacobsson, T. et al., "Exploration of the compositional space for mixed lead halogen perovskites for high efficiency solar cells," Energy & Environmental Science, vol. 9, 2016, pp. 1706-1724.

Ono, L. et al., "Progress on Perovskite Materials and Solar Cells with Mixed Cations and Halide Anions," Applied Materials & Interfaces, vol. 9, 2017, pp. 30197-30246.

Parobek, D. et al., "Photoinduced Anion Exchange in Cesium Lead Halide Perovskite Nanocrystals," Journal of the American Chemical Society, vol. 139, 2017, pp. 4358-4361.

Saliba, M. et al., "Cesium-containing triple cation perovskite solar cells: improved stability, reproducibility and high efficiency," Energy & Environmental Science, vol. 9, 2016, pp. 1989-1997.

\* cited by examiner

PEROVSKITE NANOCRYSTALS AND METHODS OF MAKING THE SAME

CROSS-REFERENCE TO RELATED APPLICATIONS

This application claims the benefit of U.S. Provisional Patent Application No. 62/719,769 filed Aug. 20, 2018, the contents of which are incorporated herein by reference in their entirety.

CONTRACTUAL ORIGIN

The United States Government has rights in this disclosure under Contract No. DE-AC36-08GO28308 between the United States Department of Energy and Alliance for Sustainable Energy, LLC, the Manager and Operator of the National Renewable Energy Laboratory.

BACKGROUND

The mixed A-cation composition of $Cs_{1-x}FA_xPbI_3$ is used in various reports of perovskite based optoelectronic devices (such as solar cells, light emitting materials, lasers, detectors, etc.) and reported in one instance in perovskite nanocrystals (NCs). However, in all of these reports, the full composition space with x varying from 0 to 1 has not been realized; e.g. the concentration of Cs is limited to less than about 50%, or (1−x) is limited to values less than 0.5. In thin films, the annealing temperature used to crystalize compositions with greater than 50% Cs (1−x>0.5) causes thermal decomposition of the FA (formamidinium). In direct synthesis of mixed composition nanocrystals, the reactivity of the Cs versus FA precursor differs enough to not allow for the full compositional tuning. Thus, there remains a need for new synthetic methods that enable the production of novel mixed cation perovskite compositions, having unique physical properties and characteristics.

SUMMARY

An aspect of the present disclosure is a perovskite that includes $A_{1-x}A'_xBX_3$, where A is a first cation, A' is a second cation, B is a third cation, X is a first anion, and 0<1−x≤1. In some embodiments of the present disclosure, the perovskite may further include a second anion (X') such that the perovskite includes $A_{1-x}A'_xB(X_{1-z}X'_z)_3$, where 0<z≤1. In some embodiments of the present disclosure, the perovskite may further include a fourth cation (A*) such that the perovskite includes $A_{1-x-y}A'_xA^*_yB(X_{1-z}X'_z)_3$, where 0<y≤1. In some embodiments of the present disclosure, the perovskite may further include a fifth cation (B') such that the perovskite includes $A_{1-x-y}A'_xA^*_yB_{1-a}B'_a(X_{1-z}X'_z)_3$, where 0<a≤1.

In some embodiments of the present disclosure, each of A, A', and A* may include at least one of an organic cation and/or an inorganic cation. In some embodiments of the present disclosure, each of A, A', and A* may include at least one of a Group 1 Element, an alkylammonium, and/or formamidinium (FA). In some embodiments of the present disclosure, the alkylammonium may be methylammonium (MA). In some embodiments of the present disclosure, both B and B' may include at least one of a Group 13 Element, a Group 14 Element, a Group 15 element, and/or a transition metal. In some embodiments of the present disclosure, both X and X' may include a halogen.

In some embodiments of the present disclosure, the perovskite may include $Cs_{1-x-y}FA_xMA_yPb(I_{1-z}Br_z)_3$. In some embodiments of the present disclosure, the perovskite may include at least one of $Cs_{1-y}MA_yPb(I_{1-z}Br_z)_3$, $Cs_{1-x}FA_xPb(I_{1-z}Br_z)_3$, and/or $FA_{1-y}MA_yPb(I_{1-z}Br_z)_3$. In some embodiments of the present disclosure, the perovskite may include at least one of $Cs_{1-y}MA_yPbI_3$, $Cs_{1-x}FA_xPbI_3$, $FA_{1-y}MA_yPbI_3$, $Cs_{1-y}MA_yPbBr_3$, $Cs_{1-x}FA_xPbBr_3$, and/or $FA_{1-y}MA_yPbBr_3$.

An aspect of the present disclosure is a method that includes combining a first perovskite and a second perovskite, where the first perovskite has a first composition that includes a first cation (A), a second cation (B), and a first anion (X), the second perovskite has a second composition that includes a third cation (A'), a fourth cation (B'), and a second anion (X'), and the combining results in the forming of a third perovskite having a third composition that includes at least three of A, A', B, B', X, and/or X'. In some embodiments of the present disclosure, the first composition may include at least one of $ABX_3$, $A_2BX_6$, and/or $A_3B_2X_9$. In some embodiments of the present disclosure, the second composition may include at least one of $A'B'X'_3$, $A'_2B'X'_6$, and/or $A'_3B'_2X'_9$.

In some embodiments of the present disclosure, the third perovskite composition may include at least one of $A''B''X''_3$, $A''_2B''X''_6$, and/or $A''_3B''_2X''_9$, A'' may include at least one of A and/or A', B'' may include at least one of B and/or B', and X'' may include at least one of X and/or X'. In some embodiments of the present disclosure, the first perovskite may include a least one of $Cs_2BiAgCl_6$, $Cs_2CuBiI_6$, $Cs_2PbI_6$, $Cs_2SnI_6$, $Cs_3Sb_2I_9$, $FAPbI_3$, $CsPbI_3$, $MAPbI_3$, and/or $MAPbBr_3$.

In some embodiments of the present disclosure, the second perovskite may include a least one of $Cs_2BiAgCl_6$, $Cs_2CuBiI_6$, $Cs_2PbI_6$, $Cs_2SnI_6$, $Cs_3Sb_2I_9$, $FAPbI_3$, $CsPbI_3$, $MAPbI_3$, and/or $MAPbBr_3$. In some embodiments of the present disclosure, the first perovskite may be different than the second perovskite. In some embodiments of the present disclosure, the third perovskite may include $Cs_{1-x}FA_xPb(I_{1-y}Br_y)_3$, 0≤1−x≤1, and 0≤y≤1. In some embodiments of the present disclosure, 0.5≤1−x≤0.99. In some embodiments of the present disclosure, the first perovskite and the second perovskite may be provided at a molar ratio of the first perovskite to the second perovskite between 0.1 to 1.0 and 10 to 1.0.

BRIEF DESCRIPTION OF THE DRAWINGS

Some embodiments are illustrated in referenced figures of the drawings. It is intended that the embodiments and figures disclosed herein are to be considered illustrative rather than limiting.

FIG. 4A illustrates ultraviolet-visible (UV-Vis) absorption spectra. FIG. 4B illustrates PL emission spectra of the mixed NCs showing tunability over a range between about 650 nm and about 800 nm range. FIG. 4C illustrates a TEM image of $Cs_{0.5}FA_{0.5}PbI_3$ NCs. FIG. 4D illustrates photoluminescence excitation (PLE) spectra of $Cs_{0.5}FA_{0.5}PbI_3$ NCs at different emission energies, which show the absence of substantial inhomogeneous broadening of the PL emission due to the mixed cation compositions.

FIG. 7A illustrates UV-Vis absorption and FIG. 7B illustrates PL emission spectra of small $CsPbI_3$, large $FAPbI_3$ and the resulting mixed cation perovskite NCs. Two kinds of distributions in the absorption spectrum of the mixed cation NCs are indicated by the vertical arrows in FIG. 7A. FIG. 7C illustrates the deconvolution of the asymmetric PL emission of the mixed A-cation $Cs_{1-x}FA_xPbI_3$ NCs; the spectrum can be deconvoluted with two Gaussians with peak maximum at ~680 nm and ~728 nm. FIG. 7D illustrates PLE spectra collected at different emission wavelengths of the $Cs_{1-x}FA_xPbI_3$ NCs showing two different sets with two different transition energies. The corresponding emission position are indicated by the vertical arrows on the PL spectrum.

REFERENCE NUMBERS

Figure 1A:
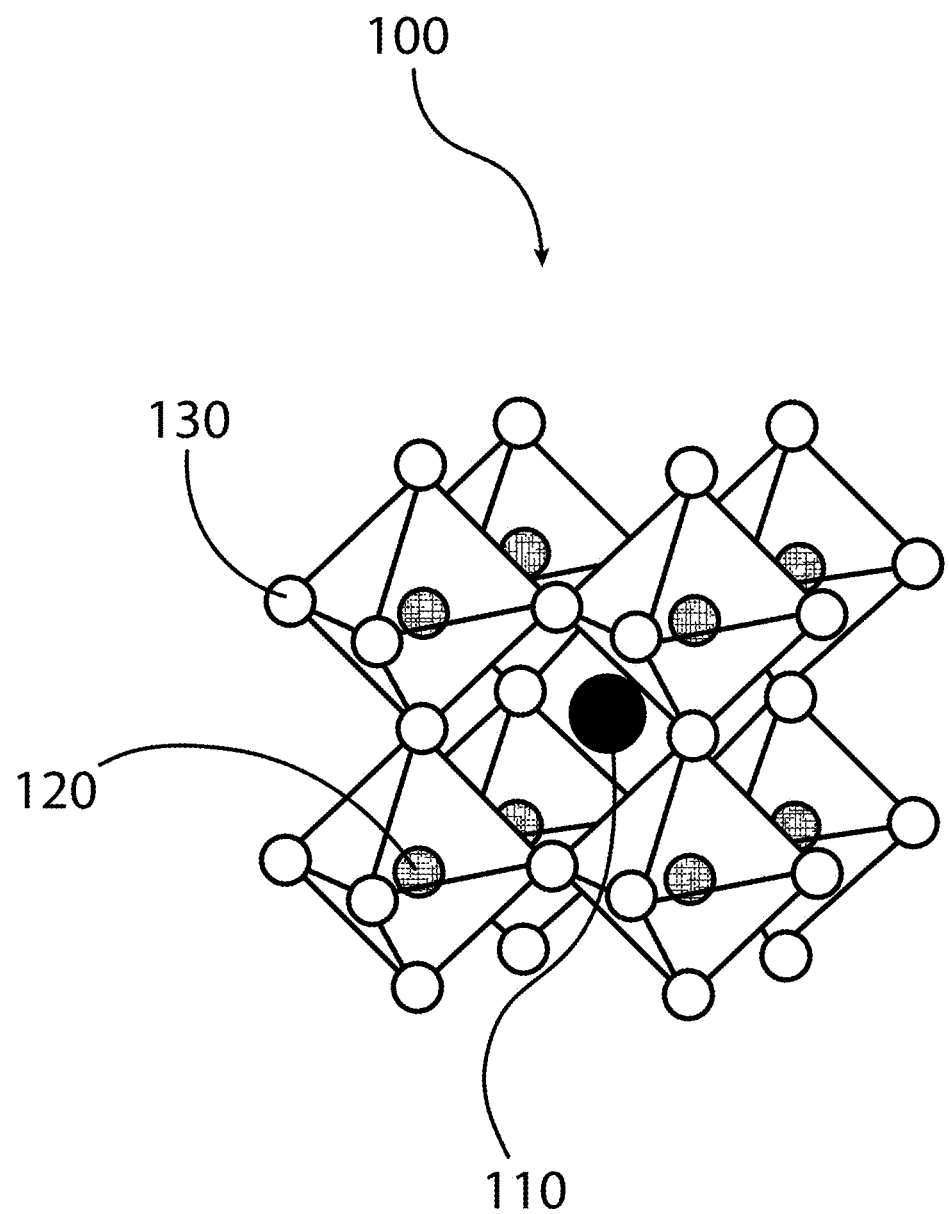
FIGS. 1A, 1B, and 1C illustrate a crystal structure for a perovskite, according to some embodiments of the present disclosure.

100 . . . perovskite
110 . . . A-cation
120 . . . B-cation
130 . . . X-anion
200 . . . method
210 . . . synthesizing a first starting perovskite
220 . . . synthesizing a second starting perovskite
230 . . . combining the first and second perovskite
240 . . . forming a mixed perovskite
250 . . . separating of the mixed perovskite

DETAILED DESCRIPTION

The present disclosure may address one or more of the problems and deficiencies of the prior art discussed above. However, it is contemplated that some embodiments as disclosed herein may prove useful in addressing other problems and deficiencies in a number of technical areas. Therefore, the embodiments described herein should not necessarily be construed as limited to addressing any of the particular problems or deficiencies discussed herein.

References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

The present disclosure relates to a process for creating a new class of perovskites, e.g. nanocrystals, crystals, and/or films, for example lead halide perovskites, for solar cells that exhibit high open circuit voltages (Von) with very low loss as compared to similar kinds of thin film perovskite photovoltaic devices. The process involves the synthesis of two or more different compositions of perovskite nanocrystals. The two or more compositions are then mixed together in suspension in varying relative amounts and then heated, resulting in a homogeneous perovskite composition made up of a mixture of the starting compositions. In some embodiments of the present disclosure, the nanocrystals may be an alloyed (i.e. formed) composition useful for various applications in optoelectronic devices including solar cells.

As described herein, some of these new perovskites were implemented into solar cell devices that generated up to about 90% of the maximum achievable $V_{OC}$ (as defined by the thermodynamic limit for a single junction solar cell). Exemplary perovskite compositions were created by combining at least one of methylammonium lead triiodide (MAPbI$_3$), formamidinium lead triiodide (FAPbI$_3$) and/or formamidinium lead tribromide (FAPbBr$_3$) with cesium lead triiodide (CsPbI$_3$) or cesium lead triiodide (CsPbBr$_3$) to create double A-cation (e.g. Cs and FA) perovskites, $Cs_{1-x}FA_xPb(I_{1-x}Br_x)_3$, where perovskite compositions comprising the full range of x were produced (0≤1−x≤1), or triple A-cation (e.g. Cs, FA, and MA) perovskites were produced, $Cs_{1-x-y}FA_xMA_yPbI_3$, with 0≤1−x−y≤1 and 0≤y≤1. Some of the mixed perovskites (containing more than one A-cation or more than one A-cation and more than one X-anion) produced demonstrated bright and finely tunable emission in the red/near-infrared range between 650 nm and 800 nm. The activation energy for the miscibility between Cs$^+$ and FA$^+$ was measured and determined to be about 0.65 eV.

Although the present disclosure describes methods for producing novel compositions of $Cs_{1-x}FA_xPbI_3$, $Cs_{1-x}FA_xPb(I_{1-x}Br_x)_3$, and/or $Cs_{1-x-y}FA_xMA_yPbI_3$ having mixed A-cations (e.g. Cs, MA, FA) or mixed A-cations and mixed X-anions (e.g. I and Br), the methods are believed to be applicable to a wide range of mixed-cation perovskites, as described below. In some embodiments of the present disclosure, the perovskite nanocrystals may exhibit quantum confinement affects; e.g. their bandgap and/or other optoelectronic and structural properties (photoluminescence lifetime, lattice constant, for example) may vary with nanocrystal size. In some embodiments of the present disclosure, a perovskite nanocrystal may have a characteristic length between one nanometer and one micrometer.

Figure 1B:
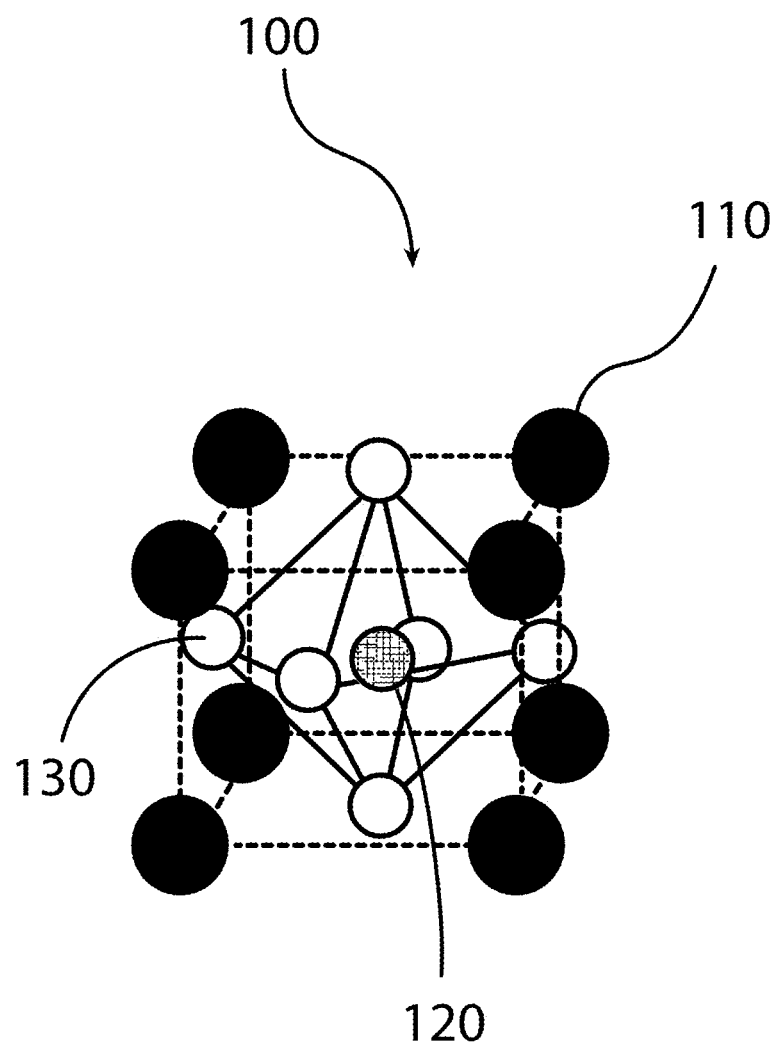
Figure 1C:
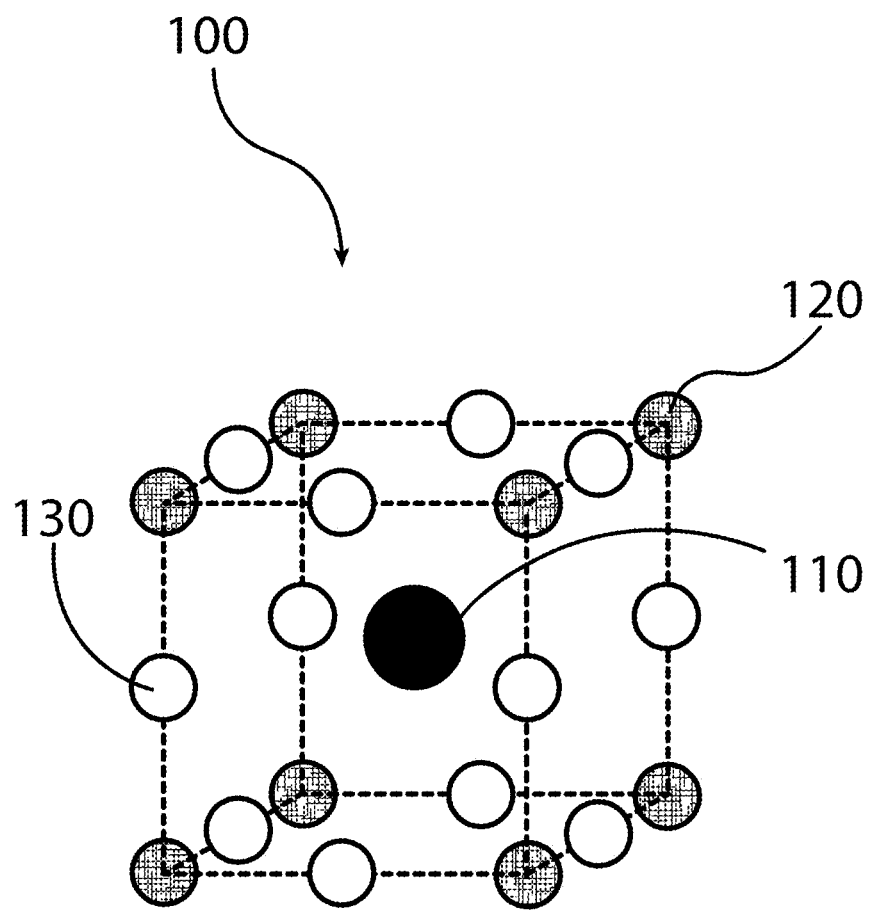

FIGS. 1A, 1B, and 1C illustrate that perovskites 100, for example halide perovskites, may organize into cubic crystalline structures with corner-sharing octahedra, as well as other crystalline structures such as tetragonal, hexagonal, and orthorhombic with either edge- or face-sharing octahedra, and may be described by the general formula ABX$_3$, where X (130) is an anion and A (110) and B (120) are cations, typically of different sizes (A typically larger than B). FIG. 1A illustrates that a perovskite 100 may be organized into eight octahedra surrounding a central A-cation 110, where each octahedra is formed by six X-anions 130 surrounding a central B-cation 120. FIG. 1B illustrates that a perovskite 100 may be visualized as a cubic unit cell, where the B-cation 120 is positioned at the center of the cube, an A-cation 110 is positioned at each corner of the cube, and an X-anion 130 is face-centered on each face of the cube. FIG. 1C illustrates that a perovskite 100 may also be visualized as a cubic unit cell, where the B-cation 120 resides at the eight corners of a cube, while the A-cation 110 is located at the center of the cube and with 12 X-anions centrally located between B-cations along each edge of the unit cell.

For both unit cells illustrated in FIGS. 1B and 1C, the A-cations 110, the B-cations 120, and the X-anions 130 balance to the general formula ABX$_3$, after accounting for the fractions of each atom shared with neighboring unit cells. For example, referring to FIG. 1B, the single B-cation 120 atom is not shared with any of the neighboring unit cells. However, each of the six A-anions 130 is shared between two unit cells, and each of the eight A-cations 110 is shared between eight unit cells. So, for the unit cell shown in FIG. 1B, the stoichiometry simplifies to B=1, A=8*0.124=1, and X=6*0.5=3, or ABX$_3$. Similarly, referring again to FIG. 1C, since the A-cation is centrally positioned, it is not shared with any of the unit cells neighbors. However, each of the 12 X-anions 130 is shared between four neighboring unit cells, and each of the eight B-cations 120 is shared between eight neighboring unit cells, resulting in A=1, B=8*0.125=1, and X=12*0.25=3, or ABX$_3$. Referring again to FIG. 1C, the X-anions 130 and the B-cations 120 are shown as aligned along an axis; e.g. where the angle at the X-anion 130 between two neighboring B-cations 120 is exactly 180 degrees, referred to herein as the tilt angle. However, a perovskite 100 may have a tilt angle not equal to 180 degrees. For example, some embodiments of the present disclosure may have a tilt angle between 153 and 180 degrees.

Typical inorganic perovskites include calcium titanium oxide (calcium titanate) minerals such as, for example, CaTiO$_3$ and SrTiO$_3$. In some embodiments of the present invention, the A-cation 110 may include a nitrogen-containing organic compound such as an alkyl ammonium compound. The B-cation 120 may include a metal and the X-anion 130 may include a halogen. Additional examples for the A-cation 110 include organic cations and/or inorganic cations, for example Cs, Rb, K, Na, Li, and/or Fr. Organic A-cations 110 may be an alkyl ammonium cation, for example a $C_{1-20}$ alkyl ammonium cation, a $C_{1-6}$ alkyl ammonium cation, a $C_{2-6}$ alkyl ammonium cation, a $C_{1-5}$ alkyl ammonium cation, a $C_{1-4}$ alkyl ammonium cation, a $C_{1-3}$ alkyl ammonium cation, a $C_{1-2}$ alkyl ammonium cation, and/or a $C_1$ alkyl ammonium cation. Further examples of organic A-cations 110 include methylammonium (CH$_3$NH$_3^+$), ethylammonium (CH$_3$CH$_2$NH$_3^+$), propylammonium (CH$_3$CH$_2$CH$_2$NH$_3^+$), butylammonium (CH$_3$CH$_2$CH$_2$CH$_2$NH$_3^+$), formamidinium (NH$_2$CH=NH$_2^+$), hydrazinium, acetylammonium, dimethylammonium, imidazolium, guanidinium and/or any other suitable nitrogen-containing or organic compound. In other examples, an A-cation 110 may include an alkylamine. Thus, an A-cation 110 may include an organic component with one or more amine groups. For example, an A-cation 110 may be an alkyl diamine halide such as formamidinium (CH(NH$_2$)$_2$). Thus, the A-cation 110 may include an organic constituent in combination with a nitrogen constituent. In some cases, the organic constituent may be an alkyl group such as straight-chain or branched saturated hydrocarbon group having from 1 to 20 carbon atoms. In some embodiments, an alkyl group may have from 1 to 6 carbon atoms. Examples of alkyl groups include methyl (C$_1$), ethyl (C$_2$), n-propyl (C$_3$), isopropyl (C$_3$), n-butyl (C$_4$), tert-butyl (C$_4$), sec-butyl (C$_4$), iso-butyl (C$_4$), n-pentyl (C$_5$), 3-pentanyl (C$_5$), amyl (C$_5$), neopentyl (C$_5$), 3-methyl-2-butanyl (C$_5$), tertiary amyl (C$_5$), and n-hexyl (C$_6$). Additional examples of alkyl groups include n-heptyl (C$_7$), n-octyl (C$_8$) and the like.

Examples of metal B-cations 120 include, for example, lead, tin, germanium, and or any other 2+ valence state metal that can charge-balance the perovskite 100. Further examples include transition metals in the 2+ state such as Mn, Mg, Zn, Cd, and/or lanthanides such as Eu. B-cations may also include elements in the 3+ valence state, as described below, including for example, Bi, La, and/or Y. Examples for X-anions 130 include halogens: e.g. fluorine, chlorine, bromine, and/or iodine. In some cases, a halide perovskite may include more than one X-anion 130, for example pairs of halogens; chlorine and iodine, bromine and iodine, and/or any other suitable pairing of halogens. In other cases, the halide perovskite 100 may include two or more halogens of fluorine, chlorine, bromine, and/or iodine.

Thus, the A-cation 110, the B-cations 120, and X-anion 130 may be selected within the general formula of $ABX_3$ to produce a wide variety of halide perovskites 100, including, for example, methylammonium lead triiodide ($CH_3NH_3PbI_3$), and mixed halide perovskites such as $CH_3NH_3PbI_{3-x}Cl_x$ and $CH_3NH_3PbI_{3-x}Br_x$. Thus, a halide perovskite 100 may have more than one halogen element, where the various halogen elements are present in non-integer quantities; e.g. x is not equal to 1, 2, or 3. In addition, halide perovskites, like other organic-inorganic perovskites, can form three-dimensional (3-D), two-dimensional (2-D), one-dimensional (1-D) or zero-dimensional (0-D) networks, possessing the same unit structure. As described herein, the A-cation 110 of a perovskite 100, may include one or more A-cations, for example, one or more of cesium, FA, MA, etc. Similarly, the B-cation 120 of a perovskite 100, may include one or more B-cations, for example, one or more of lead, tin, germanium, etc. Similarly, the anion 130 of a perovskite 100 may include one or more anions, for example, one or more halogens. Any combination is possible provided that the charges balance.

For example, a perovskite having the basic crystal structure illustrated in FIGS. 1A, 1B, and 1C in at least one of a cubic, orthorhombic, and/or tetragonal structure, may have other compositions resulting from the combination of the cations having various valence states in addition to the 2+ state and/or 1+ state described above for lead and alkyl ammonium cations; e.g. compositions other than $AB^{2+}X_3$ (where A is one or more cations, or for a mixed perovskite where A is two or more cations). Thus, the methods described herein may be utilized to create novel mixed cation materials having the composition of a double perovskite (elpasolites), $A_2B^{1+}B^{3+}X_6$, with an example of such a composition being $Cs_2BiAgCl_6$ and $Cs_2CuBiI_6$. Another example of a composition covered within the scope of the present disclosure is described by $A_2B^{4+}X_6$, for example $Cs_2PbI_6$ and $Cs_2SnI_6$. Yet another example is described by $A_3B_2^{3+}X_9$, for example $Cs_3Sb_2I_9$. For each of these examples, A is one or more cations, or for a mixed perovskite, A is two or more cations. As used herein, the term "mixed perovskite" refers to a perovskite having at least two of at least one of an A-cation, a B-cation, and/or an X-anion; i.e. two or more A-cations, two or more B-cations, and/or two or more X-anions.

Figure 2:
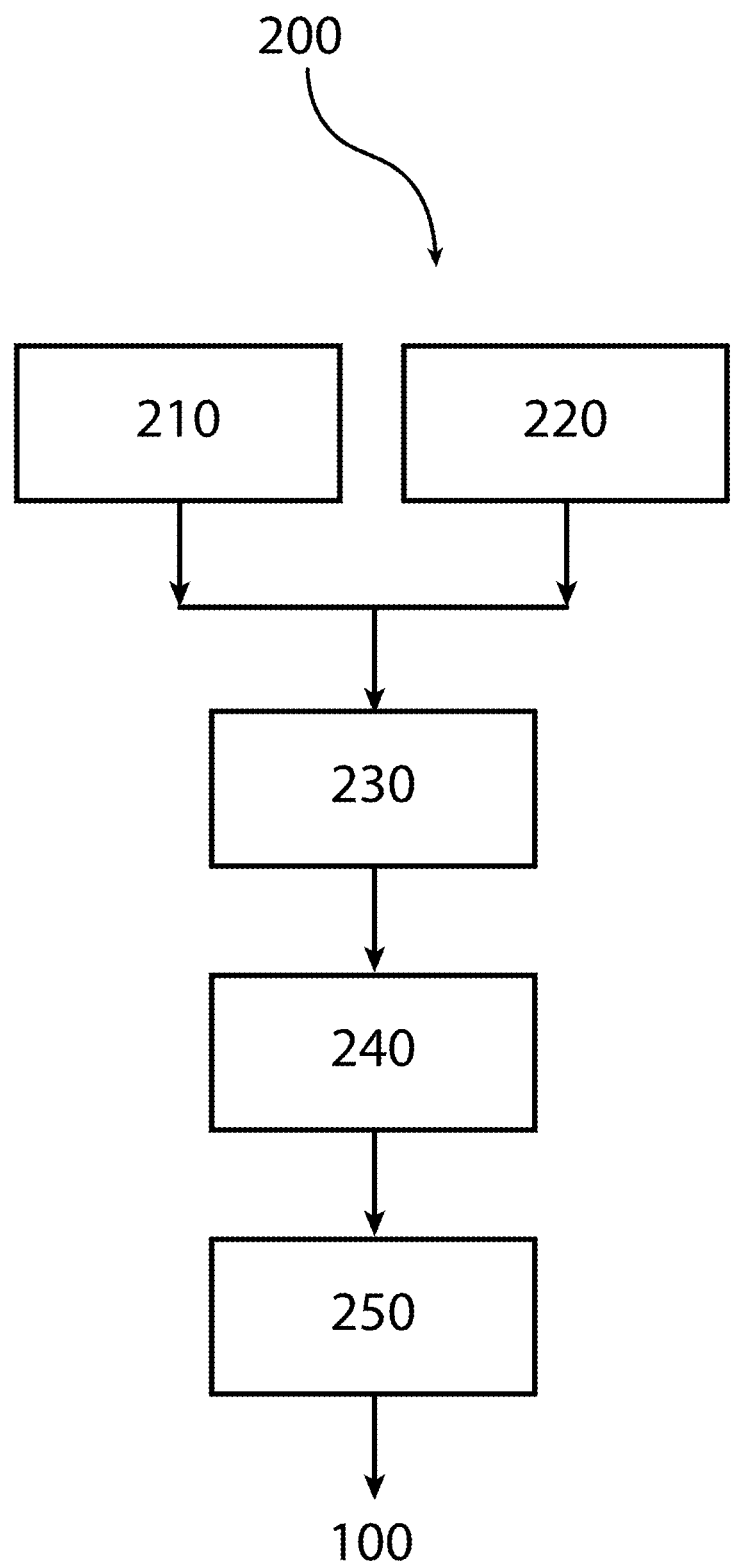
FIG. 2 illustrates a method for producing a perovskite having mixed A-cations, according to some embodiments of the present disclosure.

FIG. 2 illustrates a method 200 for producing a perovskite 100, as described above, in particular, a mixed perovskite having more than one A-cation 110 and/or more than one A-cation 110 and more than one X-anion 130; e.g. $A_{1-x}A'_xBX_3$ and/or $A_{1-x}A'_xB(X_{1-y}X'_y)_3$, where $0 \le 1-x \le 1$ and $0 \le y \le 1$. In some embodiments of the present disclosure, the method 200 may begin with the first synthesizing 210 of a first starting perovskite and the second synthesizing 220 of a second starting perovskite. In some embodiments of the present disclosure, the first starting perovskite may be defined by $ABX_3$, for example, $FAPbI_3$ or $FAPbBr_3$ (where A=FA, B=Pb, and X=I or Br), and the second starting perovskite may be defined by A'BX'3, for example, $CsPbI_3$ or $CsPbBr_3$ (where A'=Cs, B=Pb, and X'=I or Br). However, these compositions are presented for illustrative purposes, and any other combination of perovskites may be used and are considered within the scope of the present disclosure. The method 200 may then proceed with the combining 230 of the first starting perovskite and the second starting perovskite, where the combining 230 results in the forming of a mixed perovskite defined by $A_{1-x}A'_xBX_3$ and/or $A_{1-x}A'_xB(X_{1-y}X'_y)_3$, for example, $Cs_{1-x}FA_xPbI_3$ and/or $Cs_{1-x}FA_xPb(I_{1-y}Br_y)_3$, where $0 \le 1-x \le 1$ and $0 \le y \le 1$ depend on the conditions of the combining 230 (e.g. temperature, time, and/or agitation) and the ratios of the first starting perovskite to the second starting perovskite. The method 200 may then proceed with the separating 250 of the mixed perovskite from any other components (e.g. solvents, residual ions, and/or ligands) that were present in the combining 230 to yield a relatively pure form of the mixed perovskite 100. Although $Cs_{1-x}FA_xPb(I_{1-y}Br_y)_3$ is describe above, the methods described herein are applicable to other perovskite formulations as described above. In some embodiments of the present disclosure, an exchangeable A-cation may include at least one of Rb, K, Na, guanidinium, dimethylammonium, imidazolium, and/or hydrazinium. In some embodiments of the present disclosure, an exchangeable X-anion may include at least one of a halogen and/or $SCN^-$. Perovskites undergoing the exchange of an A-cation or an A-cation and an X-anion may include at least one of Ge, Sn, Bi, In, Sb, Cd, and/or Zn.

Although the examples provided above illustrate methods for making mixed perovskites containing two unique A-cations and/or mixed perovskites containing two unique A-cations and two unique X-anions, perovskites having more than two unique A-cations and/or perovskites having more than two unique A-cations and more than two unique X-anions fall within the scope of the present disclosure. For example, in some embodiments of the present disclosure, a method 200 may begin with synthesizing of two or more starting perovskites (only two synthesizing steps shown in FIGS. 2, 210 and 220), where the two or more starting perovskites provide at least three unique A-cations to produce a final mixed perovskite containing the at least three unique A-cations. In some embodiments of the present disclosure, the methods described herein may result in compositions defined by $A_{1-x-y}A'_xA''_yBX_3$ and/or $A_{1-x-y}A'_xA''_yB(X_{1-z}X'_z)_3$, where $0 \le 1-x-y \le 1$, $0 \le y \le 1$, and $0 \le z \le 1$, with specific examples including $Cs_{1-x-y}FA_xMA_yPbI_3$, $Cs_{1-x-y}FA_xMA_yPbBr_3$, $Cs_{1-x-y}FA_xMA_yPb(I_{1-z}Br_z)_3$.

For example, the combining 230 may include dispersing colloidal solutions of two or more starting perovskites as nanocrystals into a noncoordinating solvent such as at least one of octane, 1-octadecene, toluene, and/or dichlorobenzene. In some embodiments of the present disclosure, the solution may contain a coordinating group such as butylamine, octylamine, and/or oleylamine. The two or more starting perovskites may be provided at different ratios or concentrations to produce the desired A-cation composition of two or more A-cations; e.g. where the first starting perovskite is present at a concentration between 1 wt % and 99 wt %, with at least one additional starting perovskite making up the remainder. The resultant mixture may be heated to a temperature between 15° C. and 200° C. to facilitate the exchange, where the upper limit is defined by the boiling point of the noncoordinating solvent being used. The combining 230 may be performed for a time period between one minute and 48 hours. In some embodiments of the present disclosure, the combining 230 may be performed at a pressure between a vacuum (less than 1 atmosphere of pressure) to elevated pressures significantly above atmospheric pressure (e.g. between 1 atm and 10 atm). The final mixed perovskite resulting from the method 200, may include a thin film, a plurality of nanocrystals, and/or a single crystal. In some embodiments of the present disclosure, the combining 230 and the forming 240 may occur substantially simultaneously in the same reaction vessel. In some embodiments of the present disclosure, the forming 240 may proceed over a period of time, for example between one minute and 48 hours, depending on the exchange kinetics, as defined by the combining/forming conditions; e.g. temperature, starting perovskite concentrations, etc. In some embodiments of the present disclosure the separating 250 of the mixed perovskite 100 may be completed by any suitable method (e.g. chromatography, filtration, and/or centrifugation). Agitation may be provided to insure complete mixing and improve mass transfer.

Figure 3A:
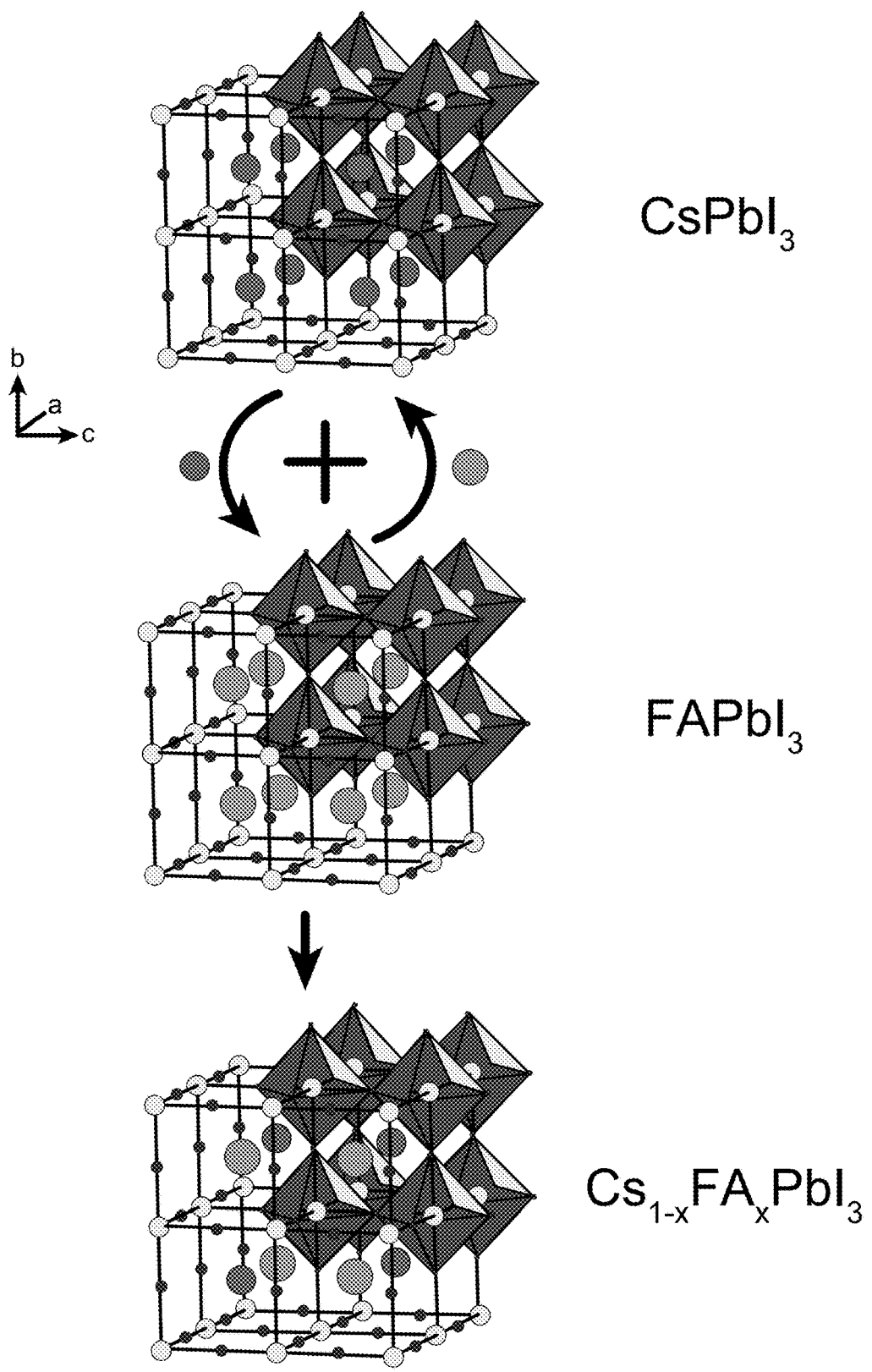
FIG. 3A illustrates a schematic of an ion exchange of A-cations, $Cs^+$ and $FA^+$ ions between $CsPbI_3$ and $FAPbI_3$ nanocrystals (NCs), to form phase stable $Cs_{1-x}FA_xPbI_3$ NCs, according to some embodiments of the present disclosure.
Figure 3B:
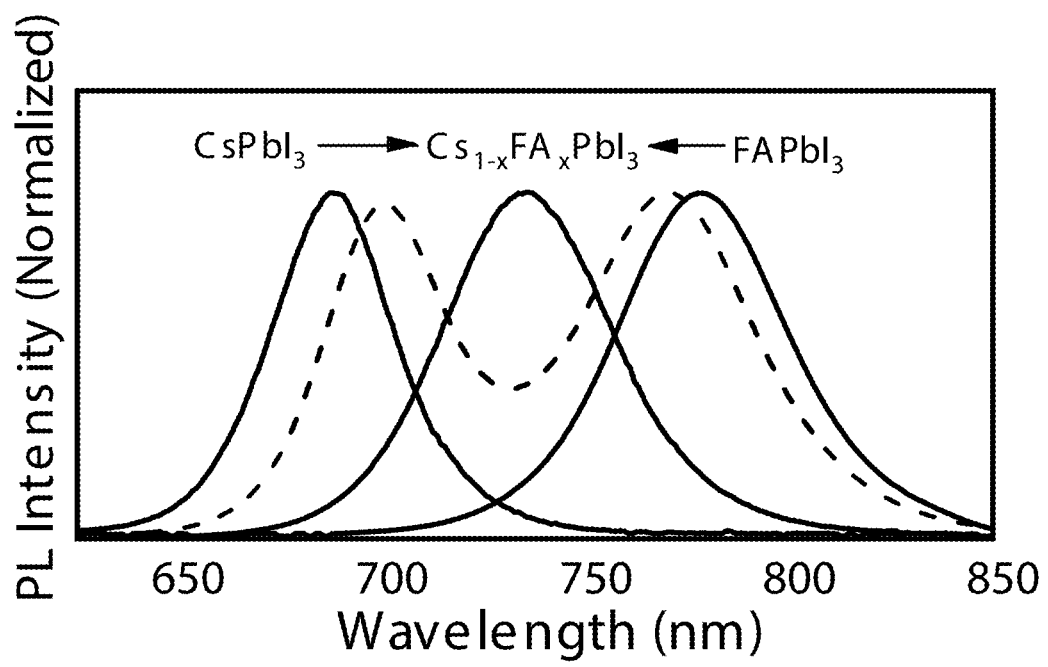
FIG. 3B illustrates the photoluminescence (PL) emission spectra depicting how $CsPbI_3$ and $FAPbI_3$ NCs convert into mixed cation NCs, according to some embodiments of the present disclosure. The dashed curve indicates the emission profile of one of the early stages of combining/forming a mixed perovskite.

Thus, disclosed herein is the synthesis, by post-synthetic cation exchange, of $A_{1-x}A'_xBX_3$ and/or $A_{1-x}A'_xB(X_{1-x}X'_x)_3$ colloidal mixed perovskite NCs, for example, $Cs_{1-x}FA_xPbI_3$ and/or $Cs_{1-x}FA_xPb(I_{1-x}Br_x)_3$, where $0 \leq 1-x \leq 1$. by For example, by combining colloidal solutions of $CsPbI_3$ or $CsPbBr_3$ NCs with $FAPbI_3$ or $FAPbBr_3$ NCs in appropriate proportions along with modest heating allows cross-exchange between the A-cations (as well as cross-exchange of X-anions, if desired), resulting in unique mixed compositions (mixed A-cation perovskites, with or without mixed X-anions) that retain their crystallographic framework (as shown in FIG. 3A). The methods described herein provide controllable and tunable emission in the ~650-800 nm range, in lead iodide perovskite NCs by control of the A-cation composition only. For A-cation exchange only (no X-anion exchange), individual $CsPbI_3$ and $FAPbI_3$ NCs were used as "precursors" to yield a homogeneous mixed perovskite NC solution via continuous A-cation exchange between them (see FIG. 3B). Photoluminescence (PL) kinetics at various combining/forming temperatures reveal that the interchange process is slower than anion (X) exchange, and the activation energy related to this process is about 0.65 eV. The resultant mixed perovskite $Cs_{1-x}FA_xPbI_3$ NCs were incorporated into solar cell devices that demonstrated lower $V_{OC}$ deficits compared to large grain film-based devices of similar composition and EG. The $Cs_{1-x}FA_xPbI_3$ NC devices also show low hysteresis and a power conversion efficiency of about 10%.

Figure 4A:
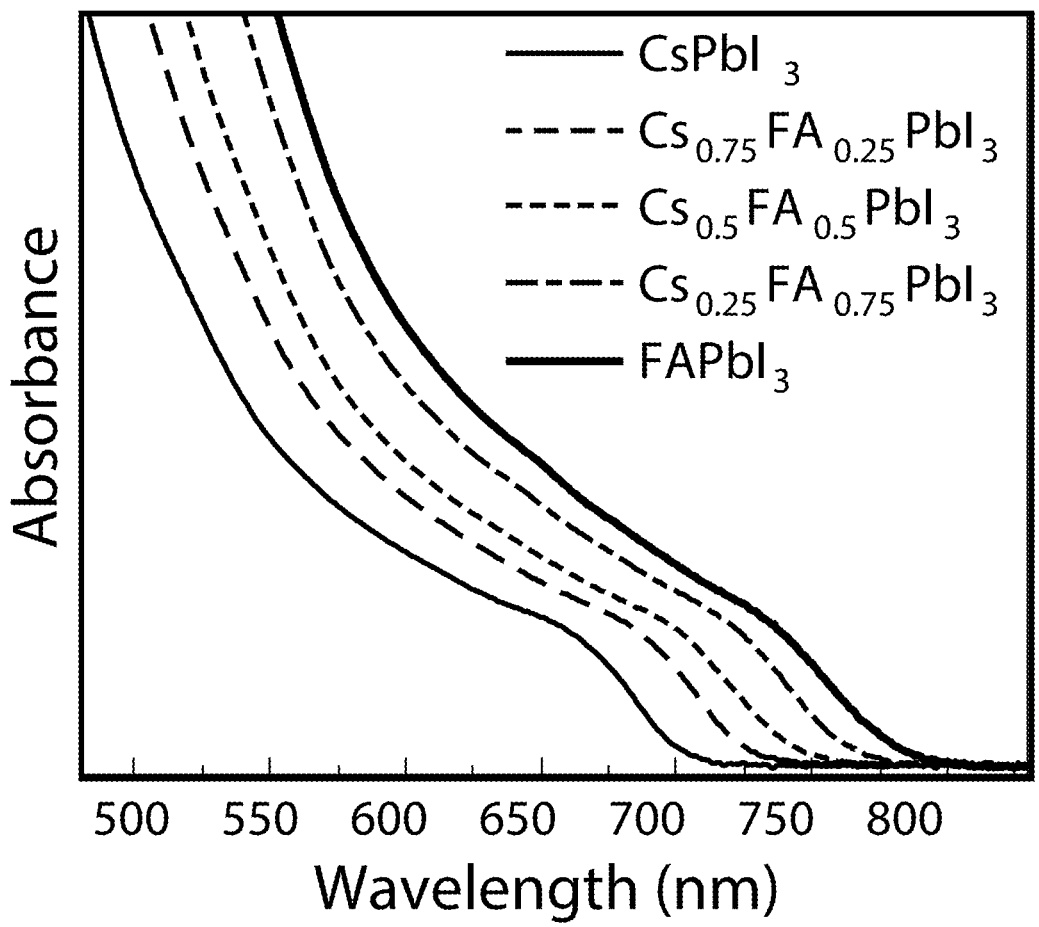
FIGS. 4A through 4D illustrate optical properties and transmission electron microscopy (TEM) characterization of the $Cs_{1-x}FA_xPbI_3$ NCs, according to some embodiments of the present disclosure.
Figure 4B:
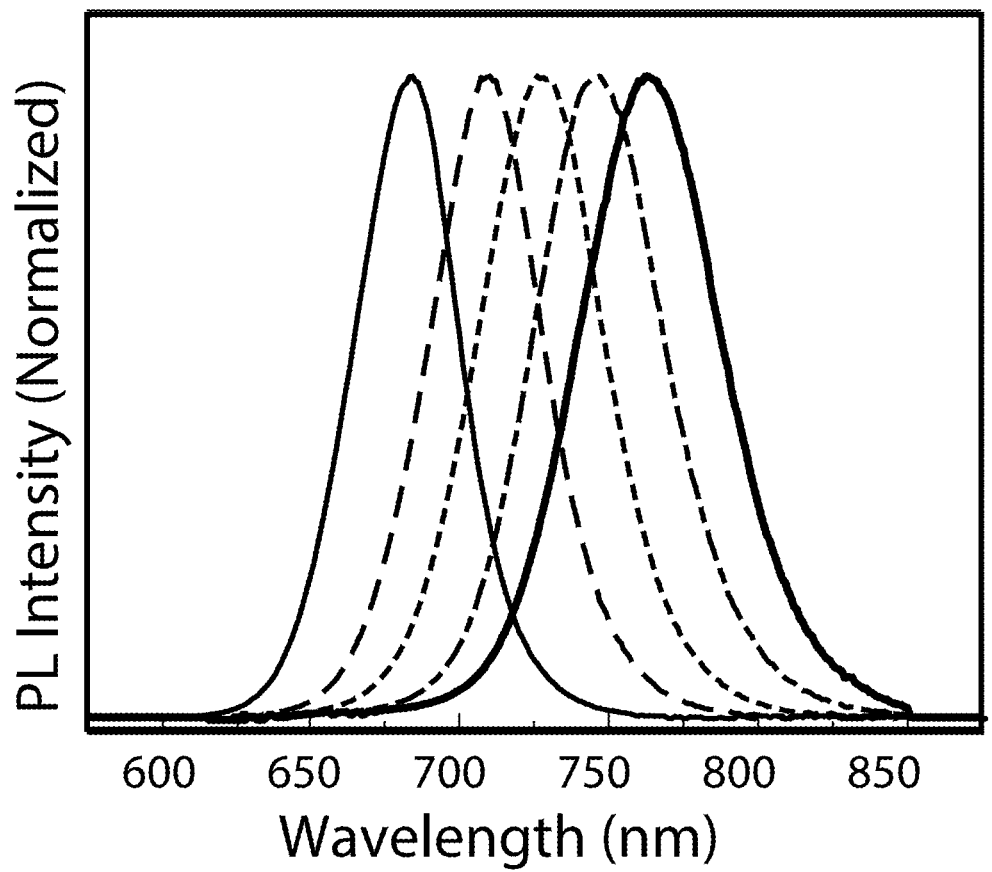
Figure 4C:
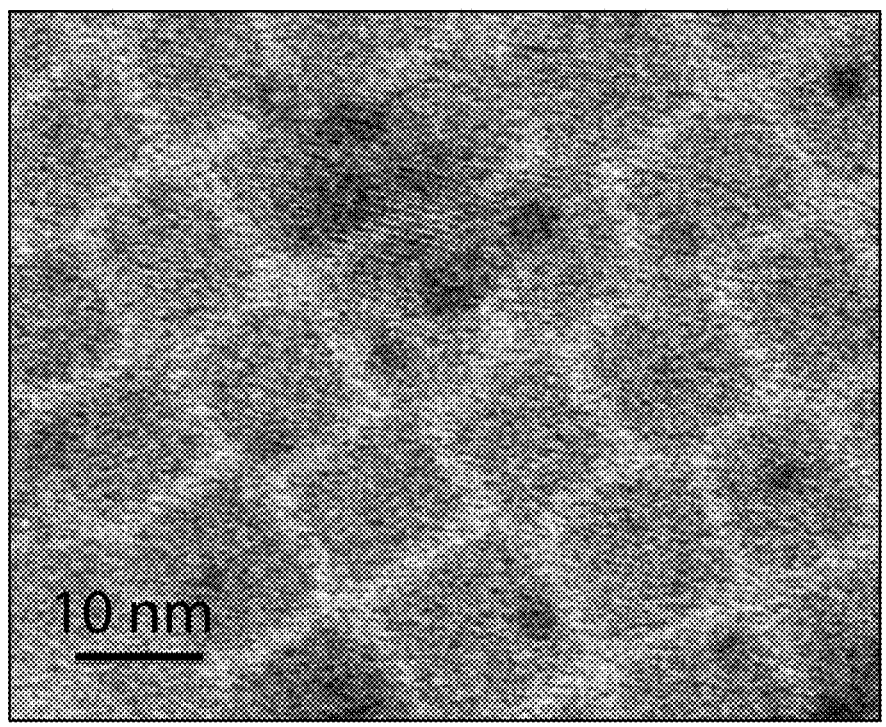
Figure 5:
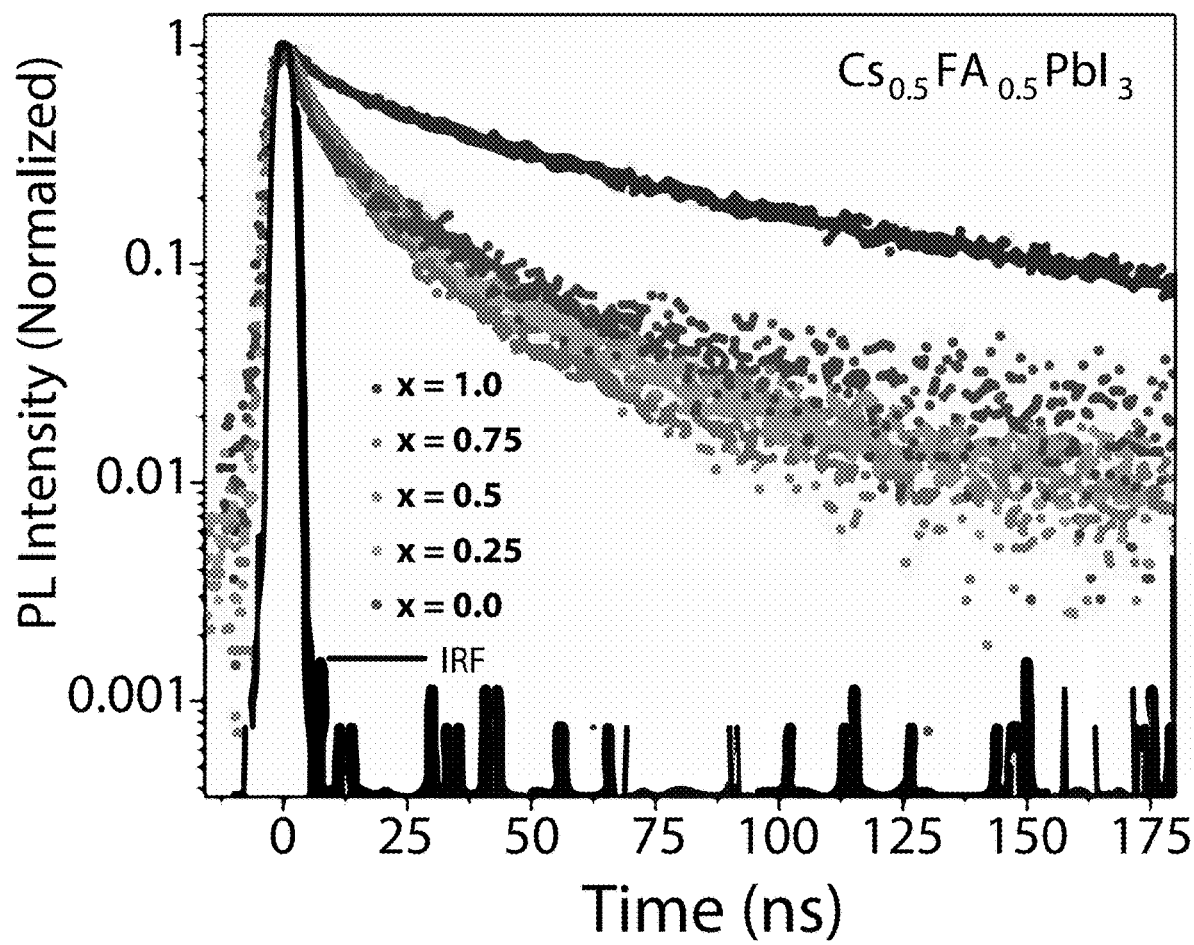
FIG. 5 illustrates the PL decay-profiles of starting and mixed cation NCs, integrated over the wavelength range studied, according to some embodiments of the present disclosure.
Figure 6:
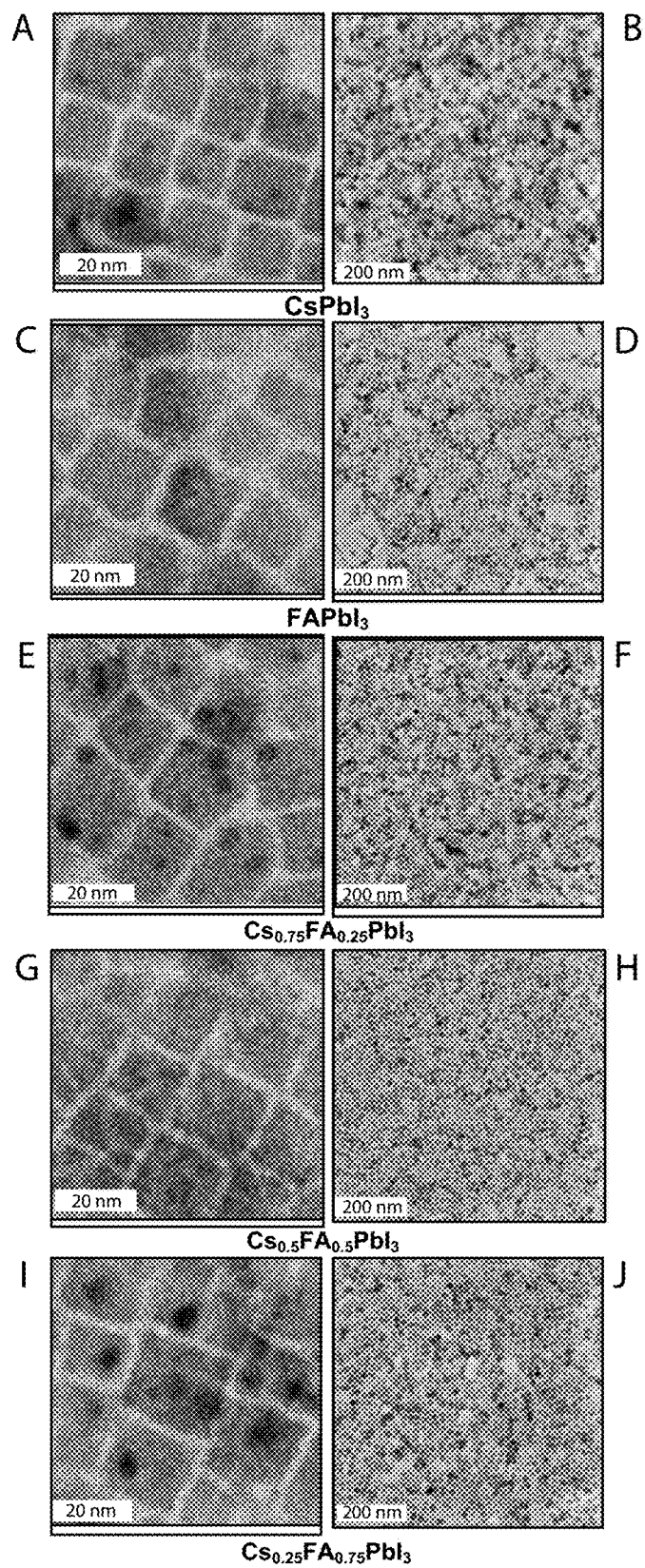
FIG. 6 illustrates TEM images of NCs, according to some embodiments of the present disclosure: High resolution and low resolution TEM images of (Panels A and B) $CsPbI_3$ NCs; (Panels C and D) $FAPbI_3$ NCs; (Panels E and F) $Cs_{0.75}FA_{0.25}PbI_3$ NCs; (Panels G and H) $Cs_{0.5}FA_{0.5}PbI_3$ NCs; and (Panels I and J) $Cs_{0.25}FA_{0.75}PbI_3$ NCs.
Figure 7A:
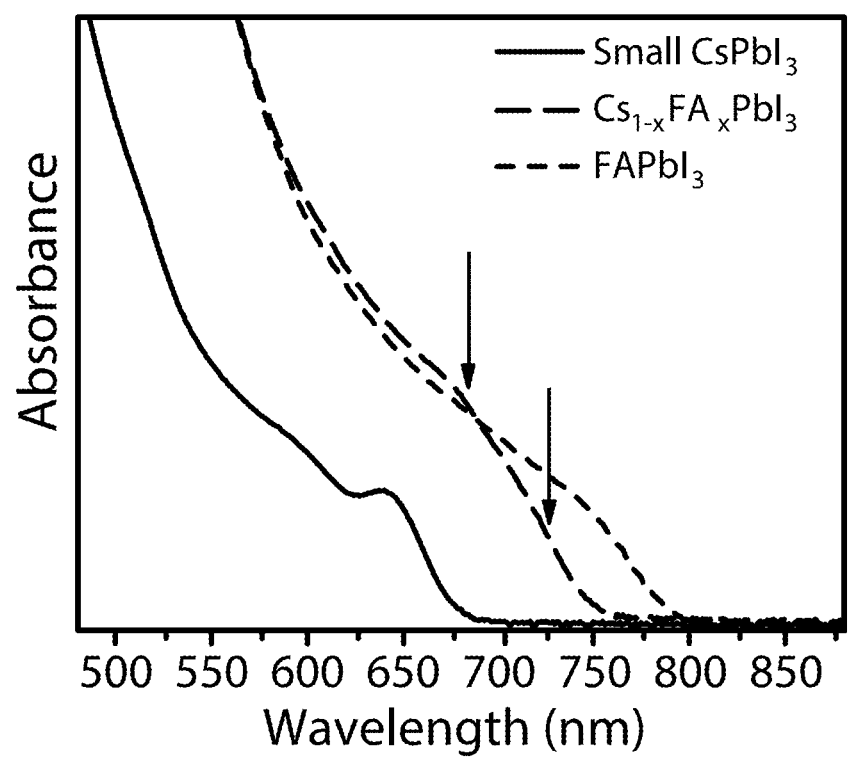
FIGS. 7A through 7D illustrate mixing of cations between different sized starting nanocrystals (smaller $CsPbI_3$ and larger $FAPbI_3$ NCs), according to some embodiments of the present disclosure.
Figure 7B:
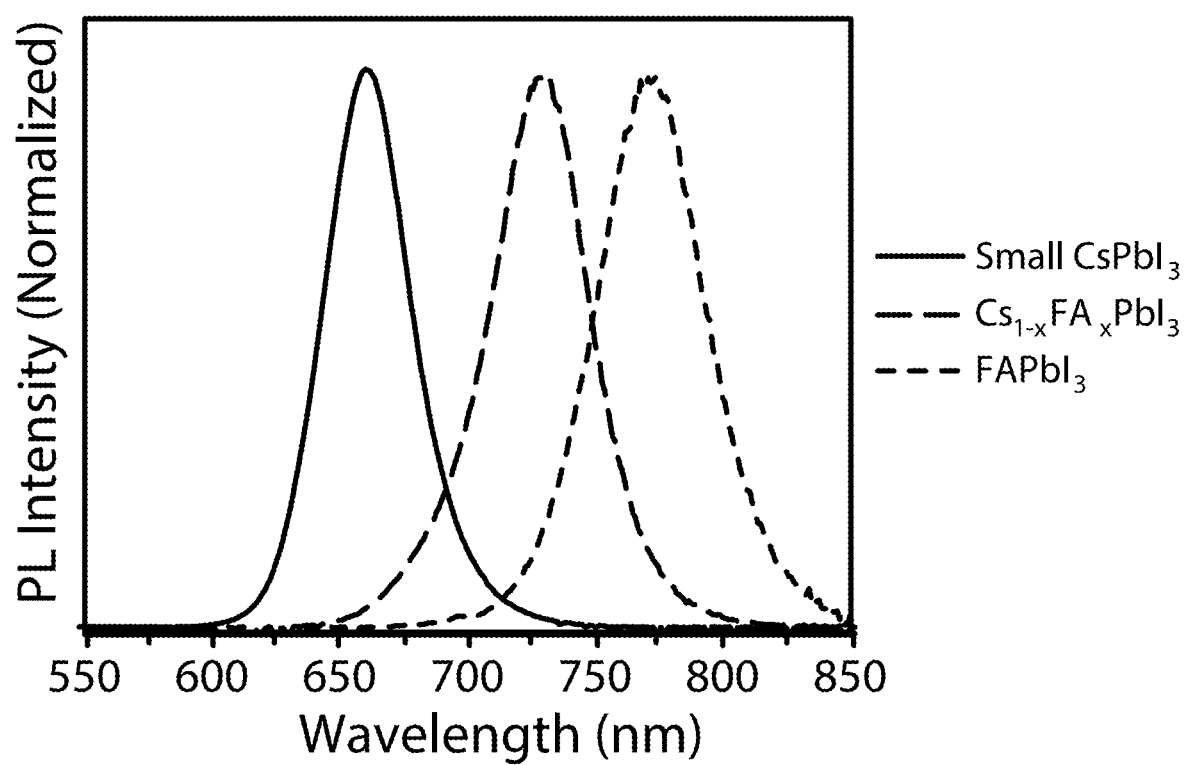
Figure 7C:
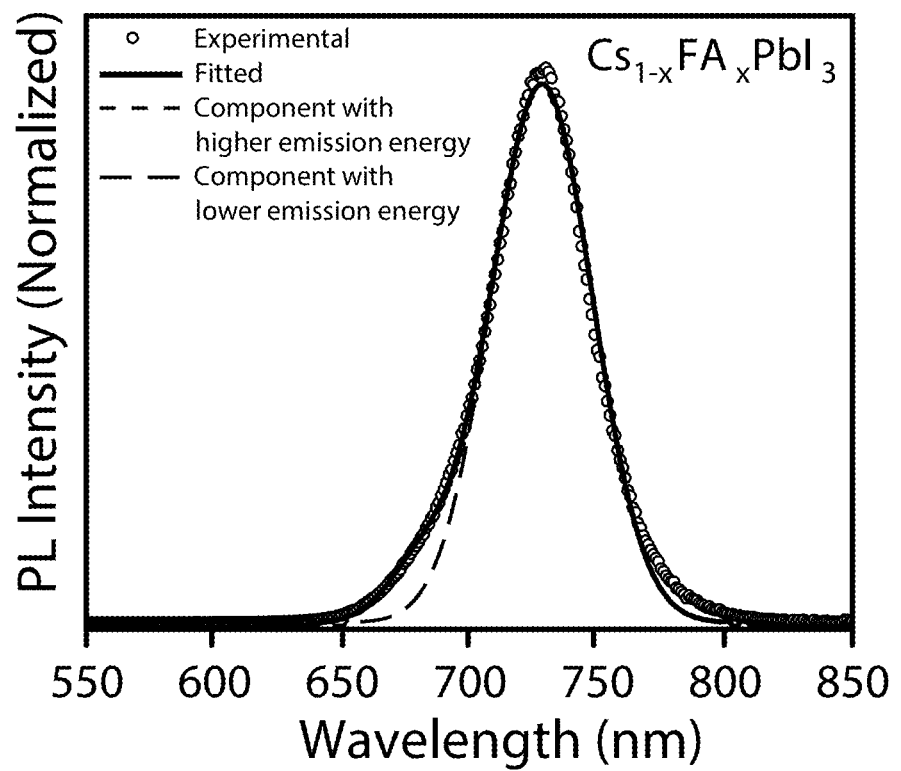

To obtain the mixed compositions of $Cs_{1-x}FA_xPbI_3$, colloidal NCs of $CsPbI_3$ and $FAPbI_3$ were first synthesized using the hot-injection method. The individual colloidal solutions were then mixed in controlled ratios. As can be seen in FIGS. 4A and 4B, the absorption onset and the PL emission peak positions was continuously tuned from pure $CsPbI_3$ to pure $FAPbI_3$ within the range of ~650-800 nm. The time-resolved photoluminescence measurements reveal multi-exponential PL decay behavior with average lifetimes in the range of 23-55 ns, with the $FAPbI_3$ exhibiting the slowest decay (see FIG. 5). The transmission electron microscope (TEM) images (see FIG. 4C) show that the mixed perovskite NCs retained their original size and shape (see FIG. 6). Further, when NCs of different sizes were combined (e.g. small $CsPbI_3$ NCs with PL maximum at ~660 nm and larger $FAPbI_3$ NCs with PL maximum at ~770 nm), asymmetric absorption was observed with a bimodal distribution of particles and an asymmetric PL emission spectrum that can be deconvoluted with two Gaussians curves with peak maximums at ~680 nm and ~728 nm (see FIGS. 7A, 7B, and 7C). This indicates that the NCs retained their original size, with the final composition tuned by the relative amounts of Cs to FA total ions.

Figure 4D:
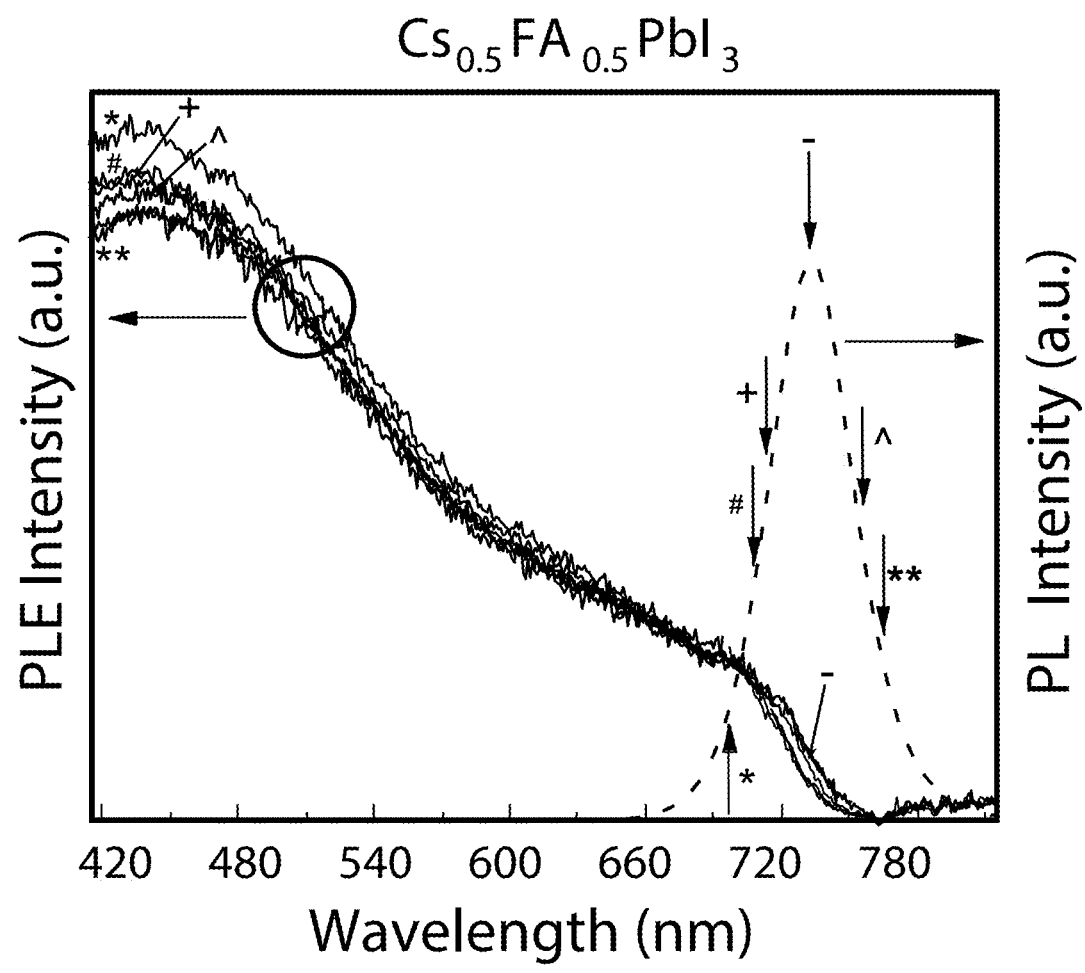
Figure 7D:
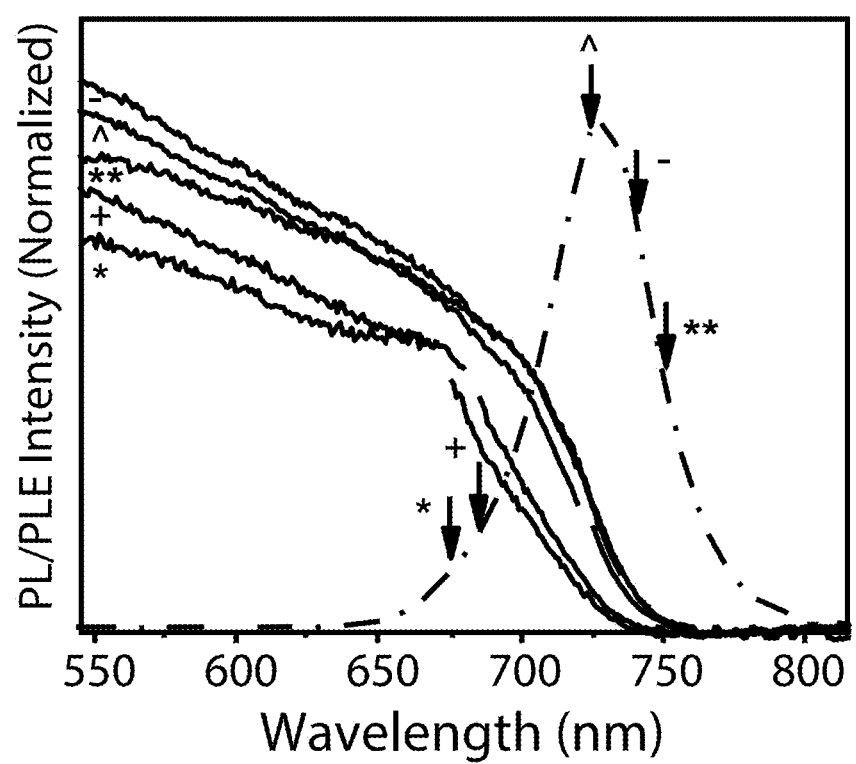
Figure 8A:
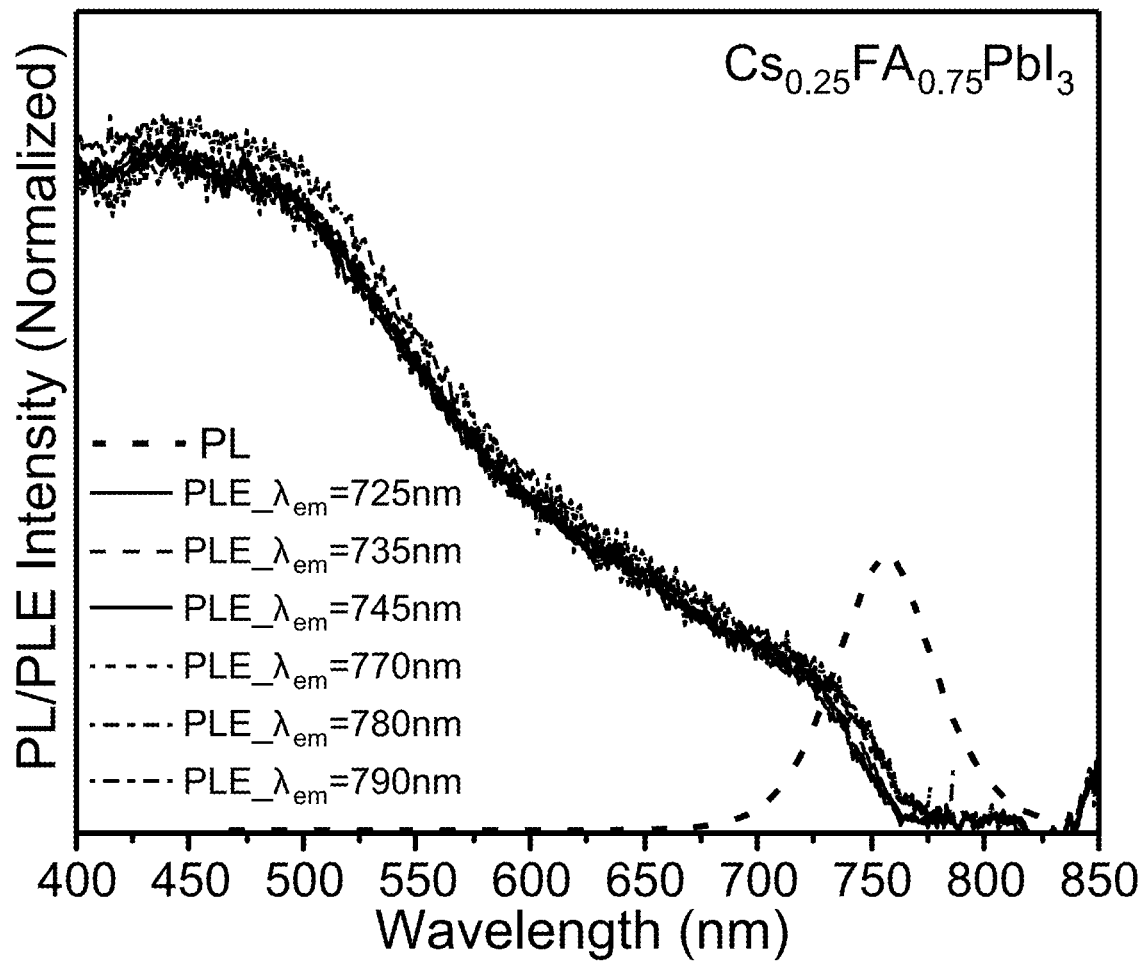
FIG. 8A illustrates PLE spectra of mixed A-cation $Cs_{0.25}FA_{0.75}PbI_3$ NCs, according to some embodiments of the present disclosure.
Figure 8B:
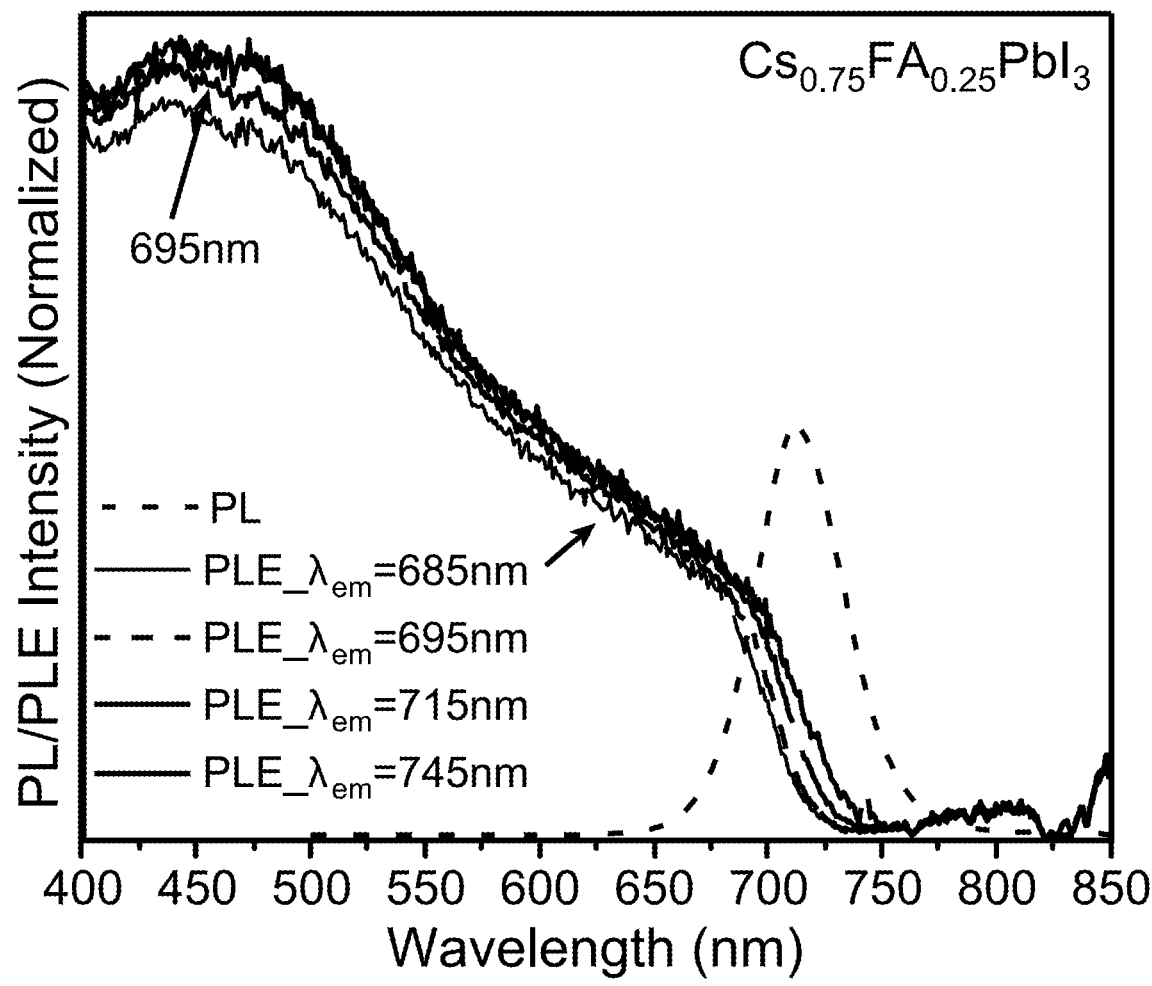
FIG. 8B illustrates PLE spectra of mixed A-cation $Cs_{0.75}FA_{0.25}PbI_3$ NCs, according to some embodiments of the present disclosure.
Figure 9A:
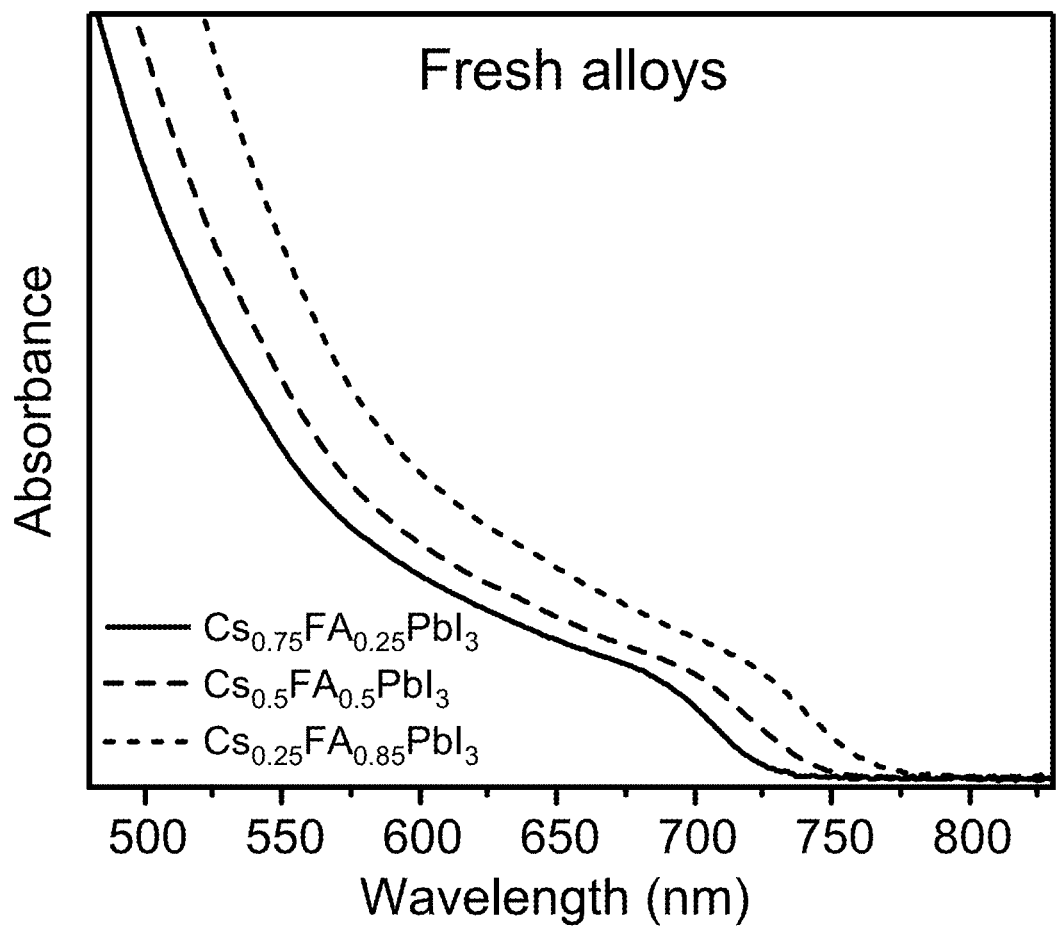
FIGS. 9A and 9B illustrate UV-Vis absorption and PL spectra, respectively, of the freshly prepared $Cs_{1-x}FA_xPbI_3$ NCs, according to some embodiments of the present disclosure.
Figure 9B:
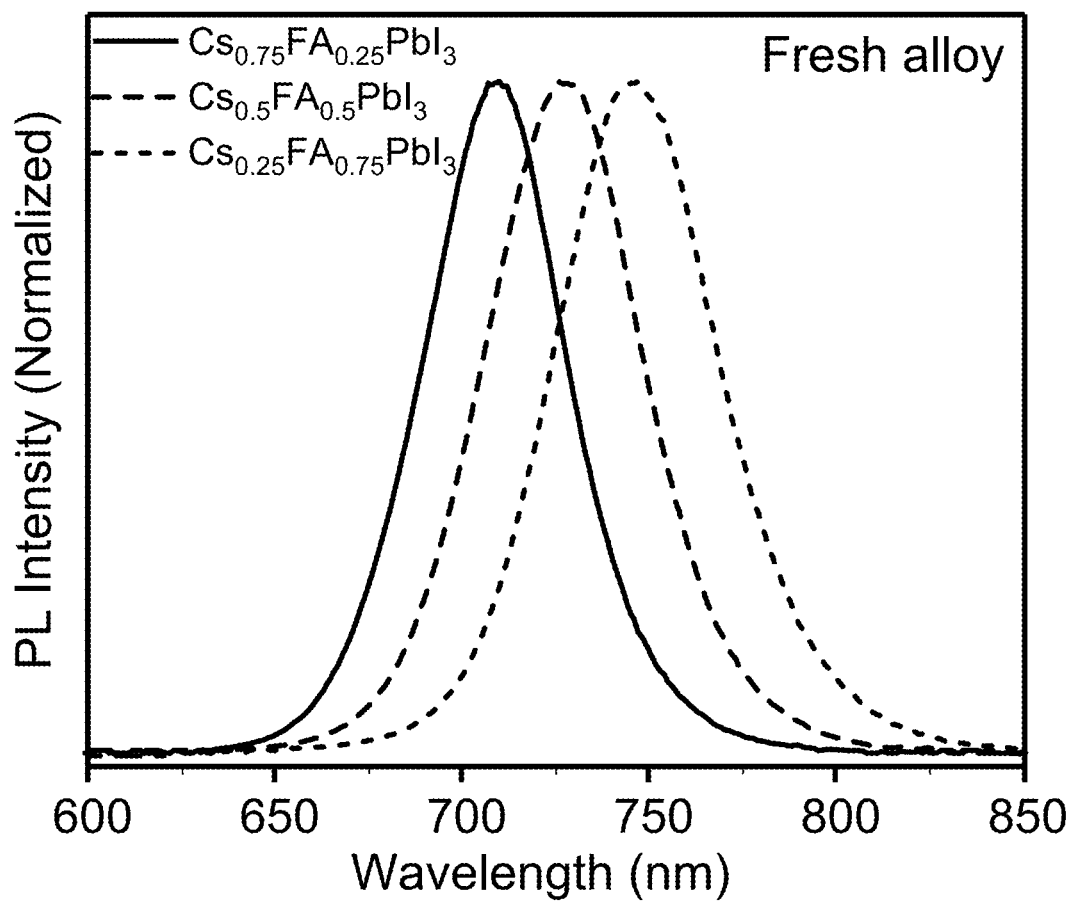
Figure 9C:
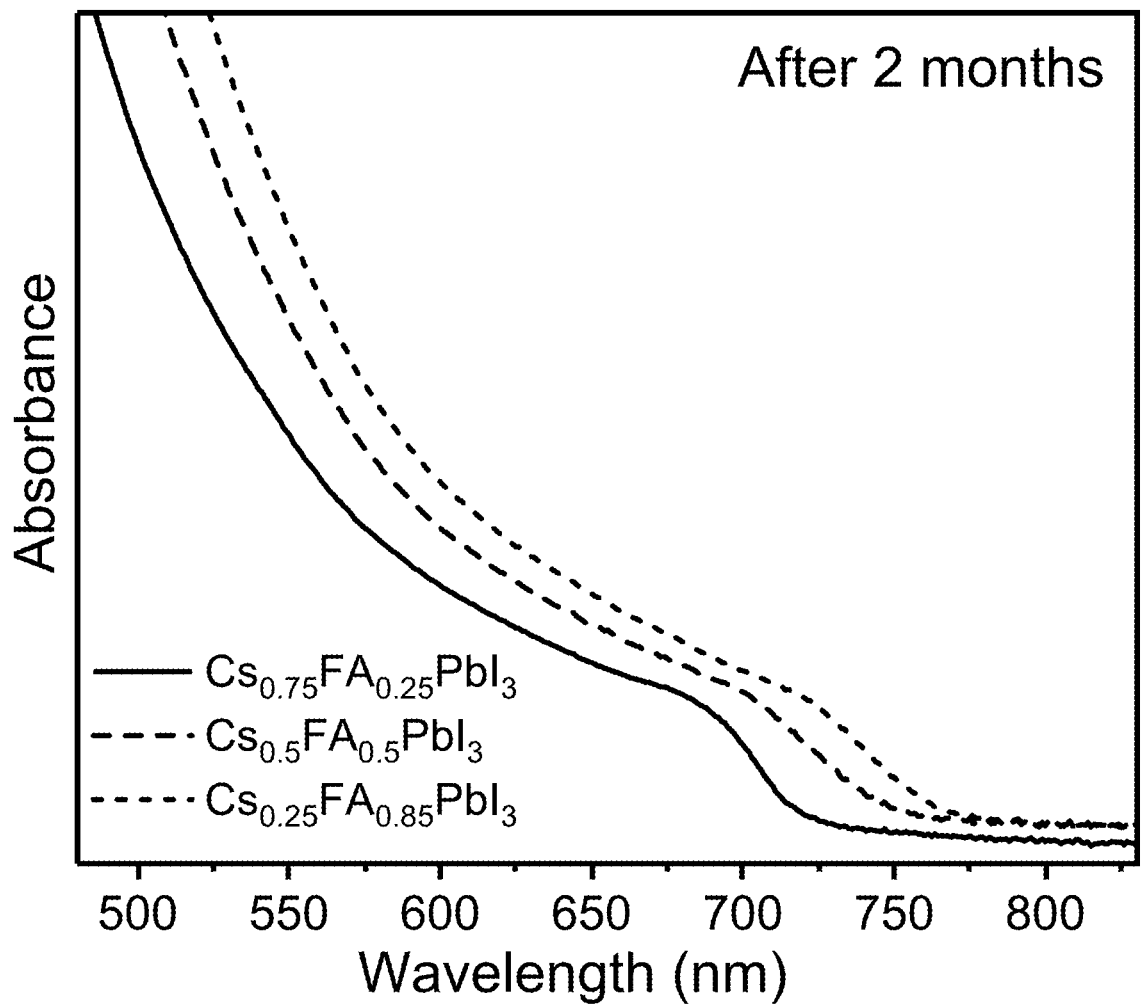
FIGS. 9C and 9D illustrate UV-Vis absorption and PL spectra, respectively, of the same $Cs_{1-x}FA_xPbI_3$ NCs but two months after synthesis, according to some embodiments of the present disclosure.
Figure 9D:
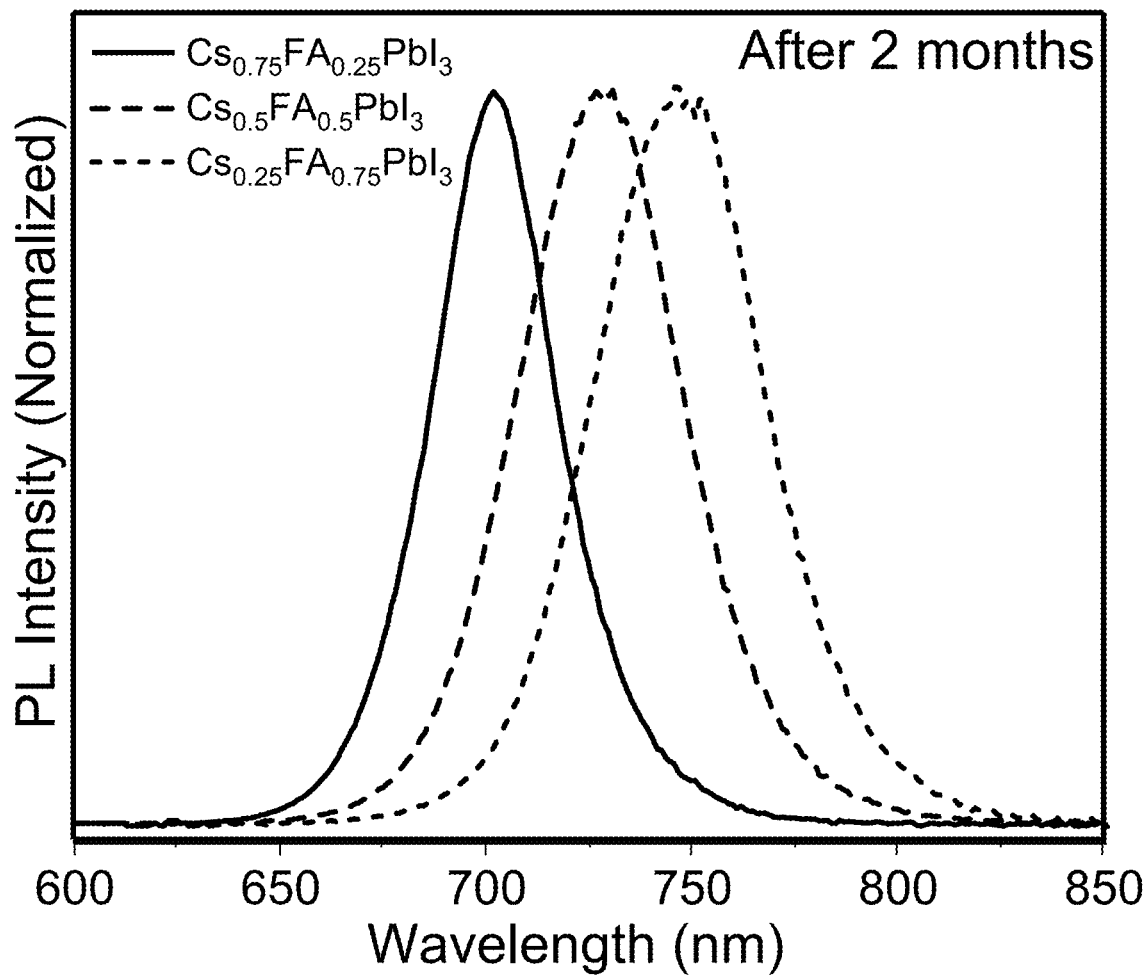

Photoluminescence emission (PLE) spectroscopy was employed to examine the forming of mixed A-cation $Cs_{1-x}FA_xPbI_3$ NCs. FIG. 4D shows the PL of the $Cs_{0.5}FA_{0.5}PbI_3$ NCs and corresponding PLE spectra collected at different emission energies as dictated by the arrows on the emission spectrum. The overlap of all of the PLE spectra indicate that they are independent of emission energies and there is no significant inhomogeneous broadening of the PL emission due to the forming of mixed cation perovskite NCs. PLE measurements on the other compositions also point to the absence of significant inhomogeneity mixed A-cation perovskites (see FIGS. 8A and 8B). On the other hand, the PLE spectra collected at different emission energies in case of the mixed composition NCs resulted from intentionally mixing smaller $CsPbI_3$ and bigger $FAPbI_3$ NCs, clearly shows two distinct transitions at ~670 nm and ~700 nm (see FIG. 7D), indicating inhomogeneous perovskite compositions or two different homogeneous perovskite compositions with two different mean sizes. The mixed cation perovskite NCs retain their absorption and PL emission shape for months after the ion exchange procedure, indicating that the mixed cation perovskite NCs reached thermodynamic equilibrium (see FIGS. 9A-9D).

Figure 10A:
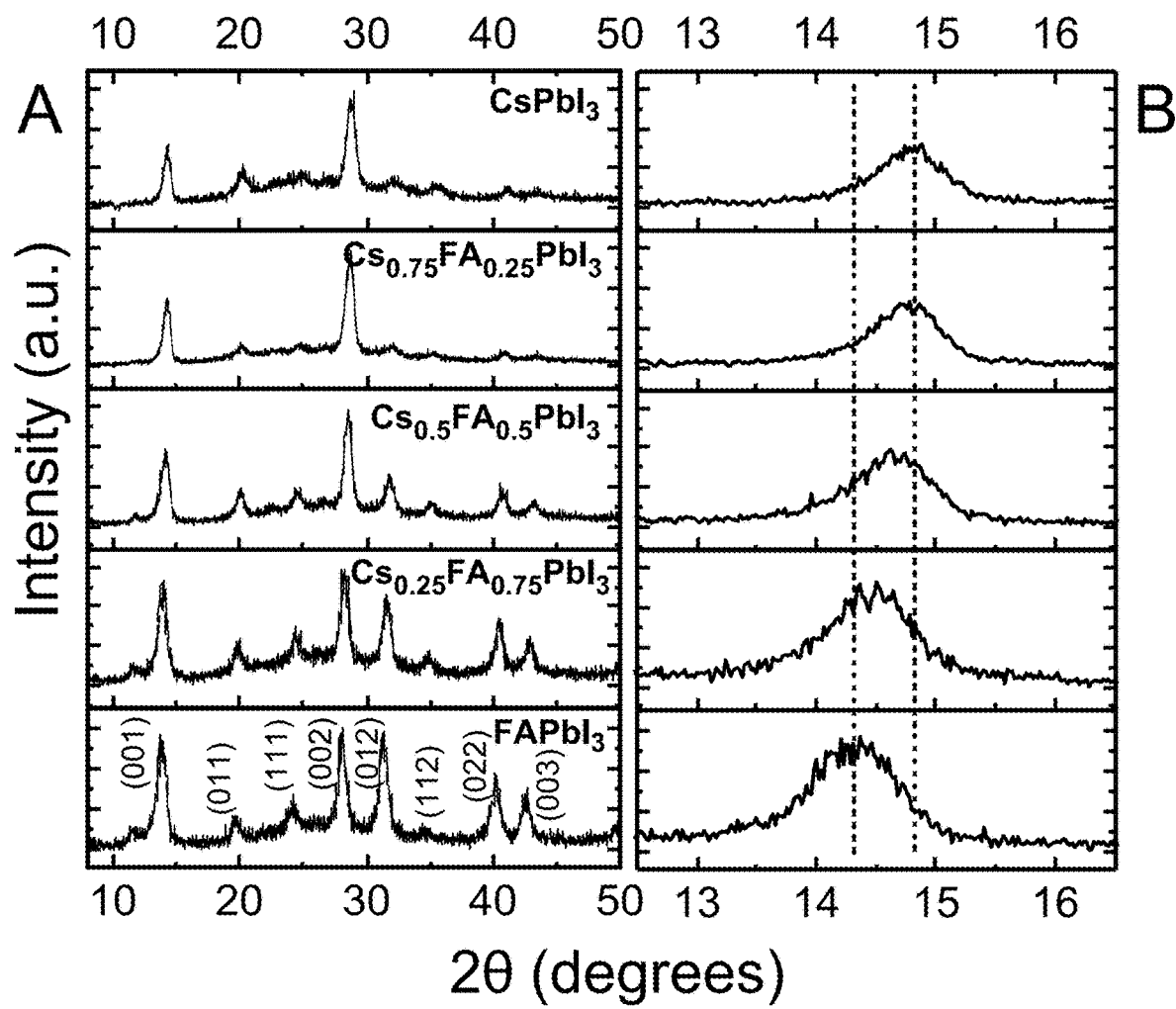
FIG. 10A illustrates x-ray diffraction (XRD) results of the $Cs_{1-x}FA_xPbI_3$ NCs, according to some embodiments of the present disclosure. (Panel A) illustrates wide-angle XRD patterns of the mixed cation NCs showing that the NCs retain their corner-sharing perovskite phase after forming mixed cation perovskites. The diffraction peaks for the $FAPbI_3$ NCs were indexed following methods known in the field. (Panel B) illustrates a zoomed-in view of the (001) diffraction peak showing continuous shift from pure $FAPbI_3$ to pure $CsPbI_3$.
Figure 11A:
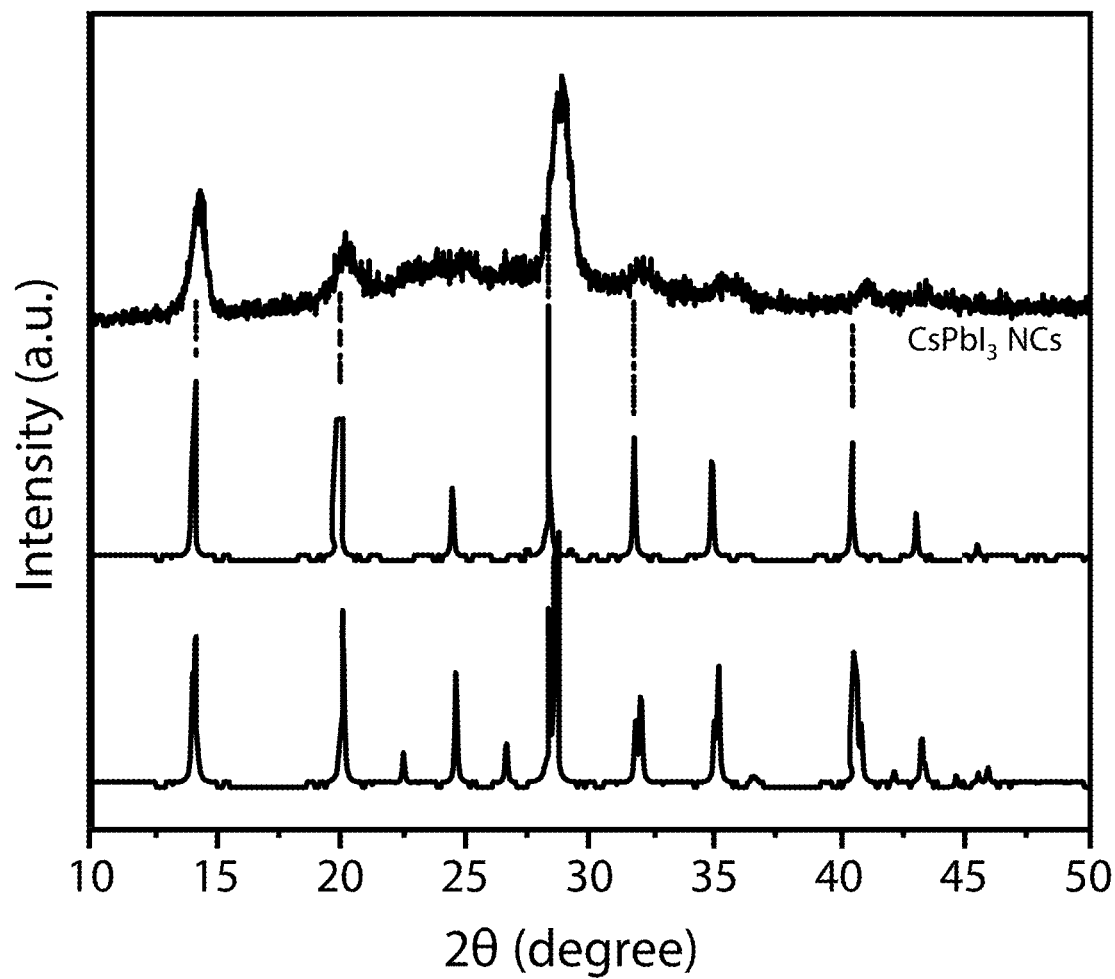
FIG. 11A illustrates a comparison of powder XRD of the $CsPbI_3$ NCs (top trace) with standard reported bulk patterns (bottom traces), according to some embodiments of the present disclosure.
Figure 11B:
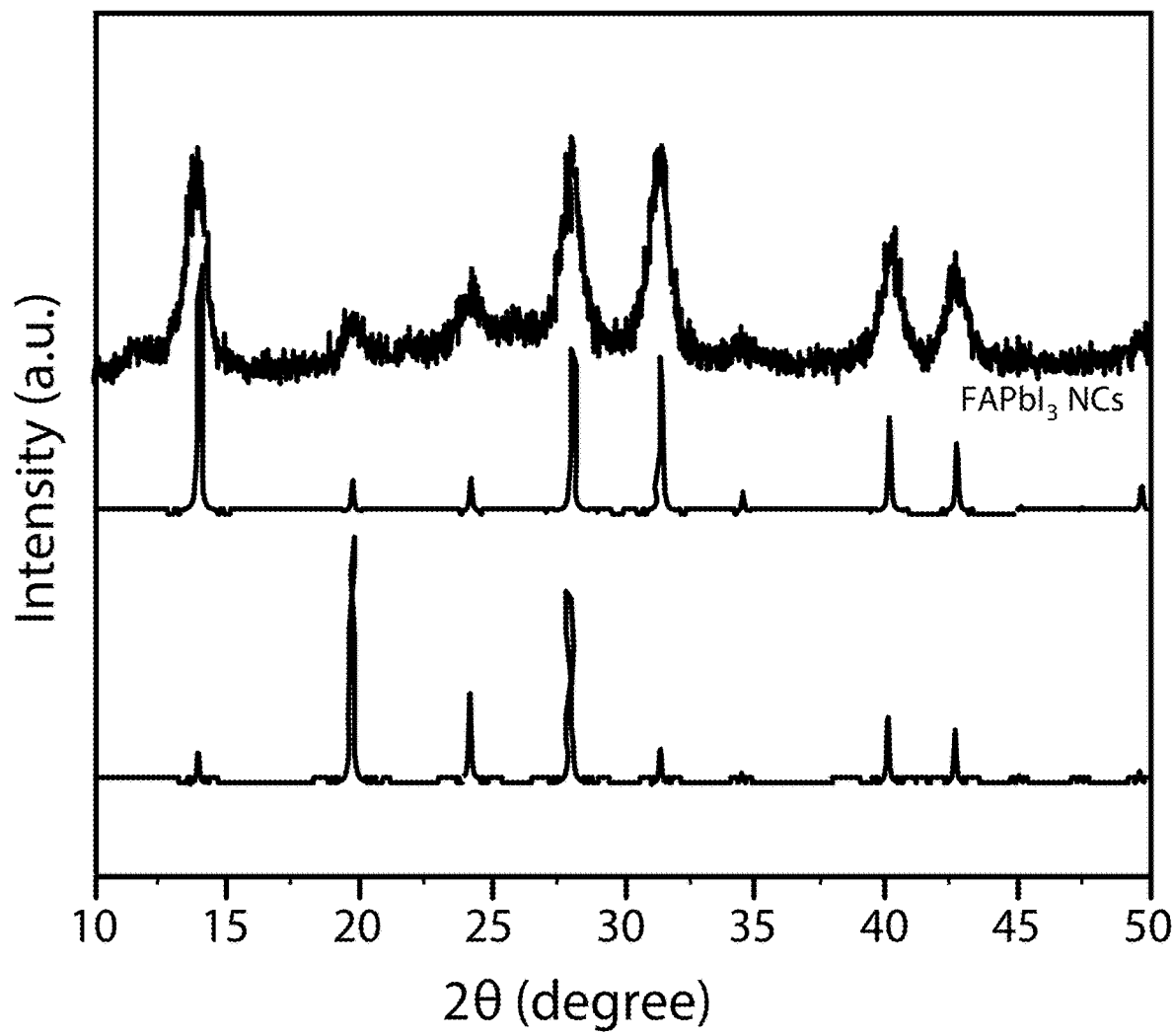
FIG. 11B illustrates a comparison of powder XRD of the $FAPbI_3$ NCs (top trace) with standard reported bulk patterns (bottom traces), according to some embodiments of the present disclosure.

Panel A of FIG. 10A shows the powder XRD patterns of the mixed cation perovskite NCs. As can be seen from the XRD patterns, all of the mixed cation perovskite compositions retained their perovskite structure with prominent (001) and (002) peaks. The diffraction peaks shift monotonically between the patterns obtained with pure $CsPbI_3$ and $FAPbI_3$ NCs (see Panel B of FIG. 10A) for zoomed in XRD pattern showing the shift of the (001) peak). $CsPbI_3$ in bulk can have more than one perovskite phase with corner-shared octahedra. For example, neutron powder diffraction reveals that room temperature non-perovskite δ-phase of $CsPbI_3$ (orthorhombic, Pnma) can be converted into cubic α-phase (with undistorted corner shared $[PbI_6]^{4-}$ octahedra, Pm-3m) upon heating above 360° C. There can be two more perovskite phases of $CsPbI_3$ at temperatures lower than 360° C. depending upon the amount of tilting of the $[PbI_6]^{4-}$ octahedra: β-phase (260° C.) and γ-phase (175° C.). These kinetically stabilized perovskite phases convert into the non-perovskite phase at room temperature in ambient conditions. On the other hand, $FAPbI_3$ can exist in trigonal phase (space group P3m1) at room temperature, although it can also exist in the ideal cubic perovskite phase with space group Pm-3m. As shown herein, powder X-Ray diffraction patterns were generated using reported crystallographic information to compare with the starting perovskites $CsPbI_3$ and $FAPbI_3$ NCs (see FIGS. 11A and 11B). Both were stabilized in the perovskite phase at room temperature under ambient condition, although it is difficult to identify the exact amount of octahedral tilting and associated space group, due to Scherrer broadening of the XRD peaks.

Figure 10B:
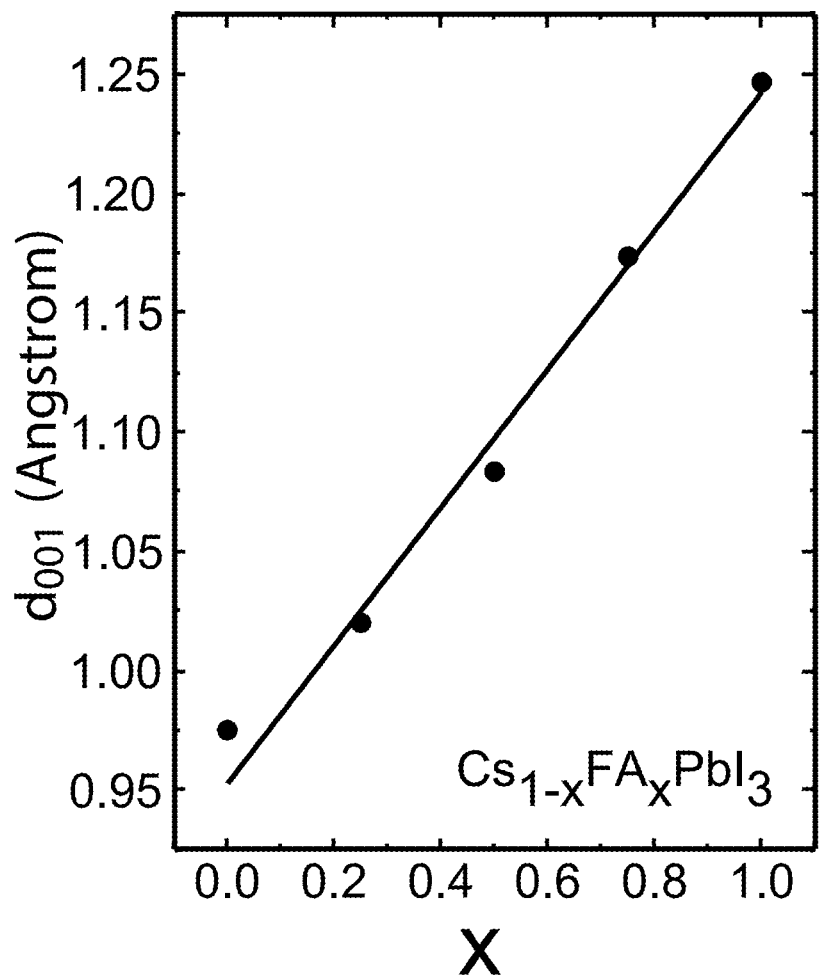
FIG. 10B illustrates Vegard's law demonstrated by showing the linear shift the door peak with composition.
Figure 12A:
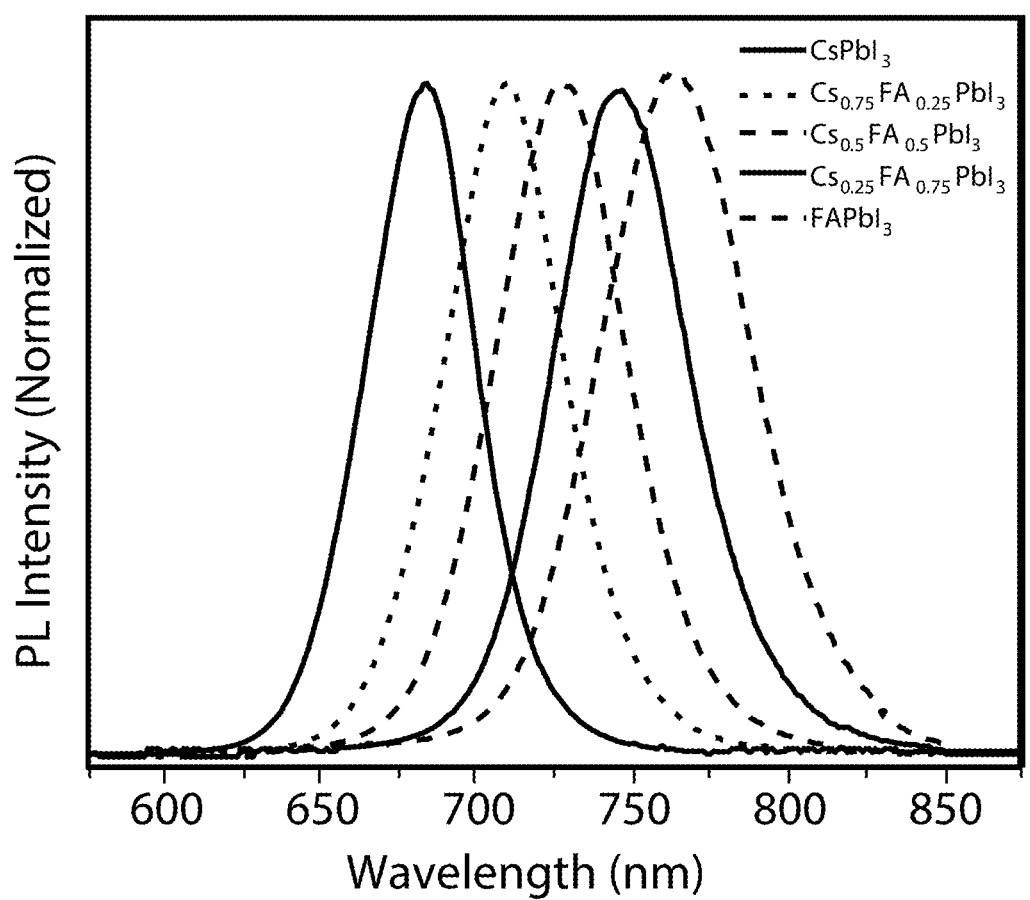
FIG. 12A illustrates the variation of the PL emission spectra as a function with composition of mixed A-cation $Cs_{1-x}FA_xPbI_3NCs$, according to some embodiments of the present disclosure.
Figure 12B:
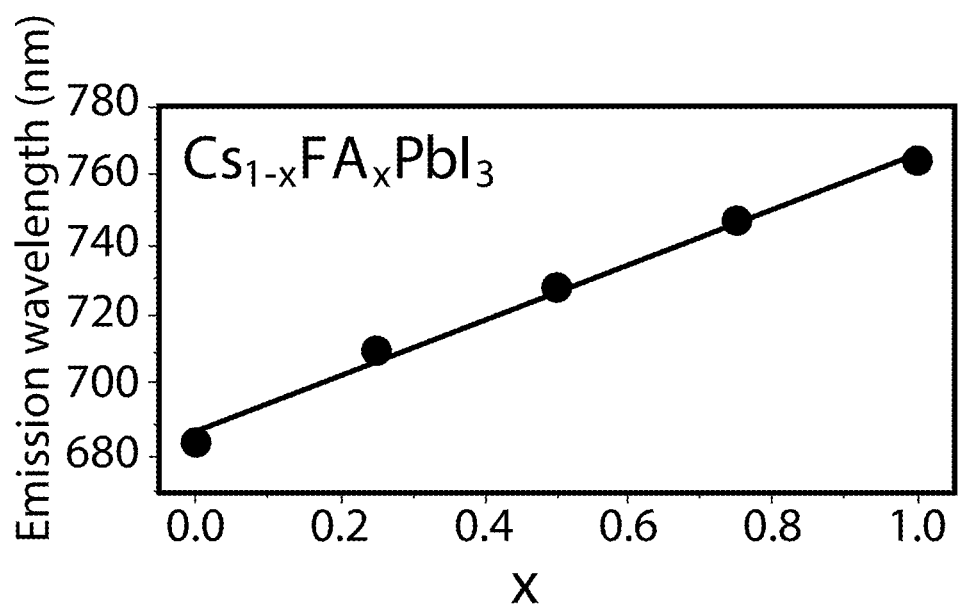
FIG. 12B illustrates the variation of emission wavelength spectra as a function of composition of mixed A-cation $Cs_{1-x}FA_xPbI_3NCs$, according to some embodiments of the present disclosure.
Figure 12C:
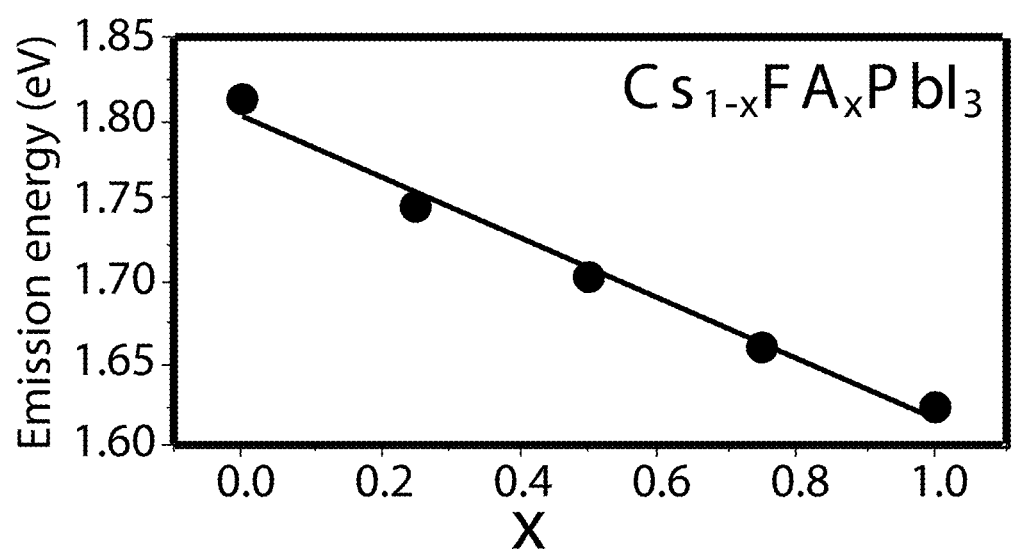
FIG. 12C illustrates the variation of emission energies as a function of composition of mixed A-cation $Cs_{1-x}FA_xPbI_3NCs$, according to some embodiments of the present disclosure.

To obtain a particular composition of $Cs_{1-x}FA_xPbI_3$, it is important to know the starting concentration of $CsPbI_3$ NCs and $FAPbI_3$ NCs in the colloidal solution. However, this is not straightforward without knowledge of the size dependent molar extinction coefficient. While the size dependent molar extinction coefficient for $CsPbBr_3$ NCs is known, similar studies on $CsPbI_3$ and $FAPbI_3$ have not been reported yet. However, the energy levels of valence band maxima and conduction band minima in lead halide perovskites are formed from lead and halide s and p-atomic orbitals, and hence the density of states (DOS) near the band edges are expected to be similar for different APbX$_3$ perovskites if X is the same. So, it is reasonable to assume that colloidal solutions of similar sized CsPbI$_3$ and FAPbI$_3$ NCs with similar optical density near the band gap will have similar concentration of NCs in the component solutions. With this assumption, individual CsPbI$_3$ and FAPbI$_3$ NC solutions were prepared with similar absorbance near the band edge in different ratios. The XRD patterns and the PL emission spectra of all the compositions vary linearly with the presumed compositions (see FIGS. 10B, 12B, and 12C) validating the approximation of concentration.

In order to closely monitor the A-cation cross-exchange between CsPbI$_3$ and FAPbI$_3$ NCs, mixing the two was performed at various temperatures in a range between about 45° C. and 90° C. Unlike the X-anion exchange, which occurs rapidly (timescale of two minutes), the A-cation exchange did not spontaneously occur at room temperature.

There are several potential advantages to using perovskite NCs in photovoltaic devices over large grain perovskites. One main advantage is the phase stabilization of metastable perovskite phase of CsPbI$_3$. Secondly, ink for thin films is in the form of molecular precursors, and the homogeneity of the multi-crystalline absorber layer on the device depends on the substrate and other parameters like solvent evaporation, temperature, during crystallization. Using colloidal crystalline NC inks lifts the requirement of strict deposition conditions to control the film morphology, crystallinity and homogeneity. Formamidinium iodide (FAI) was used as a surface treatment to replace the long chain oleylammonium ligands. The devices show stabilized power output (SPO) efficiencies of ~9-11% with low hysteresis and up to ~75% external quantum efficiency (EQE) (see FIGS. 16B and 16C), and Table 1 below for a summary).

TABLE 1

Solar cell device parameters.

| | Reverse | | | | Forward | | | | |
|---|---|---|---|---|---|---|---|---|---|
| | Voc (V) | Jsc (mA/cm$^2$) | FF | PCE (%) | Voc (V) | Jsc (mA/cm$^2$) | FF | PCE (%) | SPO (%) |
| FAPbI$_3$ | 1.12 | 11.81 | 0.64 | 8.52 | 1.12 | 11.85 | 0.68 | 9.01 | 8.83 |
| Cs$_{0.25}$FA$_{0.75}$PbI$_3$ | 1.1 | 14.37 | 0.66 | 10.41 | 1.11 | 14.35 | 0.63 | 10.05 | 10.41 |
| Cs$_{0.5}$FA$_{0.5}$PbI$_3$ | 1.13 | 14.8 | 0.62 | 10.42 | 1.13 | 14.7 | 0.6 | 10.05 | 10.26 |
| Cs$_{0.75}$FA$_{0.25}$PbI$_3$ | 1.15 | 14.36 | 0.68 | 11.14 | 1.14 | 14.23 | 0.66 | 10.77 | 10.93 |
| CsPbI$_3$ | 1.18 | 15.5 | 0.73 | 13.47 | 1.17 | 15.2 | 0.66 | 11.75 | 12.37 |

Figure 13A:
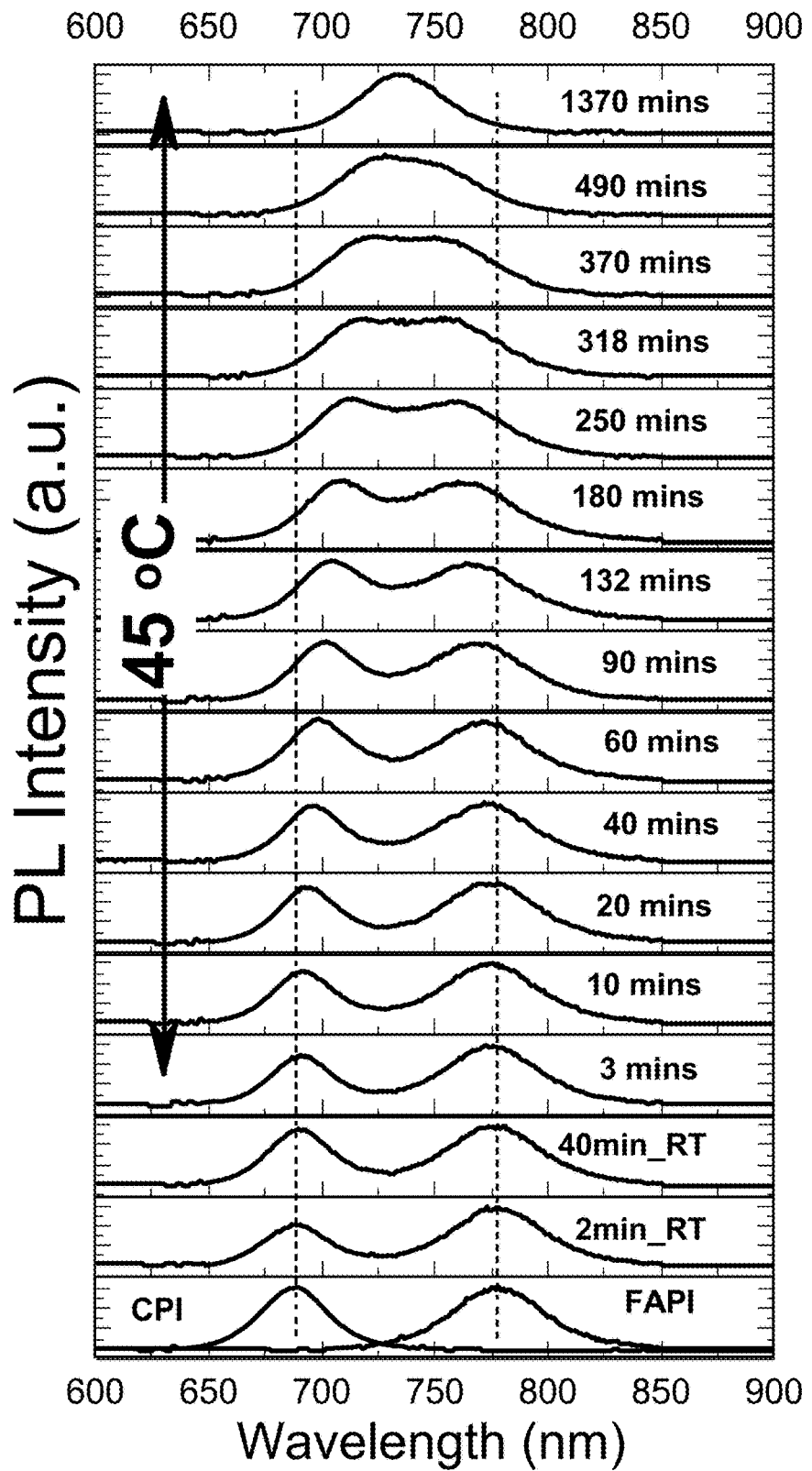
FIGS. 13A, 13B, and 13C illustrate the evolution of PL emission peaks with time at reaction temperatures of 45° C., 70° C., and 90° C., respectively; the bottom-most spectra in these three figures show individual emission from $CsPbI_3$ (labeled CPI) and $FAPbI_3$ (labeled FAPI). The next two spectra (labeled "xmin_RT" where x is 2, 30, 38, and 40) are emissions at room temperature showing relatively stable peak positions. The remainder of the emission spectra are shown for the temporal evolution at elevated temperatures as labeled.
Figure 13B:
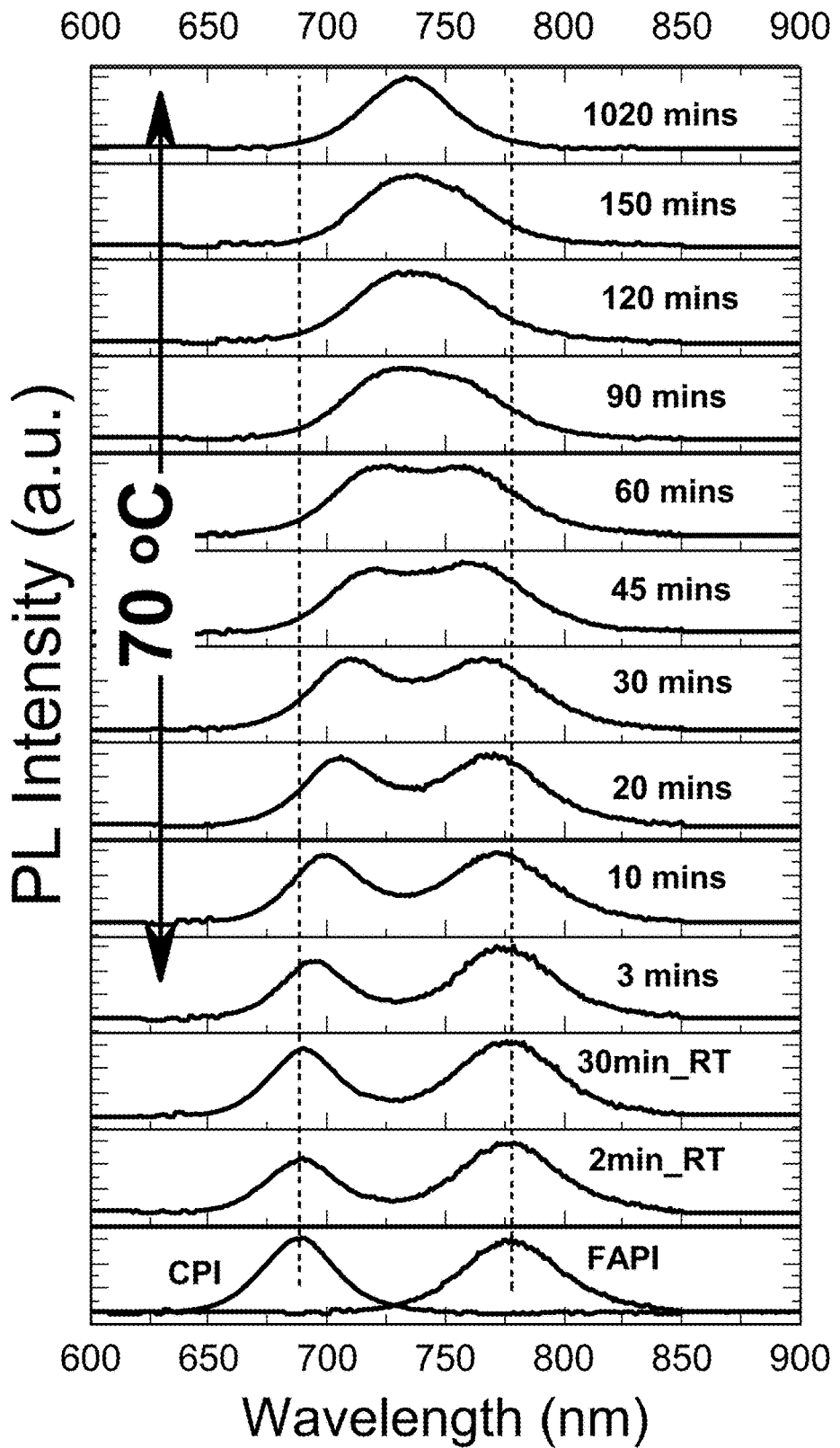
Figure 13C:
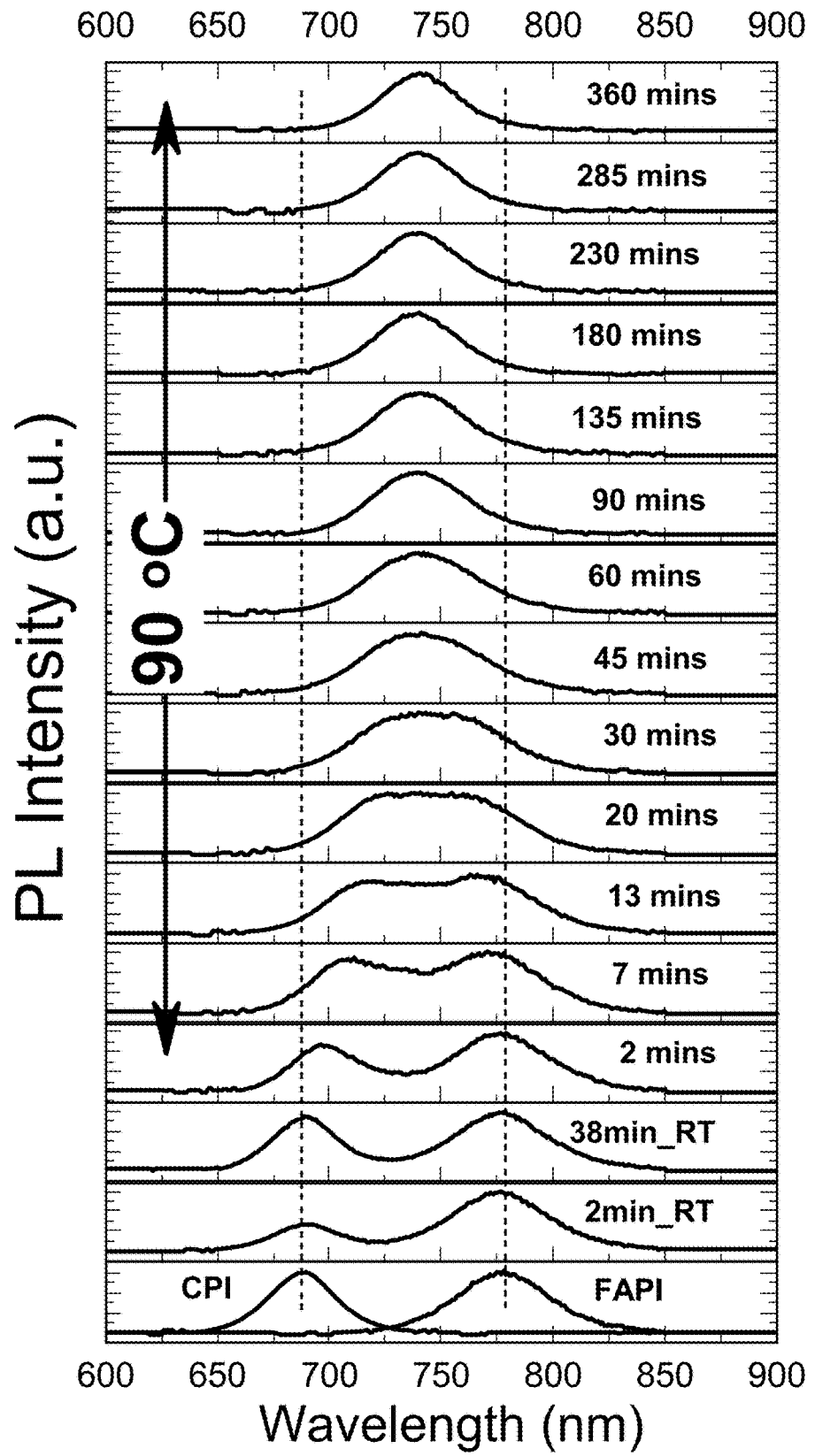
Figure 13D:
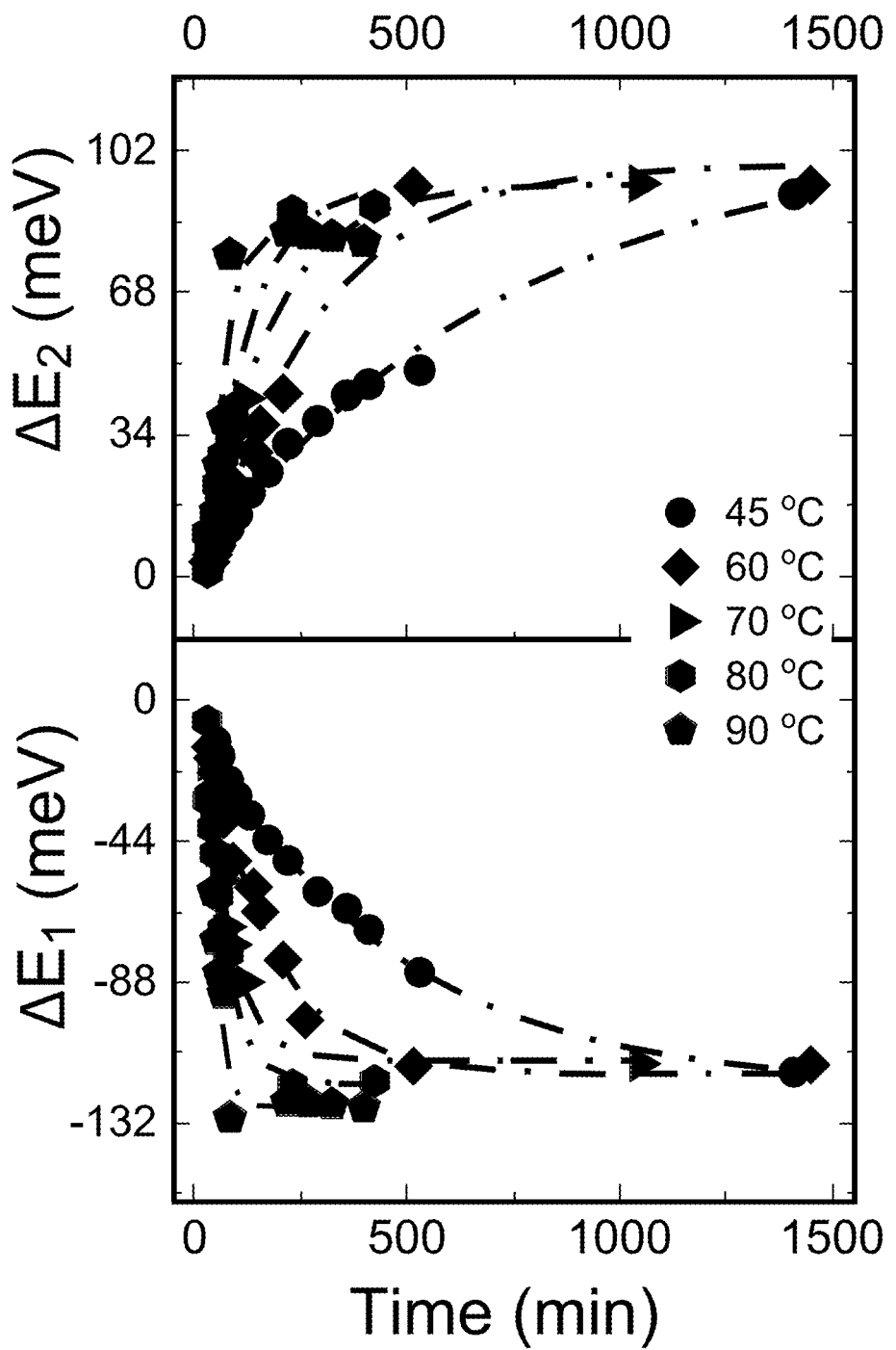
FIG. 13D illustrates the shift in emission energy from their original position, depicting how the high energy peak ($E_1$) is red-shifting from pure $CsPbI_3$ due to incorporation of $FA^+$ and how the low-energy peak ($E_2$) is blue-shifting from pure $FAPbI_3$ due to incorporation of $Cs^+$ over time. The dotted lines are exponential fits to the experimental data.
Figure 13E:
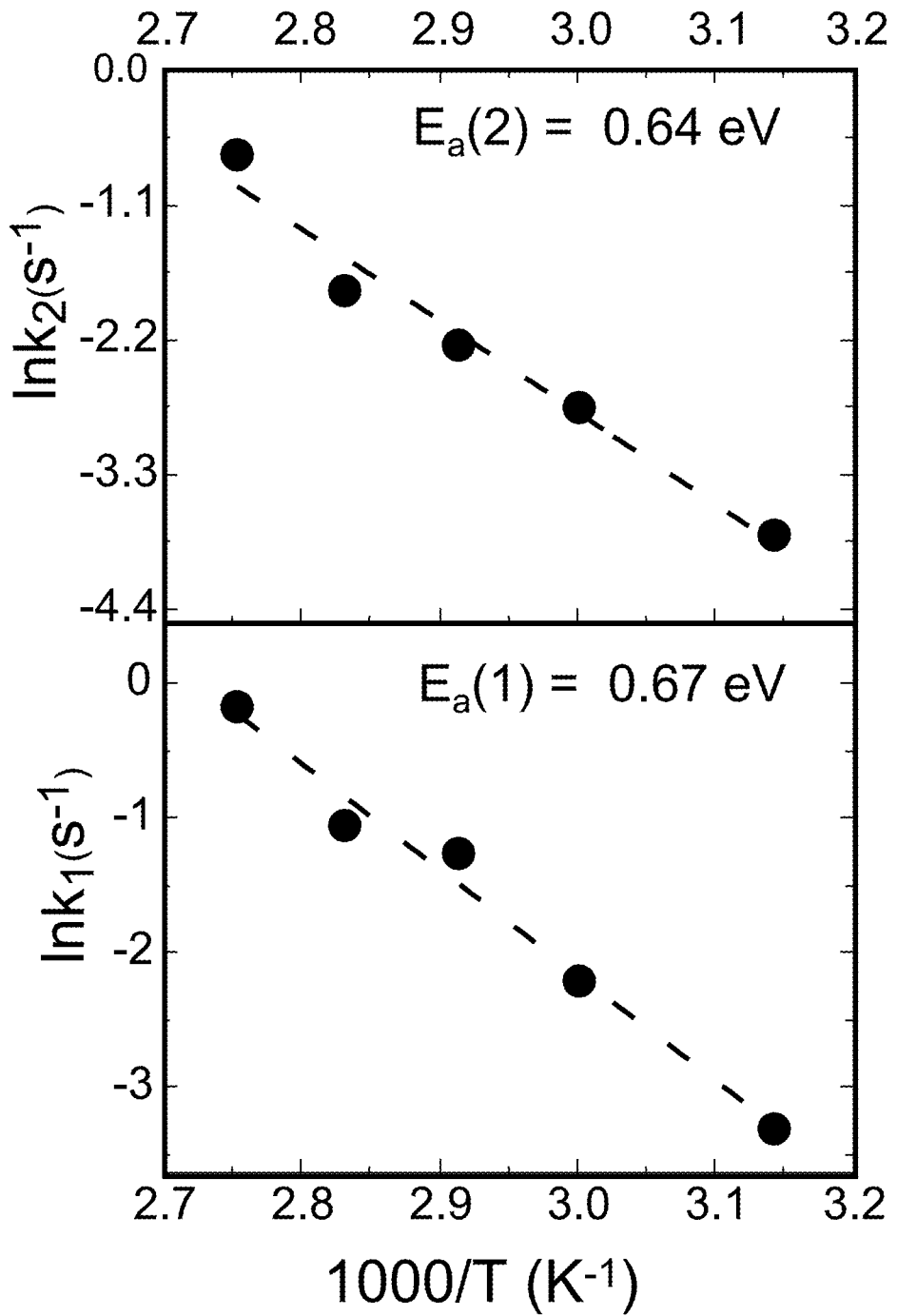
FIG. 13E illustrates an Arrhenius plot showing the rates of conversion of $CsPbI_3$ bottom panel) and $FAPbI_3$ ($k_2$, top panel) into $Cs_{1-x}FA_xPbI_3$ against 1/T (T being the absolute temperature). The dotted lines are linear fits to extract the activation energies ($E_a(1)$ and $E_a(2)$, respectively) for these processes.
Figure 14A:
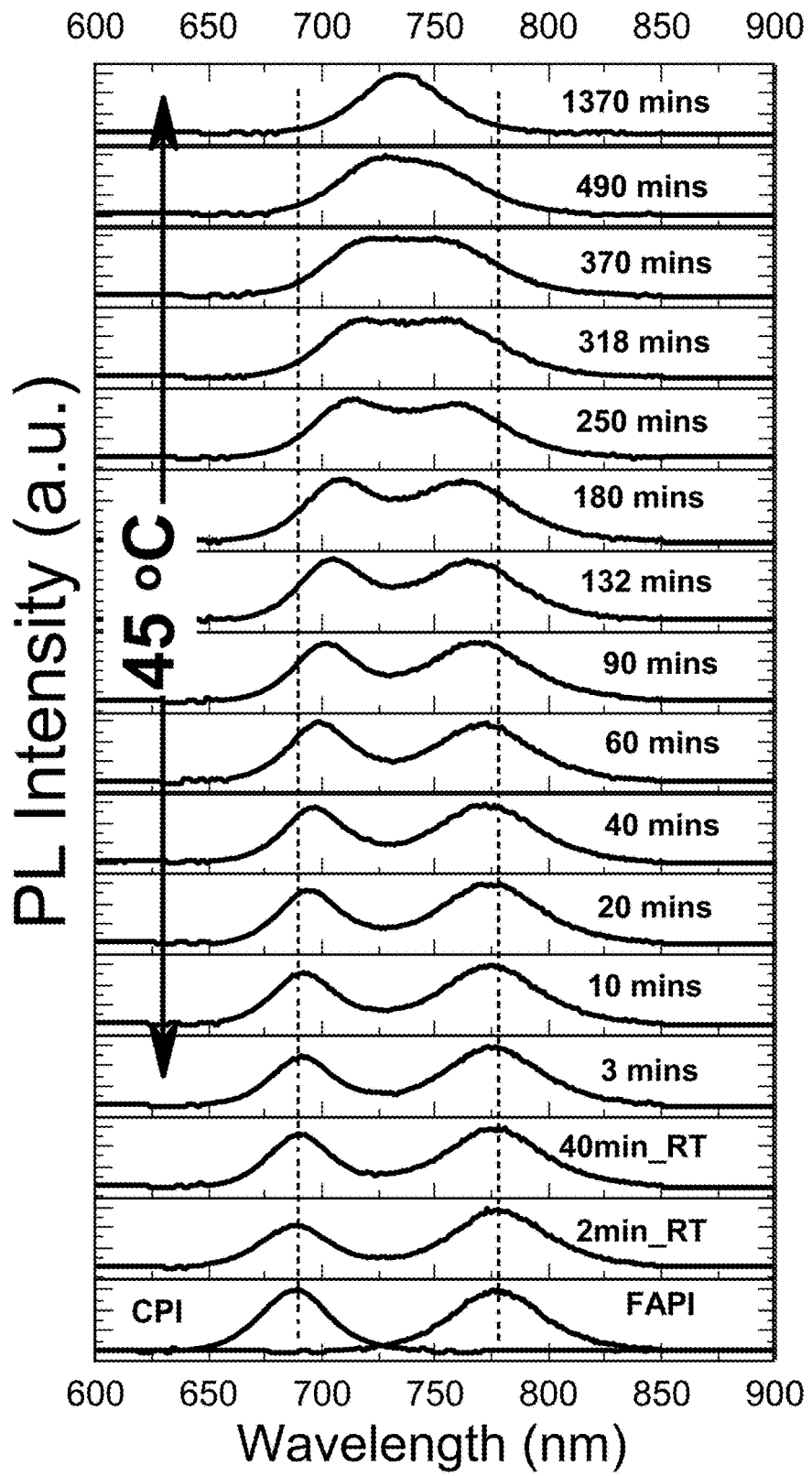
FIGS. 14A through 14E illustrate the temperature kinetics of A-cation exchange at 45° C., 60° C., 70° C., 80° C., and 90° C., respectively, according to some embodiments of the present disclosure.
Figure 14B:
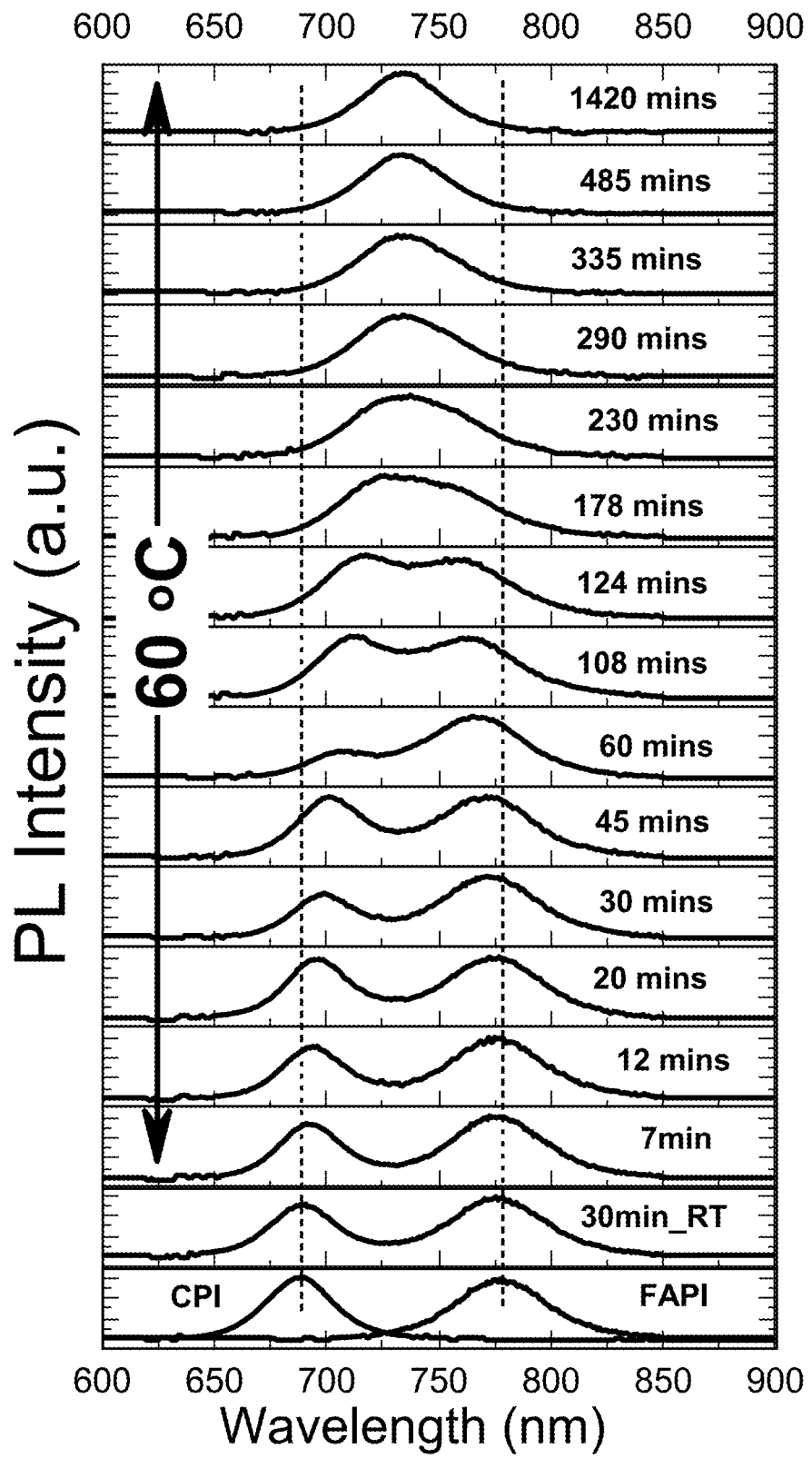
Figure 14C:
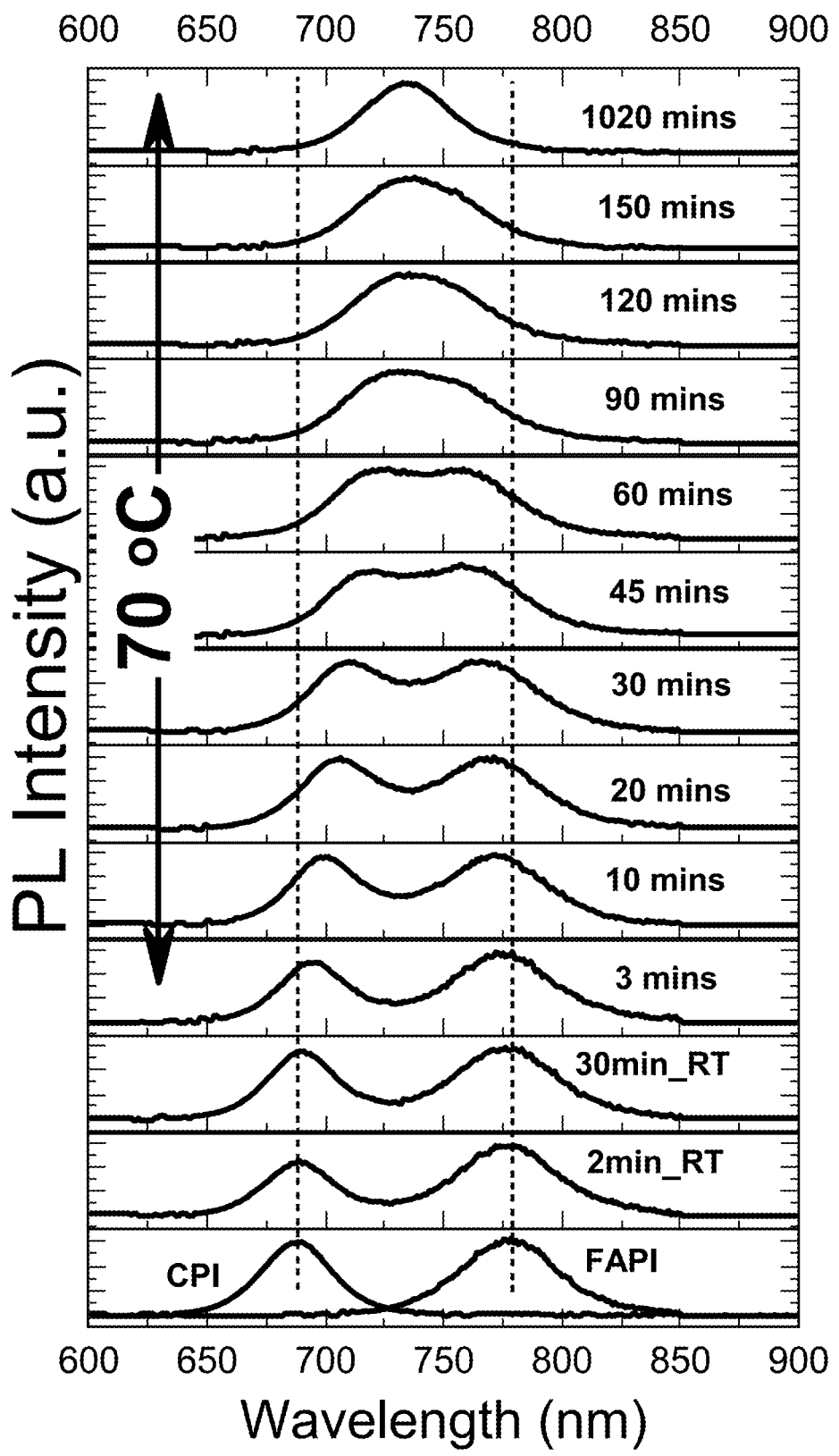
Figure 14D:
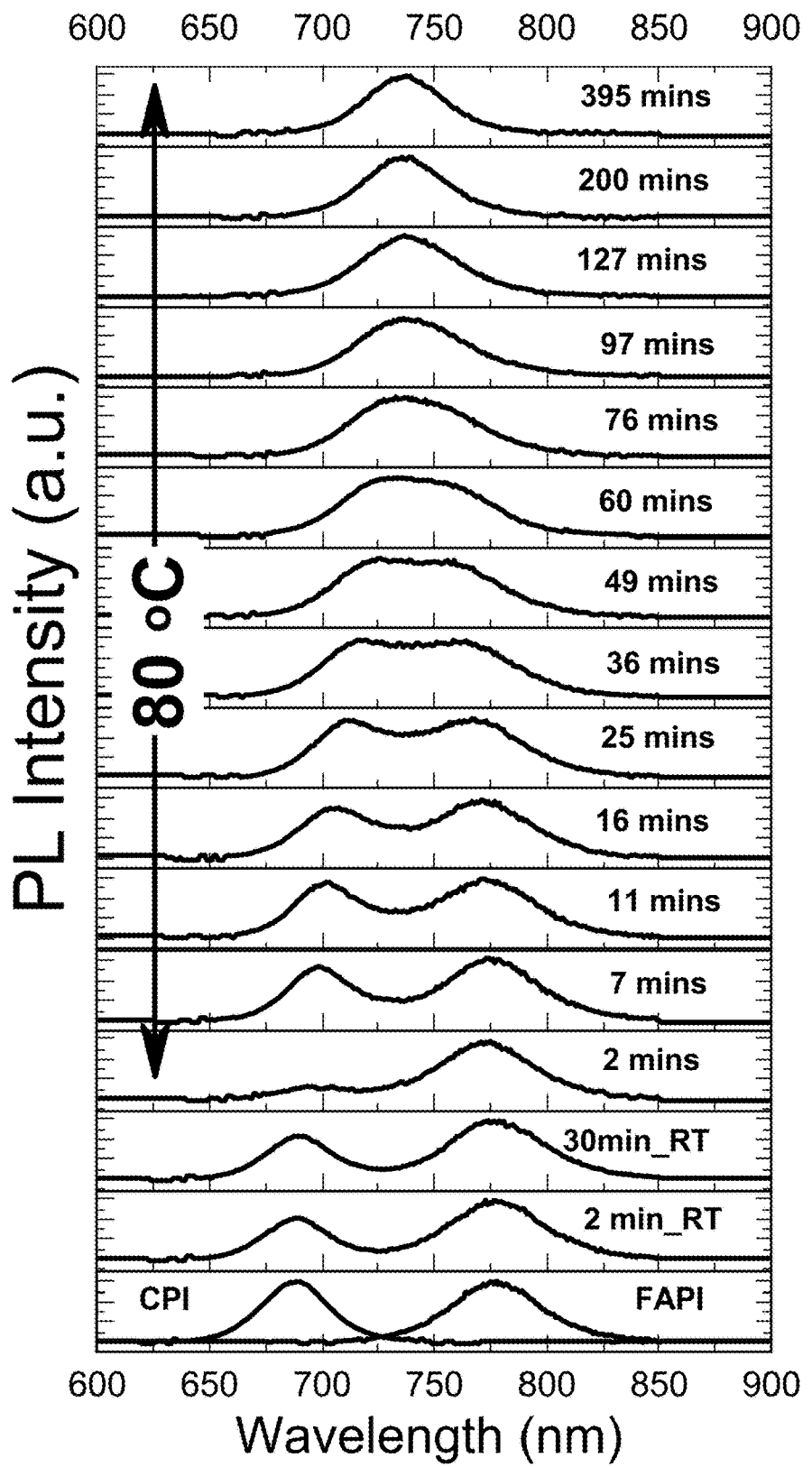
Figure 14E:
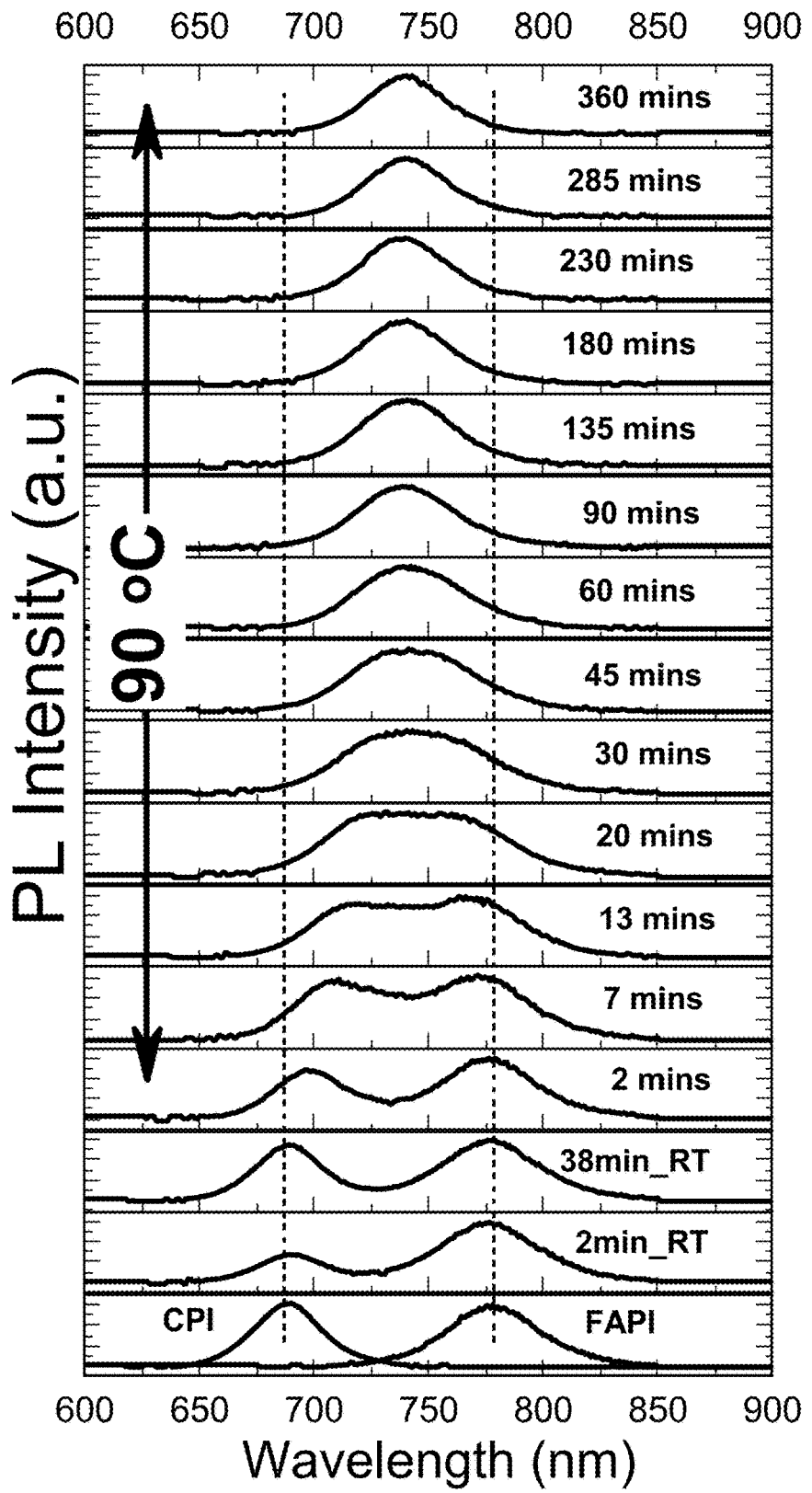
Figure 15A:
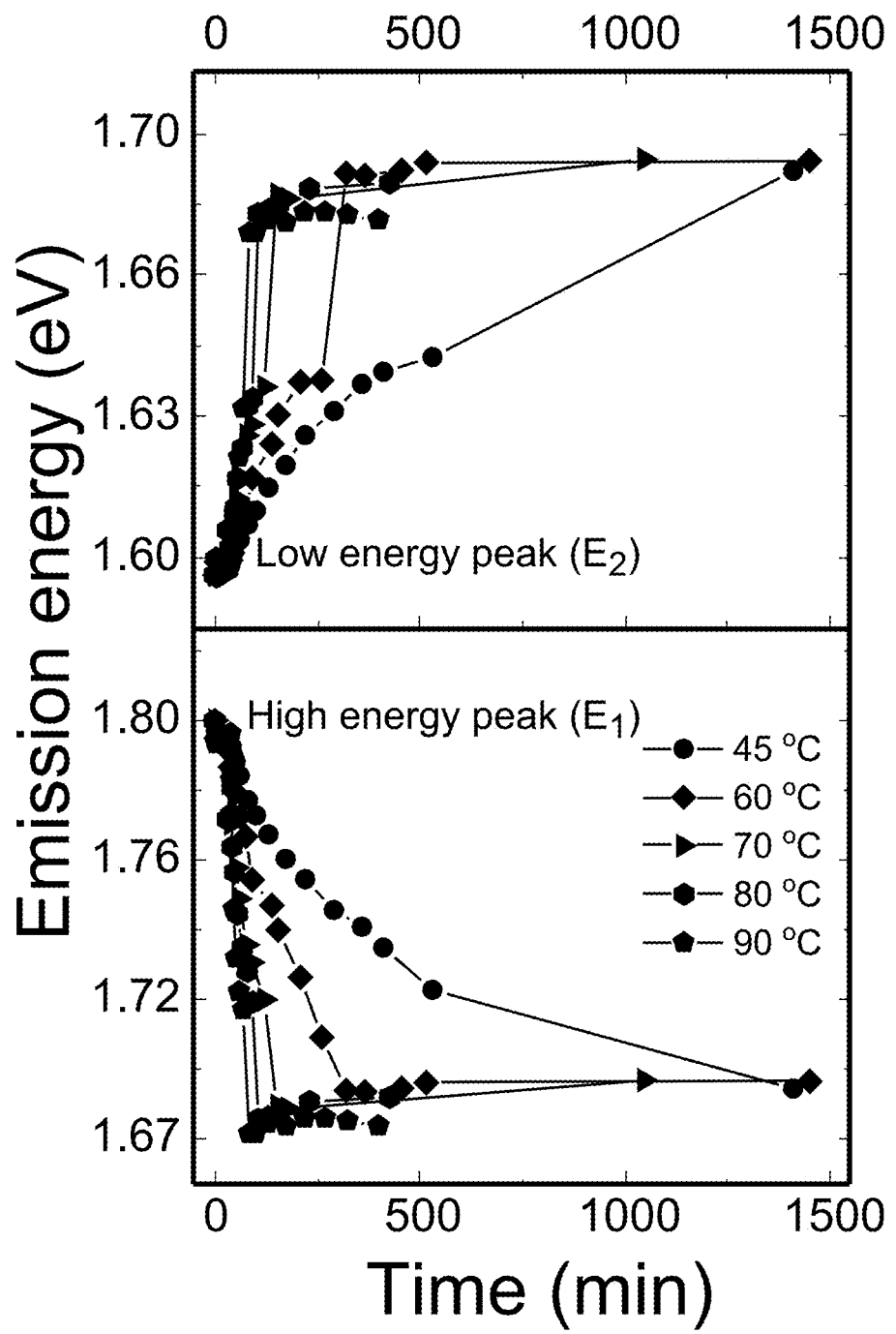
FIG. 15A illustrates the time dependent emission energies at different temperatures extracted from Gaussian fittings of the PL emission spectra shown in FIGS. 14A through 14E.
Figure 15B:
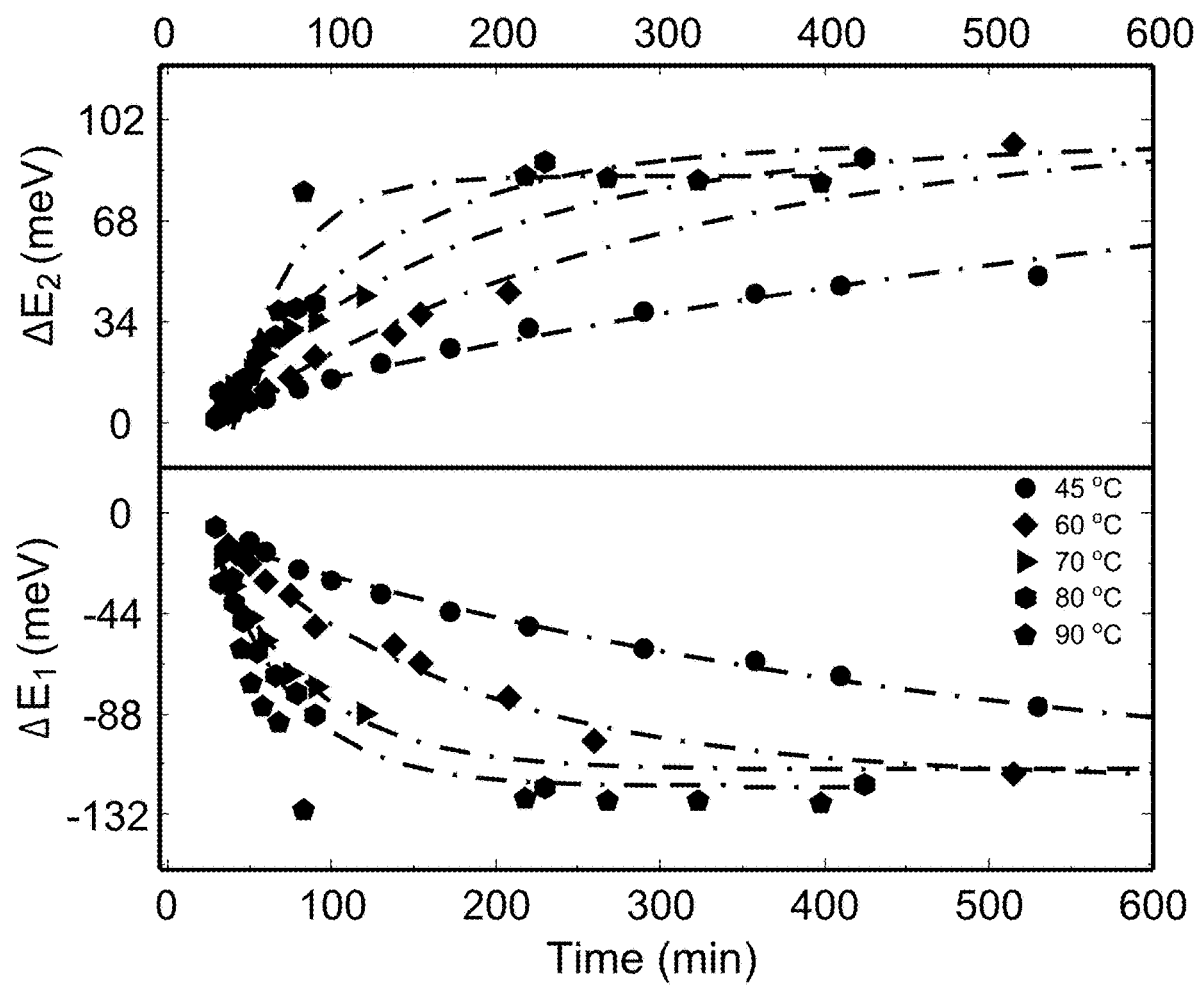
FIG. 15B illustrates the shift in emission energies from their original position, depicting how the high energy peak is red-shifting from pure $CsPbI_3$ due to incorporation of $FA^+$ and how the low-energy peak is blue-shifting from pure $FAPbI_3$ due to incorporation of $Cs^+$. The dotted lines are exponential fitting to the experimental data.

The time-dependent PL measurements show that the two initial emission peaks merge into a single peak over time (the higher energy peak, referred to as E$_1$ corresponds to the Cs-rich composition, and the lower energy peak, referred to as E$_2$ corresponds to the FA-rich composition). As can be seen from FIGS. 13A, 13B, and 13C (also shown in FIGS. 14A-14E), these two peaks did not move substantially from the original positions of CsPbI$_3$ and FAPbI$_3$ at room temperature at least up to ~40 minutes. The exchange was temperature dependent; the high energy and the low energy peaks merged more rapidly at elevated solution temperature. For example, referring to the PL emission spectral profile after 60 minutes at three different temperatures, the emission spectrum has two distinct peaks at 45° C. that have merged into a single peak at 90° C. The emission energies of E$_1$ and E$_2$ over time are plotted in FIG. 15A. Assuming that the change in PL peak position is linear with respect to composition, then the rate at which these peaks shift from emission energies of pure CsPbI$_3$ and FAPbI$_3$ can be related to how fast Cs$^+$ and FA$^+$ ions leave the starting NC and diffuse into the other NC. It remains experimentally difficult to decouple and monitor these two processes separately. Nonetheless, it was observed that the rate of shift of the high energy ($\Delta E_1$) and the low energy peaks ($\Delta E_2$) can be reasonably fitted with single exponentials, indicating a first-order process, as shown in FIG. 13D (see also FIG. 15B). These rates can be used to extract the activation energy (E$_a$) related to the exchange (i.e. forming) process. Fitting these rates with the Arrhenius equation (see FIG. 13E) yields an activation energy of ~0.65 eV (see below for methods). This activation energy is higher than that reported for I$^-$ diffusion in methylammonium and formamidinium lead iodide perovskites, or Br$^-$ and Cl$^-$ inter-diffusion in CsPbCl$_x$Br$_{1-x}$ nanowires (~0.45 eV).

Figure 16A:
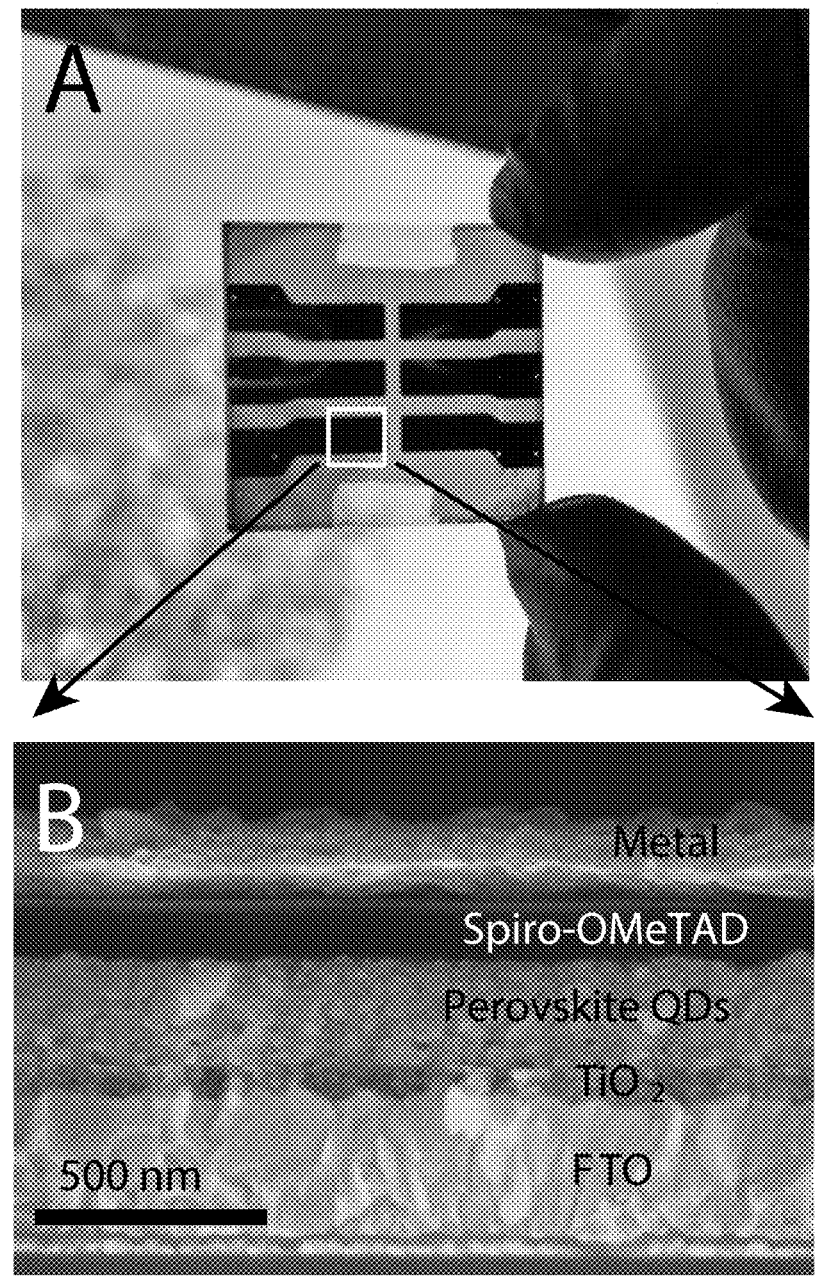
FIG. 16A illustrates a photograph of a solar cell device (Panel A) that includes an active layer composed of pure phase $FAPbI_3$ NCs and $CsPbI_3$ NCs as well as three compositions of the mixed A-cation perovskite NCs, and the corresponding cross-sectional scanning electron microscopy (SEM) image (Panel B) displaying solar cell architecture and typical layer thicknesses, according to some embodiments of the present disclosure.
Figure 16B:
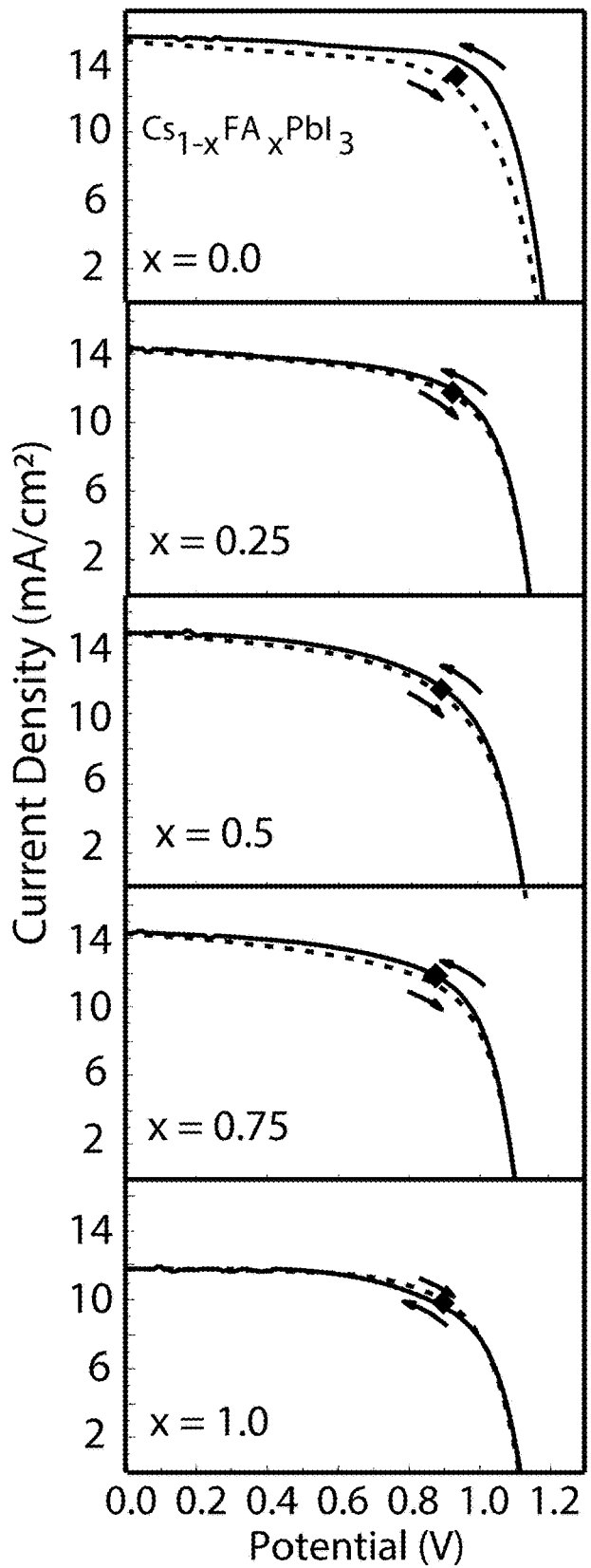
FIG. 16B illustrates J-V curves for $Cs_{1-x}FA_xPbI_3NC$ devices; bottom to top: pure $FAPbI_3$, $Cs_{0.25}FA_{0.75}PbI_3$, $Cs_{0.50}FA_{0.50}PbI_3$, $Cs_{0.75}FA_{0.25}PbI_3$, pure $CsPbI_3$; the solid and dotted lines represent reverse and forward scans respectively; the solid squares on the J-V curves shows the SPO values, according to some embodiments of the present disclosure.
Figure 16C:
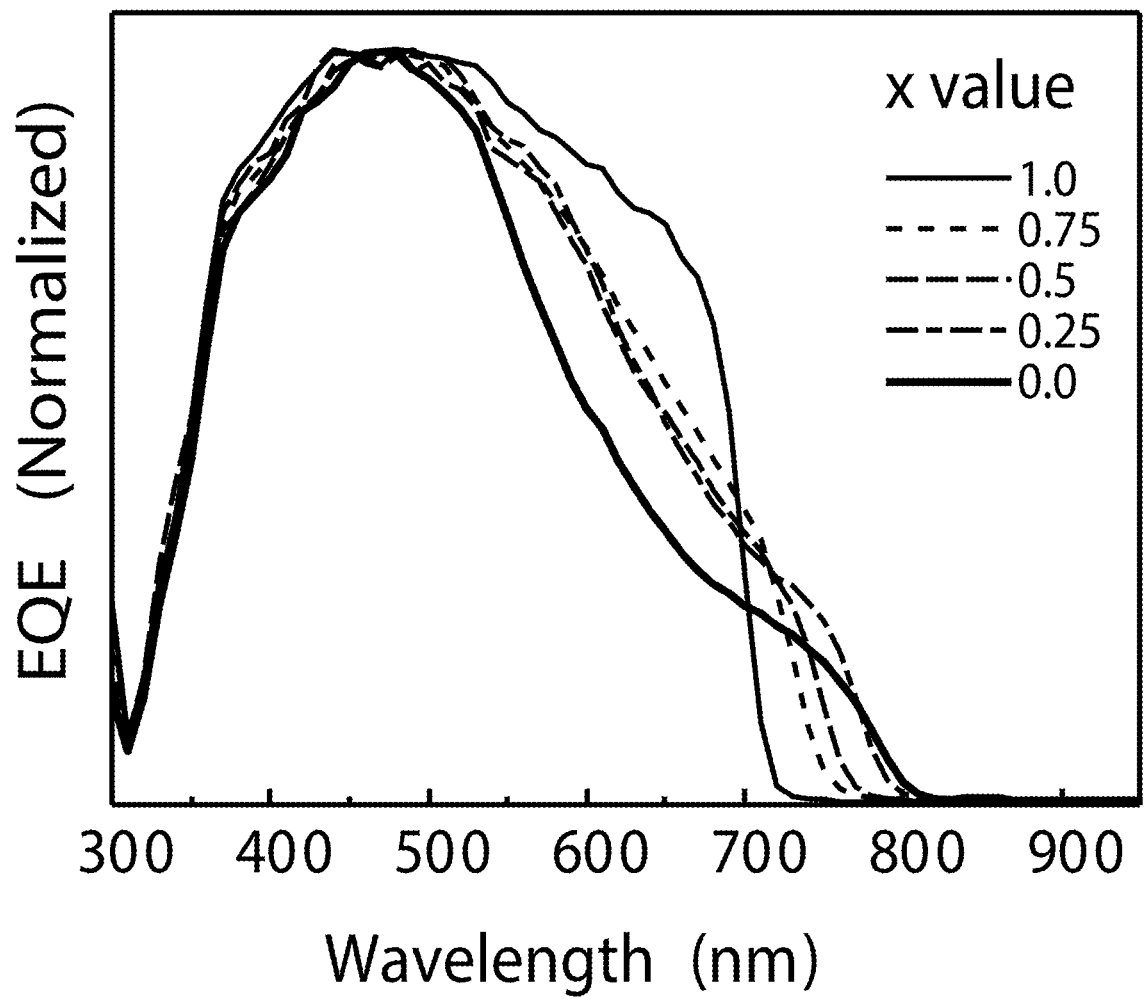
FIG. 16C illustrates normalized EQE scans for each composition of FIG. 16B, showing the tunable onset position depending on the NC composition, according to some embodiments of the present disclosure.

Cs$_{1-x}$FA$_x$PbI$_3$ NCs were used to fabricate photovoltaic devices with the device architecture shown in FIG. 16A.

To directly compare the V$_{OC}$ of NC solar cells to the more traditional large grain perovskite devices, both types of solar cells were fabricated. The V$_{OC}$ for both perovskite NCs devices and large grain devices were compared as a function of the EG and of the A-cation composition (fraction of FA) and are shown in FIGS. 17A, 17B, 18A, and 18B. The EG values were extracted from the onset of the EQE spectra. For the large grain devices, the A-cation composition was tuned with a Cs fraction of 0 to 0.3 because of the previously mentioned challenge in crystallization of compositions with higher amounts of Cs. A V$_{OC}$ up to ~1.17V was obtained in the NC devices, as compared to just above 1.0V in bulk Cs$_{1-x}$FA$_x$PbI$_3$ devices. All of the thin film perovskite devices exhibited near state-of-the art V$_{OC}$.

Figure 17A:
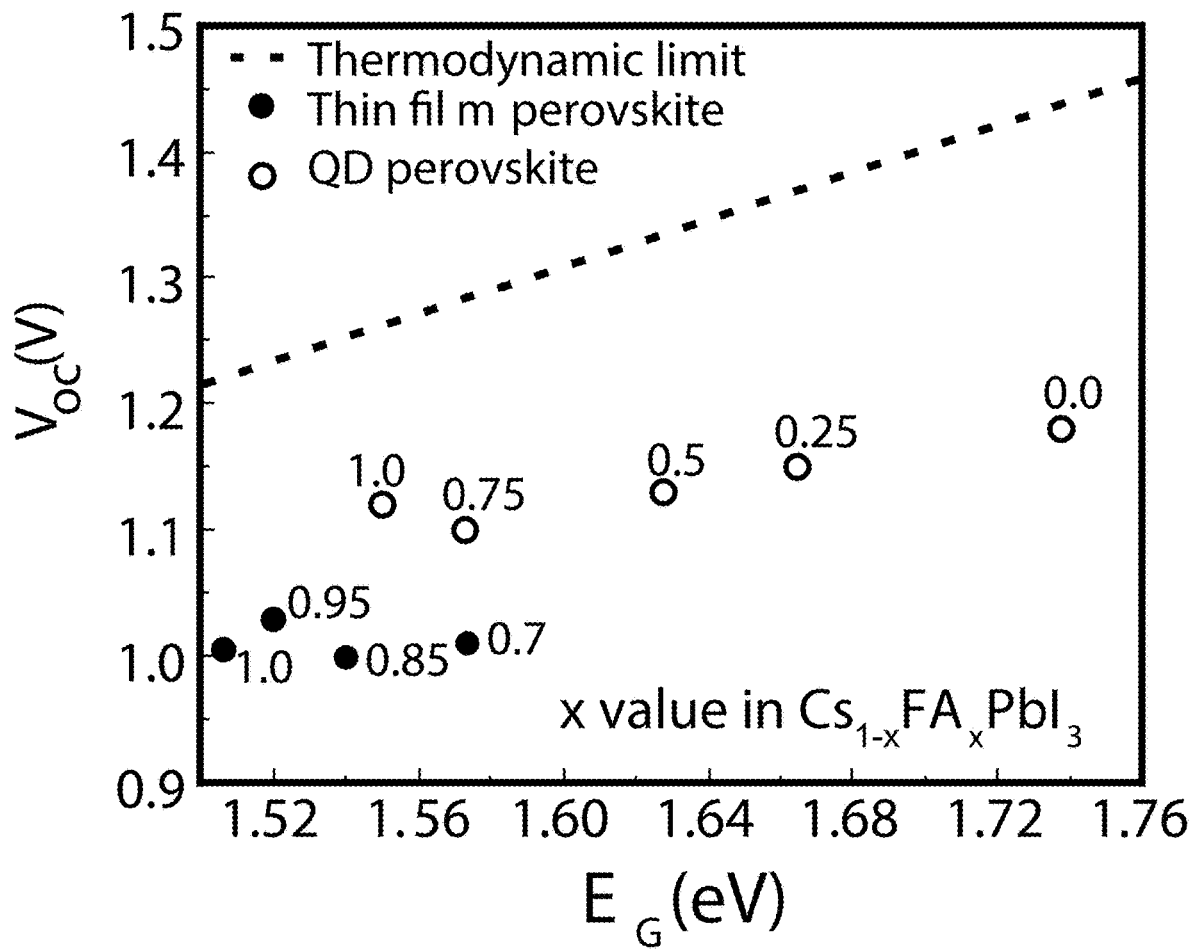
FIG. 17A illustrates experimental $V_{OC}$'s the voltage loss in the perovskite NC and thin film devices, according to some embodiments of the present disclosure.
Figure 17B:
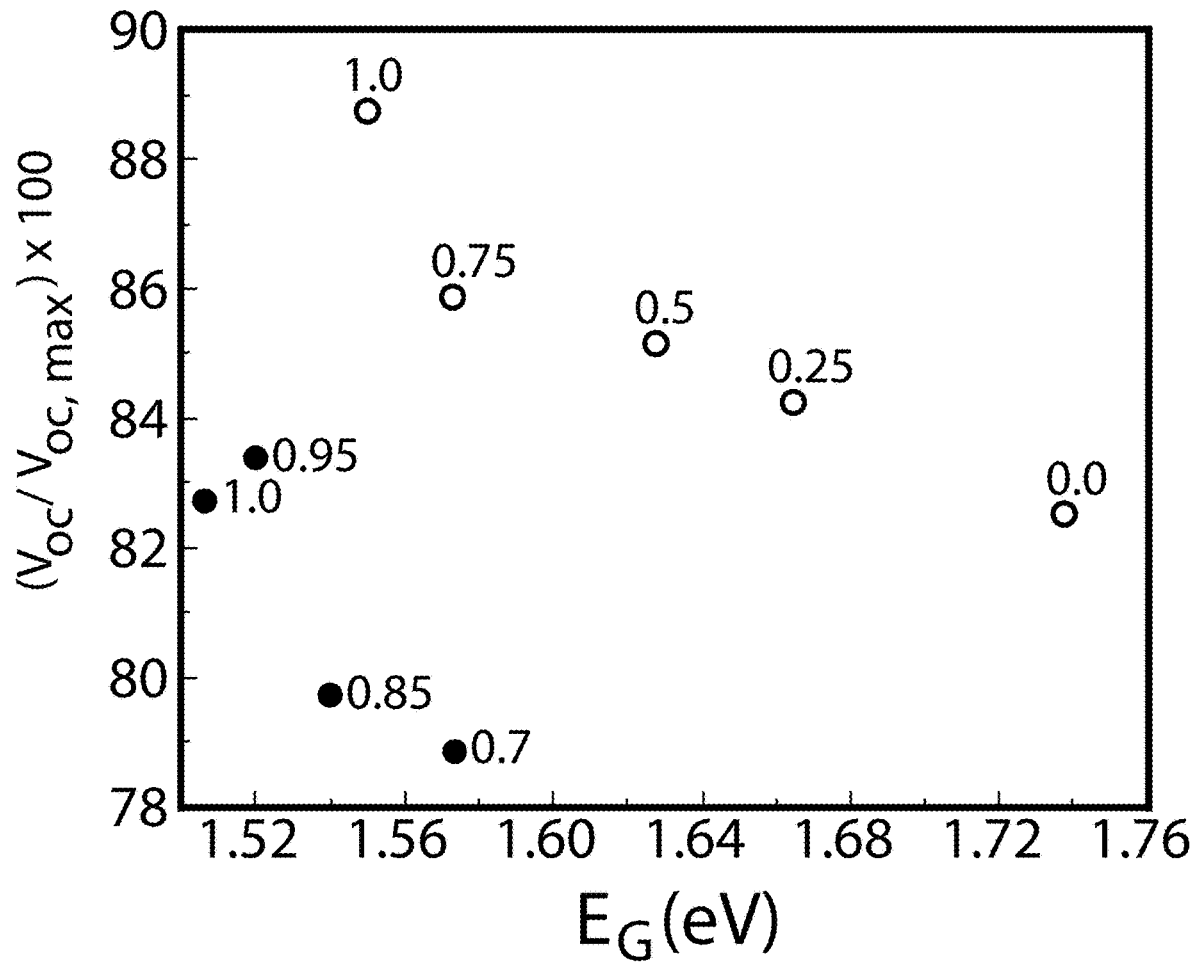
FIG. 17B illustrate the percentage fraction of observed $V_{OC}$ against the maximum attainable $V_{OC}$ as functions of band gap EG. The numbers beside the solid and open circles represent the x in the $Cs_{1-x}FA_xPbI_3$ perovskite NCs.
Figure 18A:
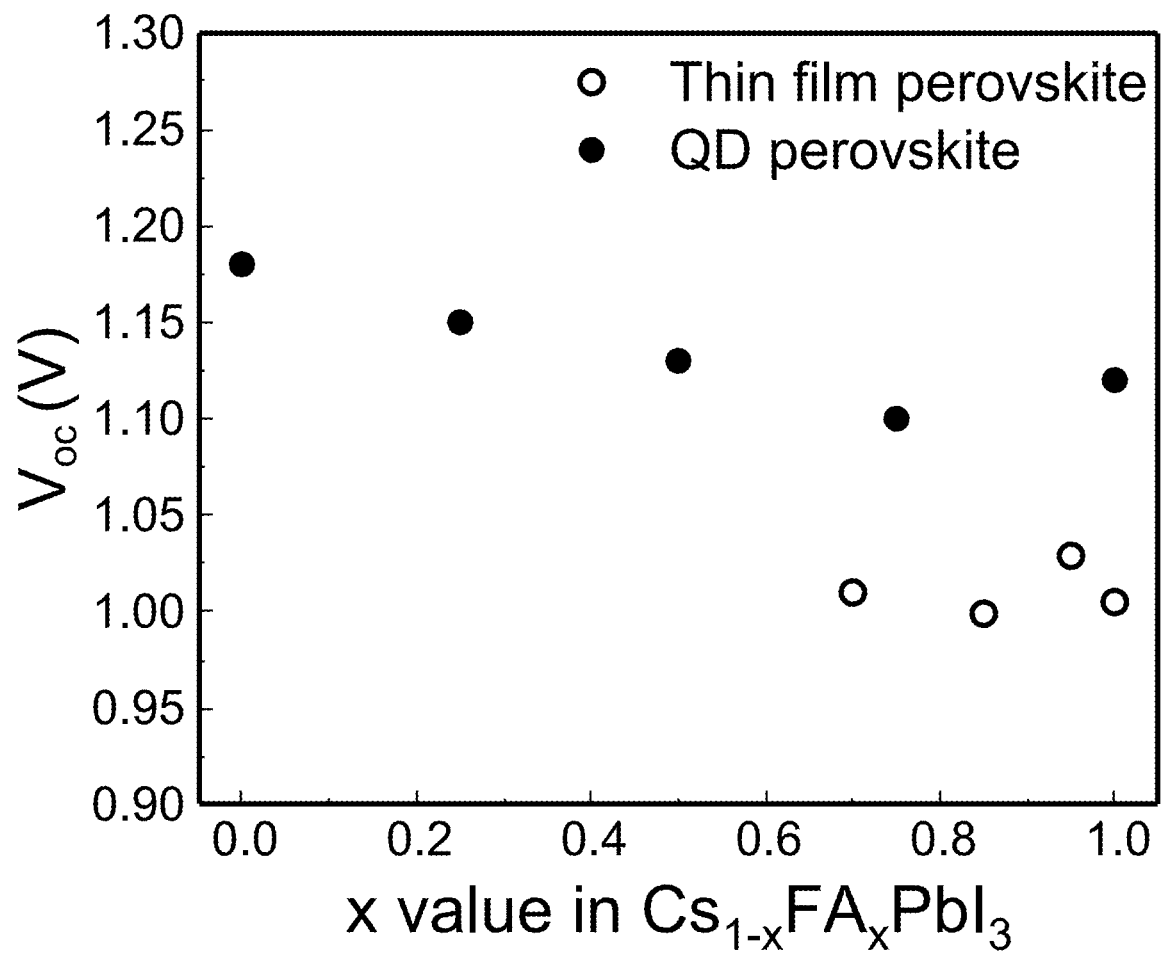
FIG. 18A illustrates the voltage loss in the perovskite NC and thin film devices by plotting $V_{OC}$, according to some embodiments of the present disclosure.
Figure 18B:
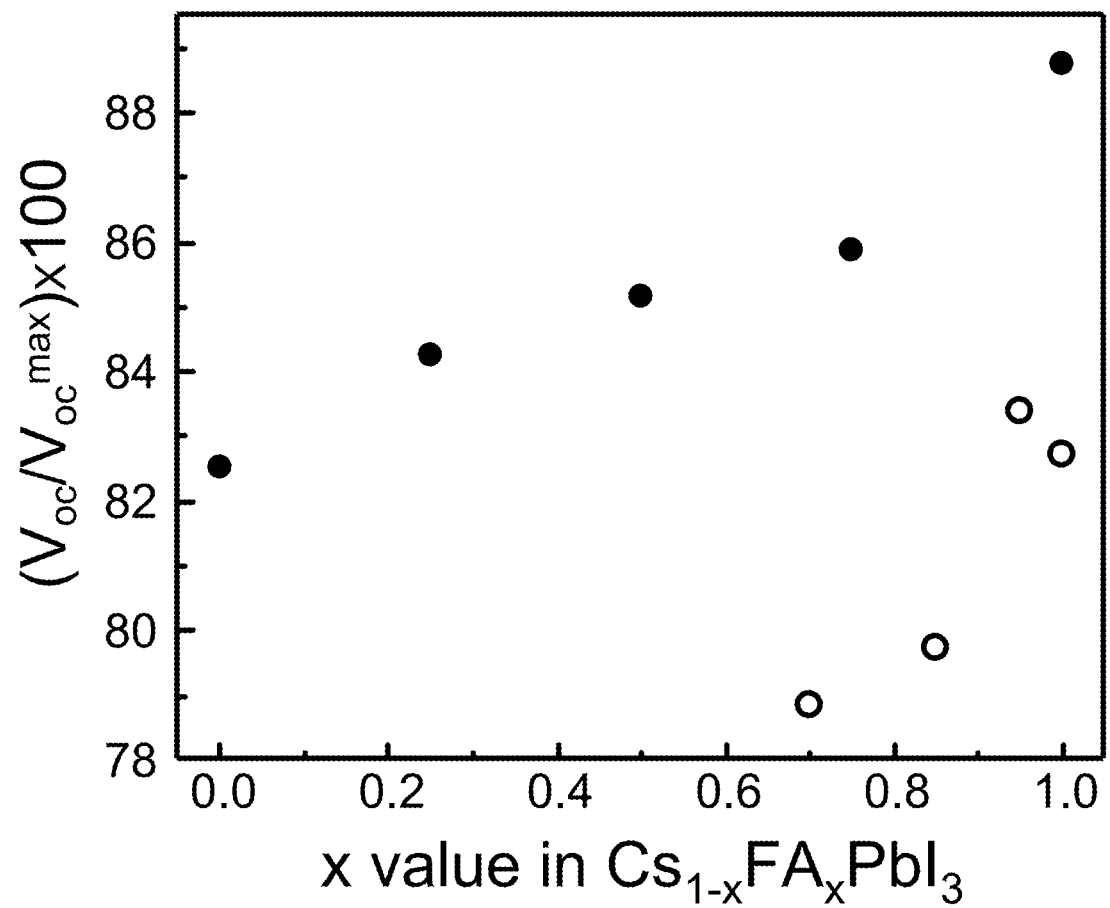
FIG. 18B illustrates the percentage fraction of observed $V_{OC}$ against the maximum attainable $V_{OC}$ as functions of x in the composition of $Cs_{1-x}FA_xPbI_3$ perovskite NC devices, according to some embodiments of the present disclosure.
Figure 19A:
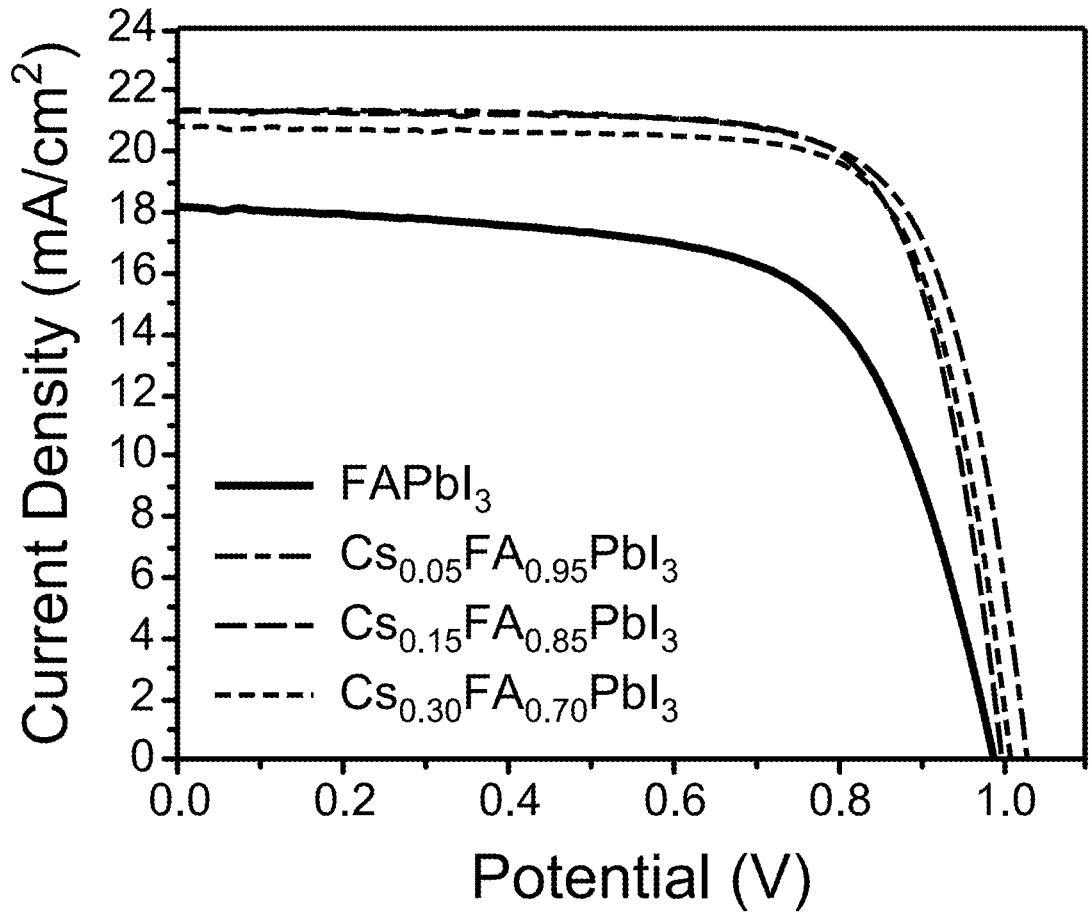
FIG. 19A illustrates J-V scans of $Cs_{1-x}FA_xPbI_3$ perovskite thin film devices, according to some embodiments of the present disclosure.
Figure 19B:
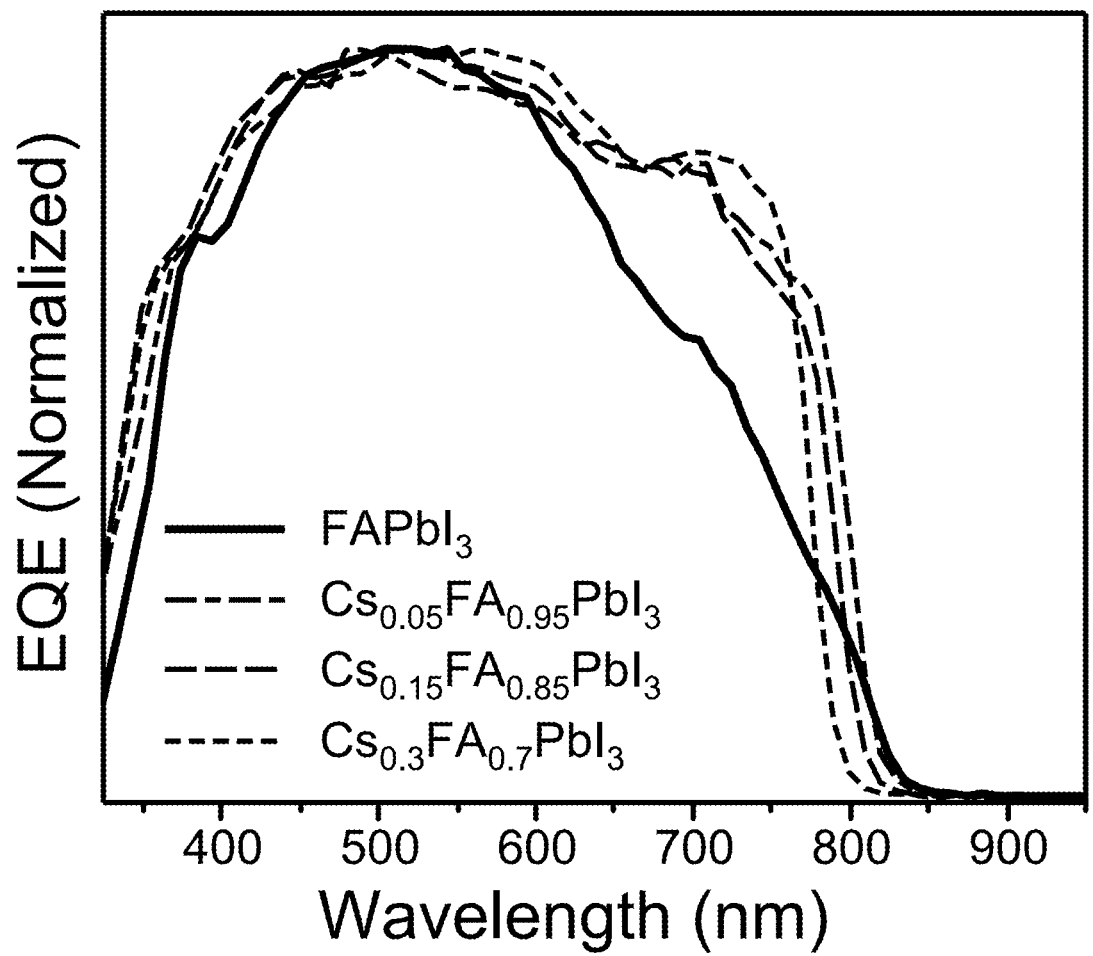
FIG. 19B illustrates normalized EQE spectra of $Cs_{1-x}FA_xPbI_3$ perovskite thin film devices, according to some embodiments of the present disclosure.

The quantum confinement effect in the NCs slightly increases EG of a particular composition, so it is more reasonable to compare the observed V$_{OC}$ to that of the thermodynamic limit for the determined EG (the dashed line in FIG. 17A). V$_{OC}$/V$_{OC}$' was plotted against EG in FIG. 17B and against the fraction of FA in FIG. 18B. Here, V$_{OC}$ is the observed open-circuit voltage, while V$_{OC}$' is the maximum available open-circuit voltage for a single junction solar cell with the given bandgap energy as determined by the Shockley-Queisser (SQ) theoretical analysis. This gives a comparative estimate of voltage loss in the devices. As seen in FIGS. 17A and 17B, the V$_{OC}$ loss is much less as compared to that of the bulk perovskite devices at any particular composition or bandgap value. Another important finding to note here is that although the pure FAPbI$_3$ NC devices have somewhat lower efficiencies, they exhibited the lowest V$_{OC}$ loss at approximately 89% of the SQ limit.

Figure 20:
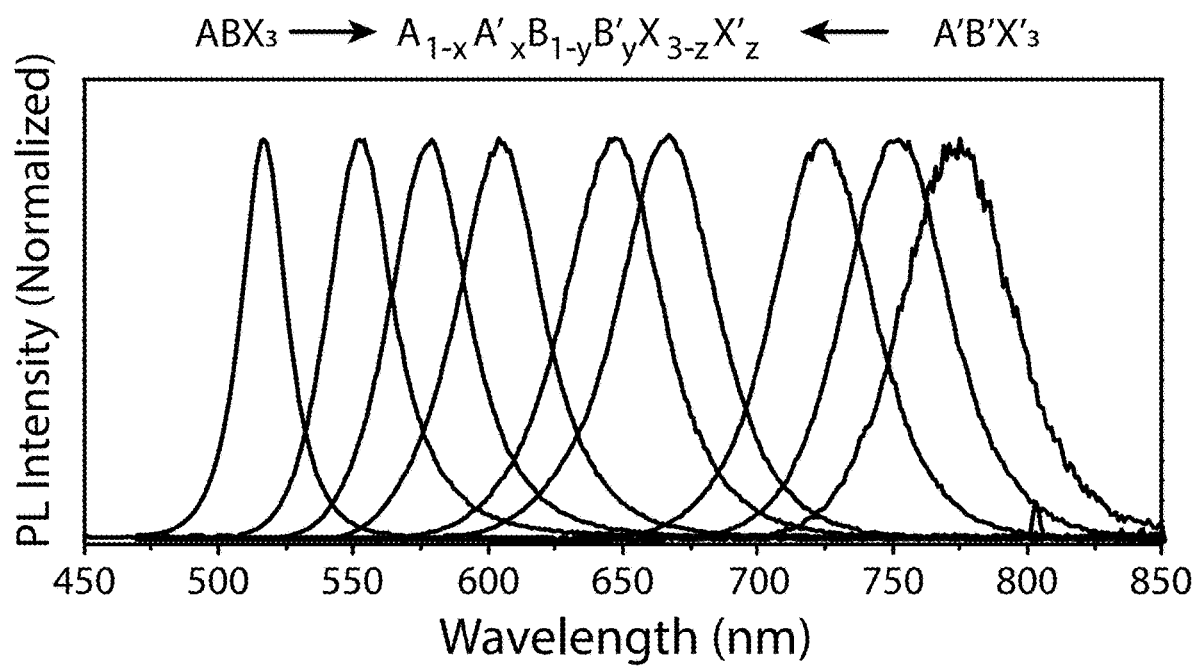
FIG. 20 illustrates photoluminescence emission spectra of the $Cs_{1-x}FA_xPbBr_{3-z}I_z$ nanocrystals, according to some embodiments of the present disclosure.
Figure 21:
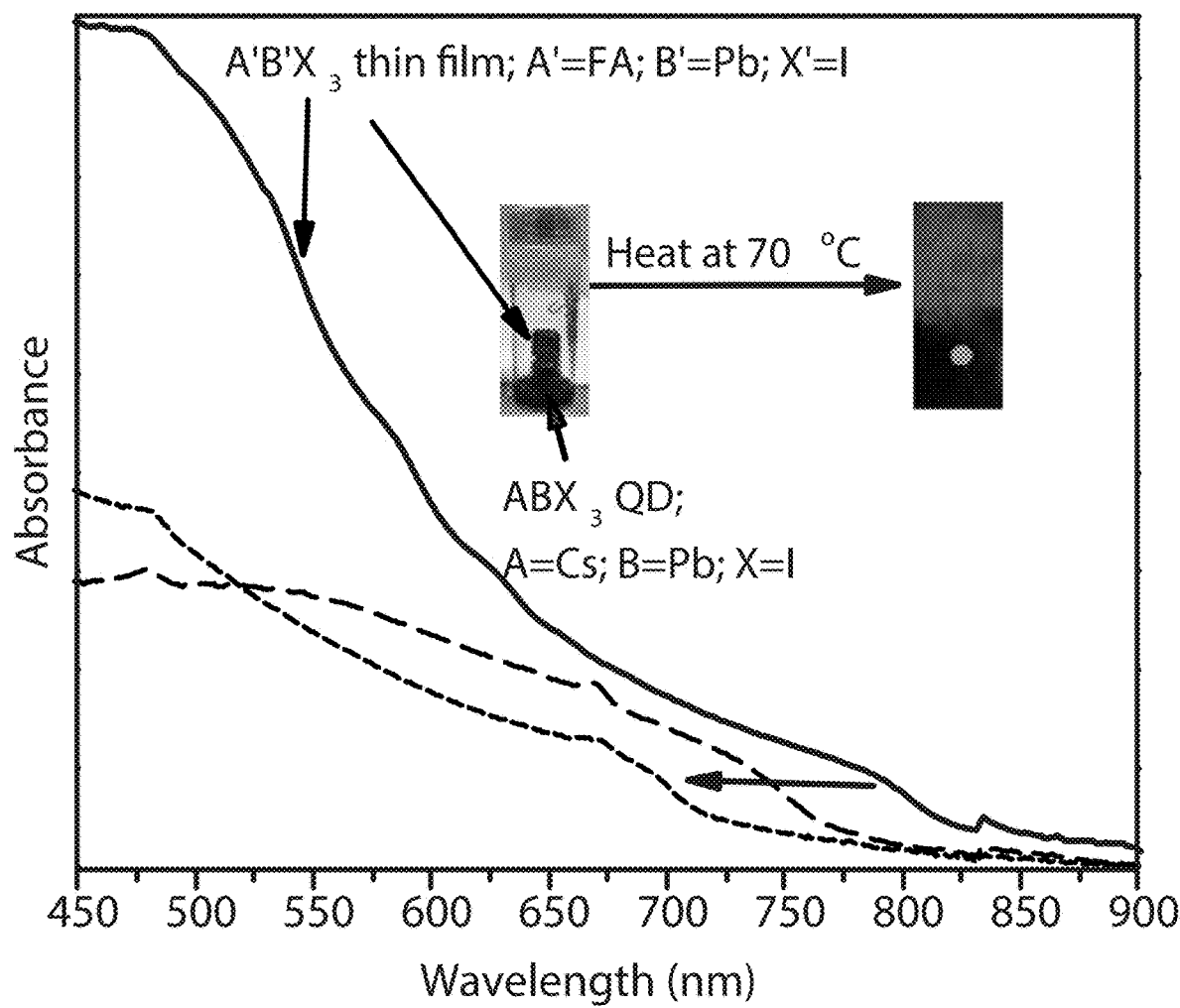
FIG. 21 illustrates UV-Vis absorption spectra of the $Cs_{1-x}FA_xPbI_3$ thin films with composition manipulated used ion exchange from NCs, according to some embodiments of the present disclosure.

FIG. 20 illustrates two different perovskite nanocrystal solutions comprising ABX$_3$ (where A=Cs, B=Pb and X=Br) and A'B'X'$_3$ (where A=FA, B=Pb and X=I) were mixed at various ratios at 70° C. for 24 hours. The resultant $A_{1-x}A'_xB_{1-y}B'_yX_{3-z}X'_z$ NCs has emission ranging between ~510-780 nm. FIG. 21 illustrates another embodiment of the present disclosure, the exchange elements between a first perovskite in the form of nanocrystals to a second perovskite in the form of a thin film. In this example, an A'B'X'$_3$ (where A=FA, B=Pb and X=I) bulk thin film on glass was dipped in a nanocrystal solution of ABX$_3$ (where A=Cs, B=Pb and X=I) and heated at 70° C. for 24 hrs. The A'B'X'3 thin film transformed into mixed A-cation and X-anion compositions of $A_{1-x}A'_xB_{1-y}B'_yX_{3-z}X'z$ as evidenced by a shift in the absorption spectra collected at different positions of the thin film.

As described above, in some embodiments of the present disclosure, mixed perovskite NCs may be synthesized that include both mixed A-cations and mixed X-anions, as defined by $A_{1-x}A'_xB(X_{1-x}X'_x)_3$, for example, $Cs_{1-x}FA_xPb(I_{1-x}Br_x)_3$, where $0\le 1-x\le 1$. For example, CsPbBr$_3$ and FAPbI$_3$ QDs were synthesized using single-pot direct synthesis using controlled ratios of Pb-halide salts (see below for details). Then, the FAPbI$_3$ and CsPbBr$_3$ QD solutions were mixed at 70° C. for 24 hours in a fixed Cs:FA molar ratio. To confirm the existence of single phase $FA_{1-x}Cs_xPb(I_{1-x}Br_x)_3$ QDs, the resultant nanocrystals were characterized via photoluminescence emission and UV-Vis-NIR absorbance spectroscopy to ensure the convergence of the luminescence peak and first exciton.

Figure 22A:
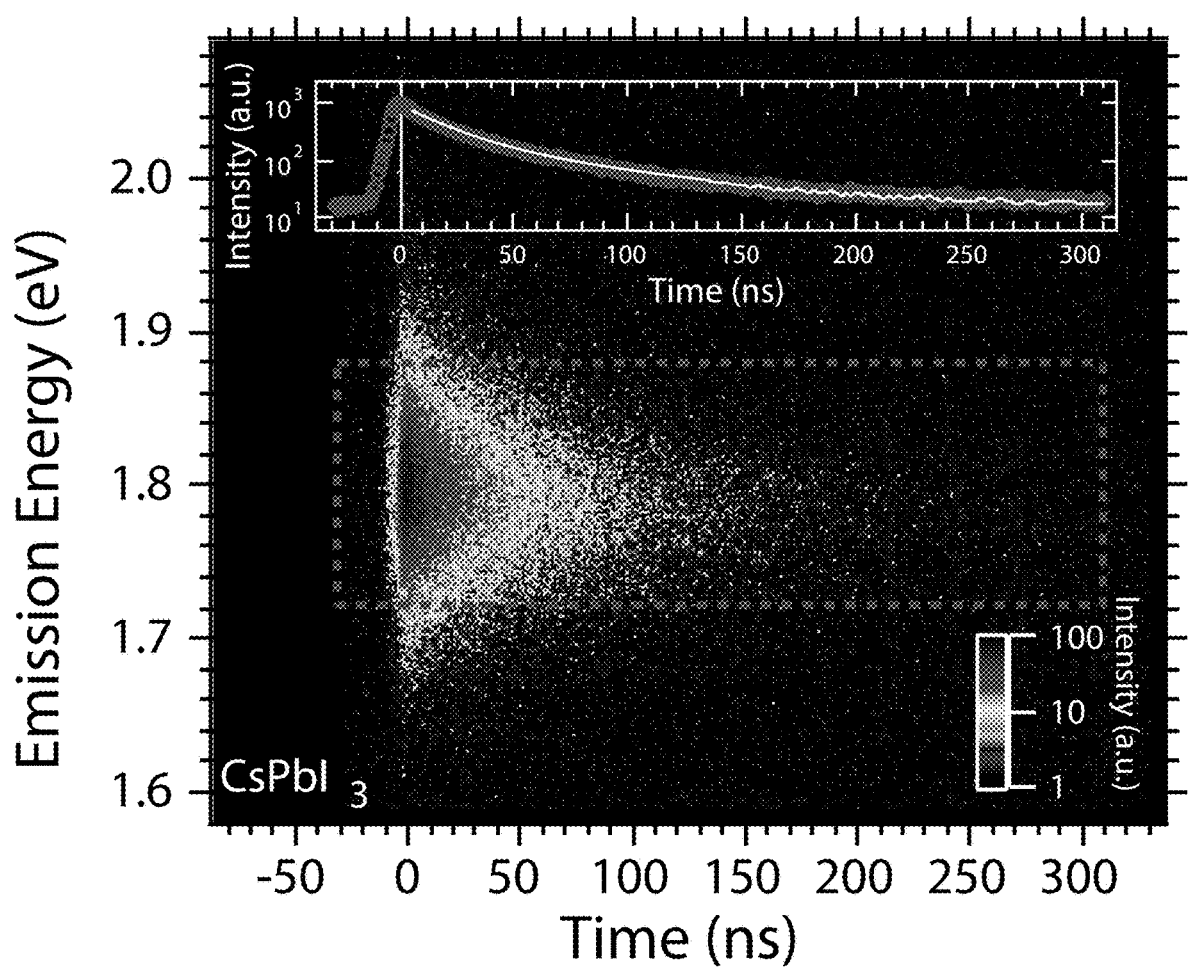
FIG. 22A illustrates two-dimensional spectrotemporal TRPL data of $CsPbI_3$ QDs, measured using a streak-camera. The dashed rectangle represents the portion of the trace that was integrated to construct an intensity versus decay-time transient.
Figure 22B:
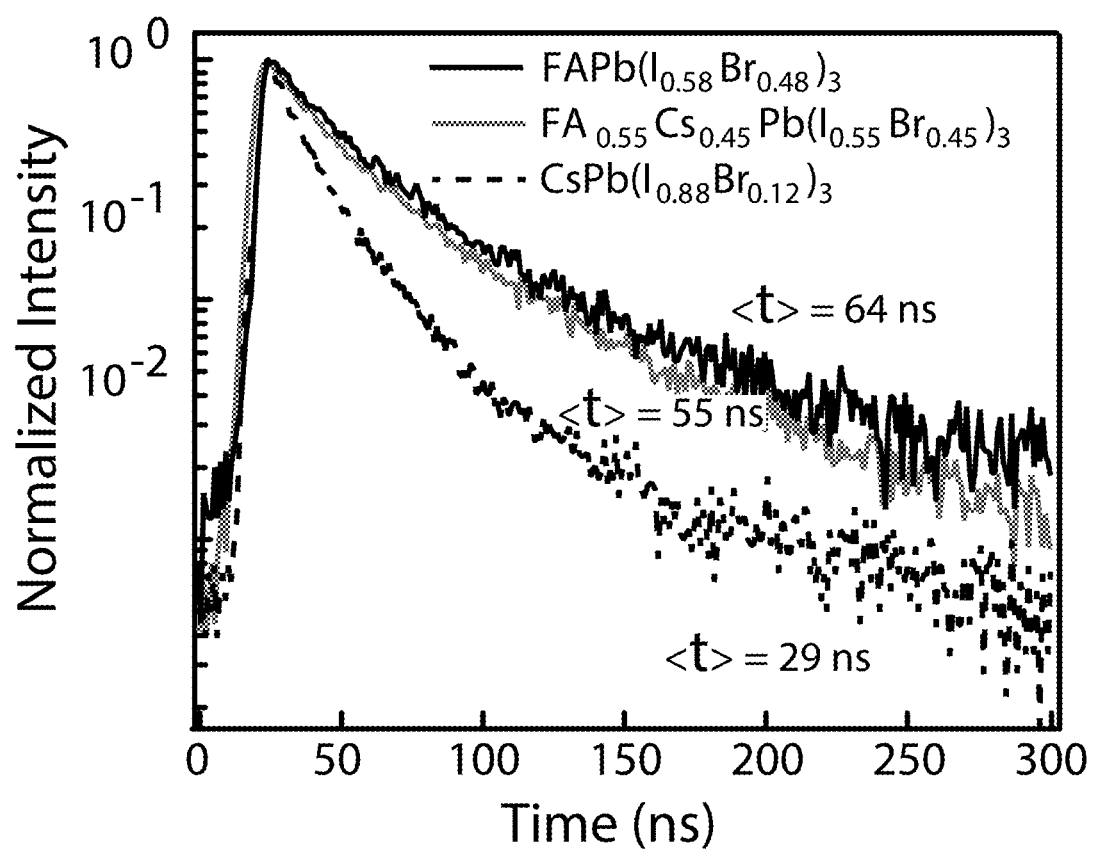
FIG. 22B illustrates TRPL transients of $CsPb(I_{1-x}Br_x)_3$, $FAPb(I_{1-x}Br_x)_3$ and $FA_{1-x}Cs_xPb(I_{1-x}Br_x)_3$ colloidal QDs with bandgap energies of ca. 1.9 eV, according to some embodiments of the present disclosure.
Figure 22C:
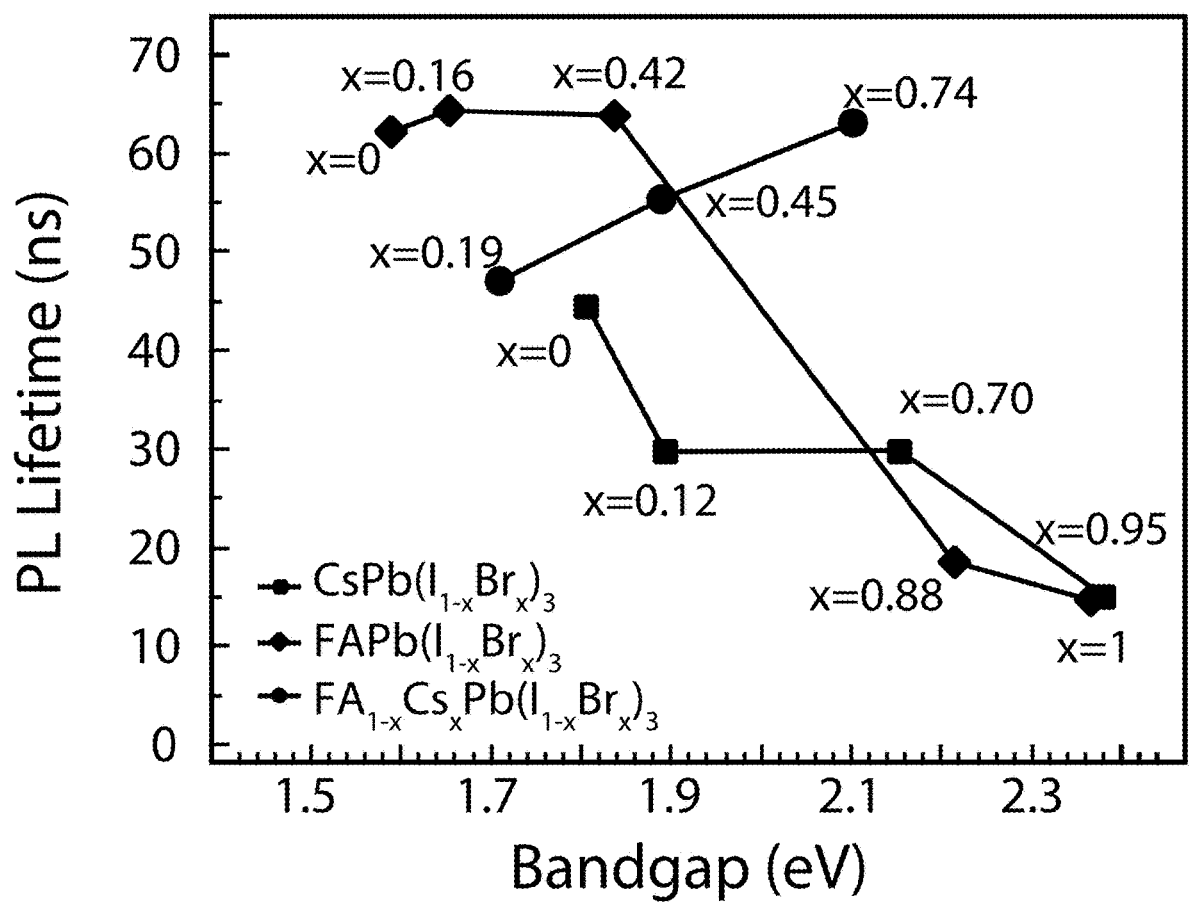
FIG. 22C illustrates PL lifetime versus bandgap of all colloidal QD samples including $CsPb(I_{1-x}Br_x)_3$, $FAPb(I_{1-x}Br_x)_3$, and $FA_{1-x}Cs_xPb(I_{1-x}Br_x)_3$ QDs, according to some embodiments of the present disclosure.

FIG. 22A shows two-dimensional TRPL data for CsPbI$_3$ colloidal QDs, and the dashed box in FIG. 22A shows the region of the response that is integrated to produce a TRPL transient decay curve. FIG. 22B shows data for $CsPb(I_{1-x}Br_x)_3$, $FAPb(I_{1-x}Br_x)_3$, and $FA_{1-x}Cs_xPb(I_{1-x}Br_x)_3$ colloidal QDs each with a composition tuned to achieve a bandgap of approximately 1.9 eV. The TRPL transients show that FA$^+$ incorporation nearly doubles the lifetime from 29 ns to 55 ns for the FACs mixed composition sample or 64 ns for the sample with pure FA$^+$ on the A-site. Thus, in this case, the A-cation mediated lengthening of the PL lifetime overrules X-anion mediated PL lifetime shortening. FIG. 22C compares the intensity-weighted average PL lifetimes of the $CsPb(I_{1-x}Br_x)_3$, $FAPb(I_{1-x}Br_x)_3$, and $FA_{1-x}Cs_xPb(I_{1-x}Br_x)_3$ QDs as a function of bandgap. The average lifetime of the $CsPb(I_{1-x}Br_x)_3$ QDs decreases significantly from about 45 ns to 15 ns across the compositional range, with a sharp decrease observed even for small bromide contents. In contrast, the FA-containing QDs appear to be less sensitive to the substitution of I$^-$ with Br$^-$. Single-cation $FAPb(I_{1-x}Br_x)_3$ QDs exhibit similar lifetimes of >60 ns until the bandgap exceeds 1.8 eV (Br$^-$ content of 42%) and then drops precipitously to 15 ns, similar to the average lifetimes observed for the single-cation Cs-containing QDs. The mixed-cation $FA_{1-x}Cs_xPb(I_{1-x}Br_x)_3$ QDs, on the other hand, exhibit PL lifetimes that actually increase with bandgap energy, and reach 65 ns for a bandgap of 2.1 eV. This increase in PL lifetime with increasing bandgap for the $FA_{1-x}Cs_xPb(I_{1-x}Br_x)_3$ composition appears to be unique among QDs.

Figure 23A:
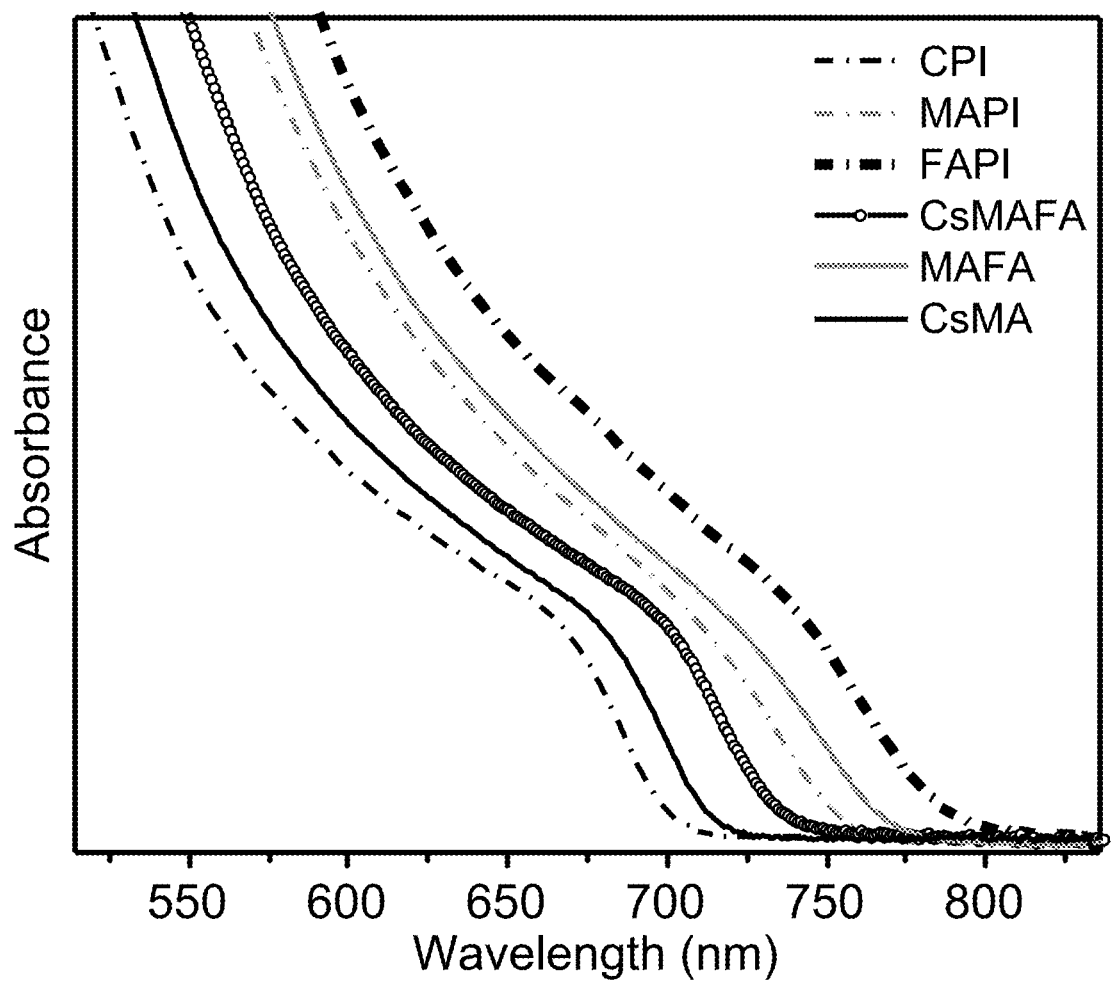
FIG. 23A illustrates the optical absorbance of the various $(Cs_{1-x-y}MA_xFA_y)PbI_3$NCs, according to some embodiments of the present disclosure.
Figure 23B:
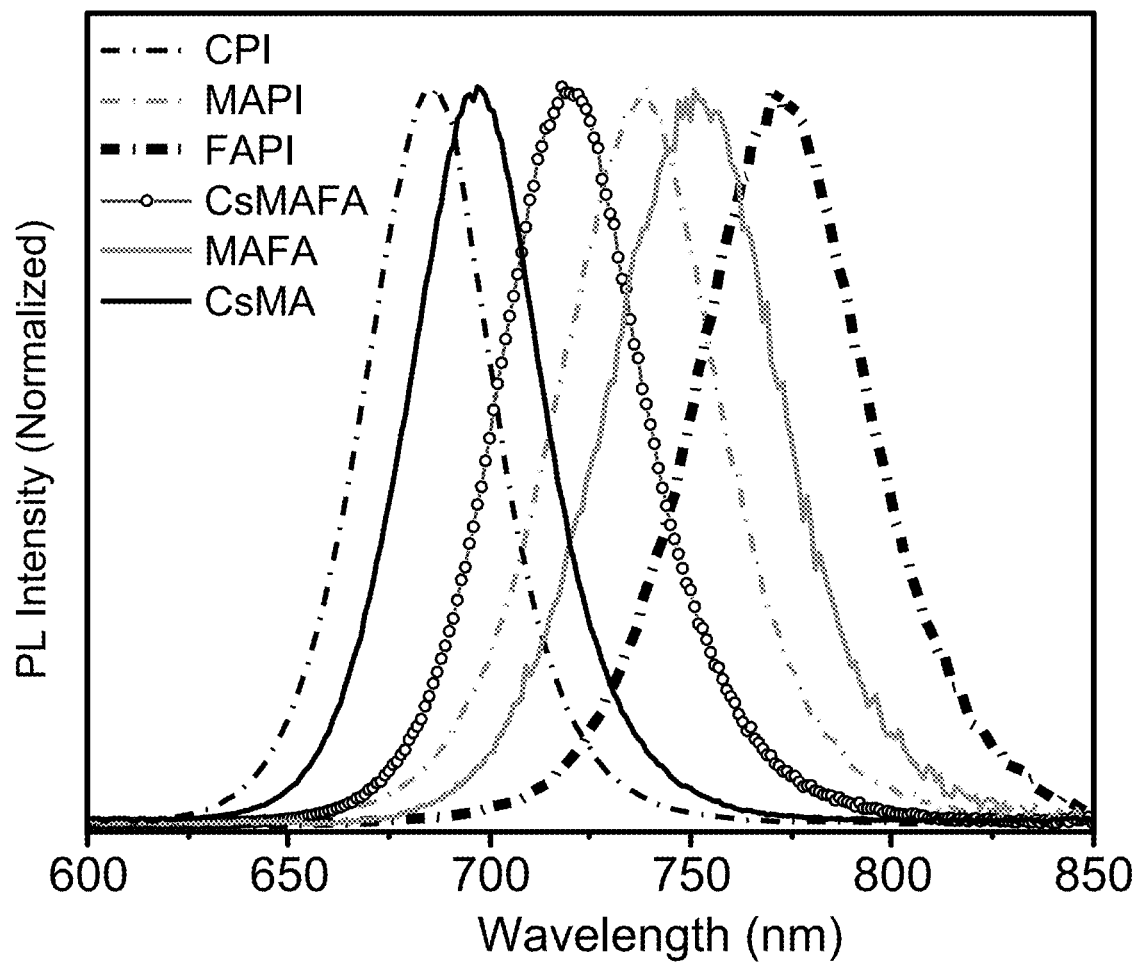
FIG. 23B illustrates the photoluminescence of the various $(Cs_{1-x-y}MA_xFA_y)PbI_3$NCs, according to some embodiments of the present disclosure.
Figure 23C:
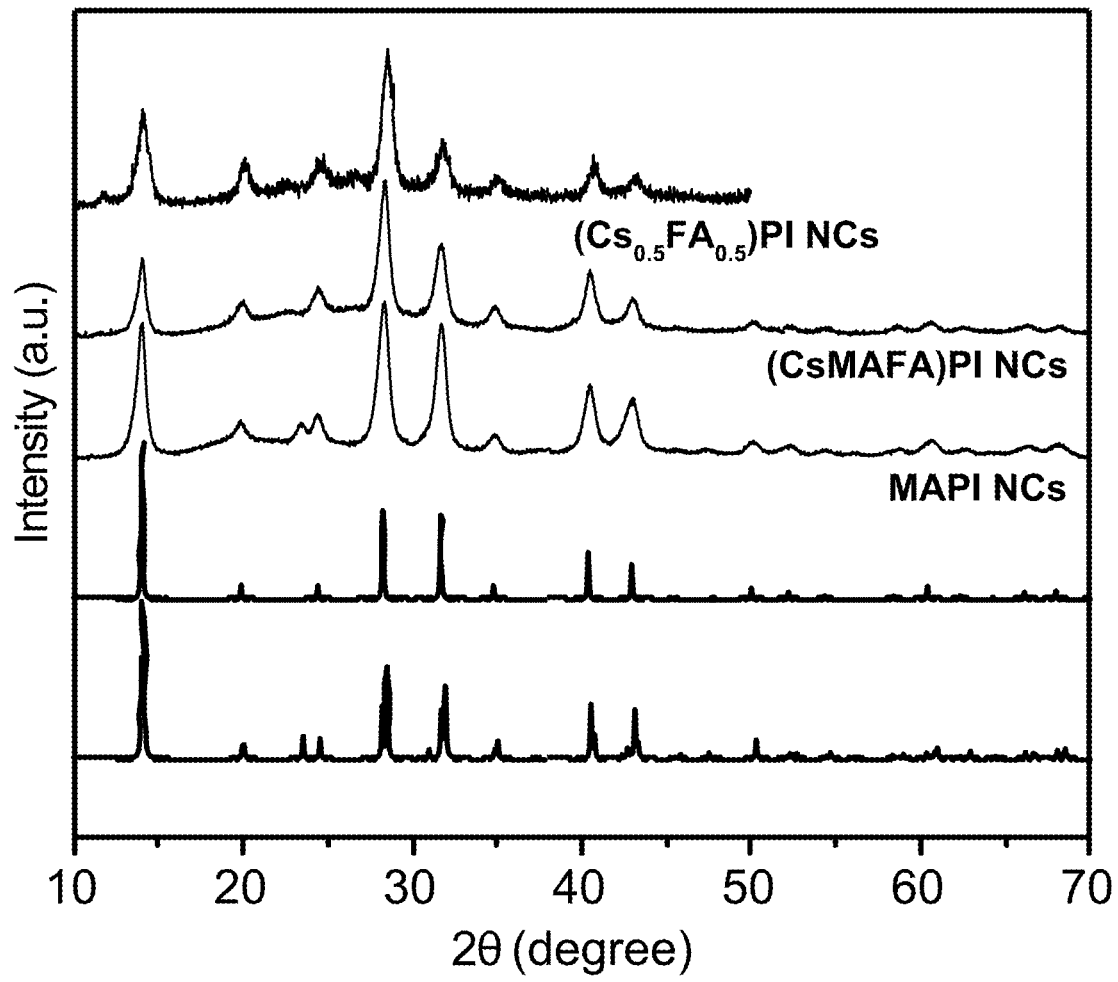
FIG. 23C illustrates x-ray diffraction data of MAPI nanocrystals. The bottom two traces are reference spectra.

In addition, the methods described herein may be employed to produce mixed perovskites having three or more unique A-cations as defined by $A_{1-x-y}A'_xA''_yBX_3$ and/or $A_{1-x-y}A'_xA''_y(X_{1-z}X'_z)_3$, where $0\le 1-x-y\le 1$, $0\le y\le 1$, and $0\le z\le 1$, with specific examples including $Cs_{1-x-y}FA_xMA_yPbI_3$, $Cs_{1-x-y}FA_xMA_yPbBr_3$, $Cs_{1-x-y}FA_xMA_yPb(I_{1-z}Br_z)_3$. FIG. 23A illustrates the optical absorbance of the various $(Cs_{1-x-y}MA_xFA_y)PbI_3$NCs. The dashed lines show the pure phase CsPbI$_3$ (labeled CPI), CH$_3$NH$_3$PbI$_3$ (labeled MAPI), and CH(NH$_2$)$_2$PbI$_3$ (labeled FAPI). The solid lines show various NC compositions with mixed A-site composition. The onset of absorbance can be seen in the various samples to be tunable from 700 to 800 nm based on the A-site composition. FIG. 23B illustrates the corresponding photoluminescence of these samples with peak emission wavelength tunable between 680 and 775 nm. Referring to FIG. 23C, the x-ray diffraction data shows that MAPI nanocrystals exhibit a double at 2theta values of 23-24 confirming existence in the beta phase. The near equal peak heights of the peaks at 28 and 32 2theta also match the reference. In the NCs containing MA, FA and Cs cations, the peaks are closer in height than the NCs only containing FA and Cs. However, the doublet at 23-24 is harder to distinguish. The lower two traces are standard XRD patterns for reference.

Figure 24A:
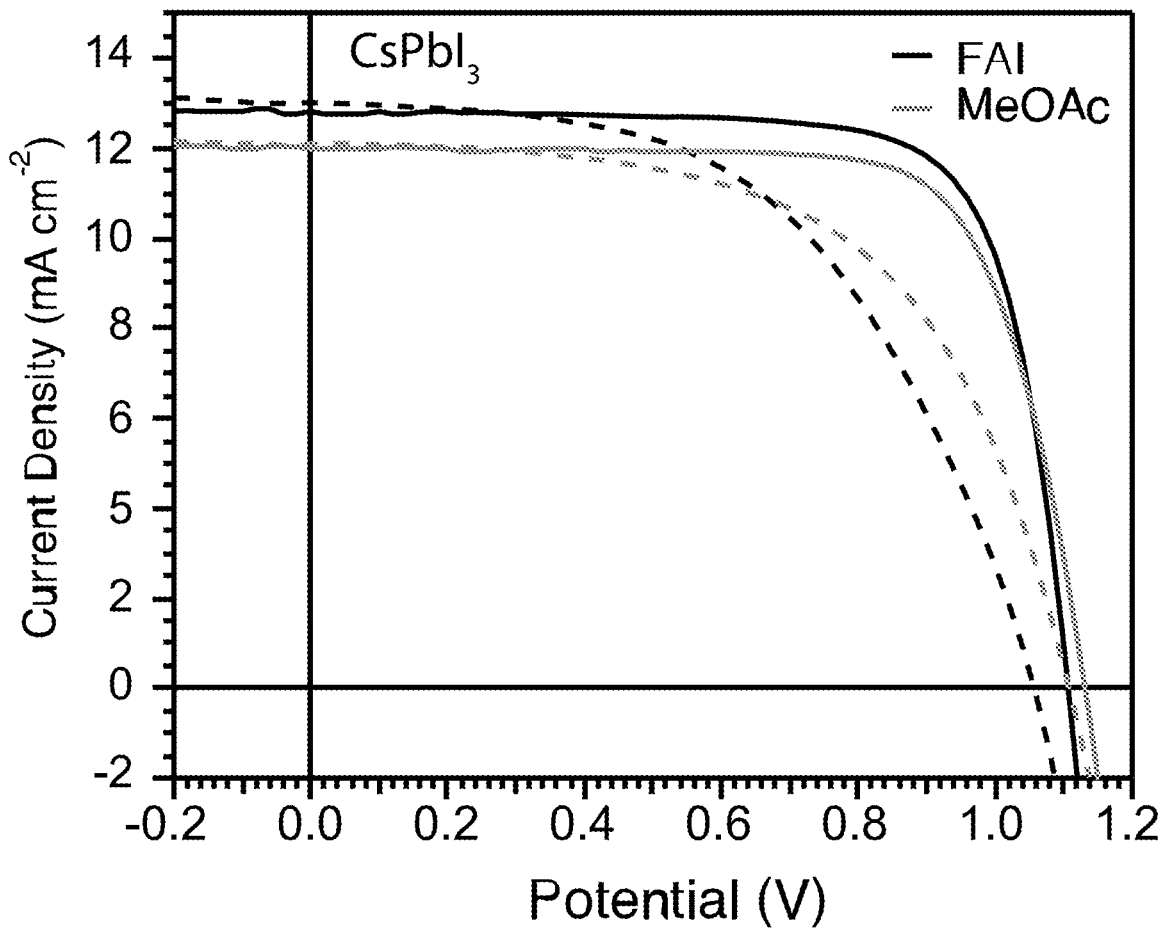
FIGS. 24A, 24B, and 24C illustrate voltage-current plots of three photovoltaic devices that include an active layer made of two layers of nanocrystals, $CsPbI_3$, $MAPbI_3$, $FA_{0.33}MA_{0.33}Cs_{0.33}PbI_3$, respectively, according to some embodiments of the present disclosure.
Figure 24B:
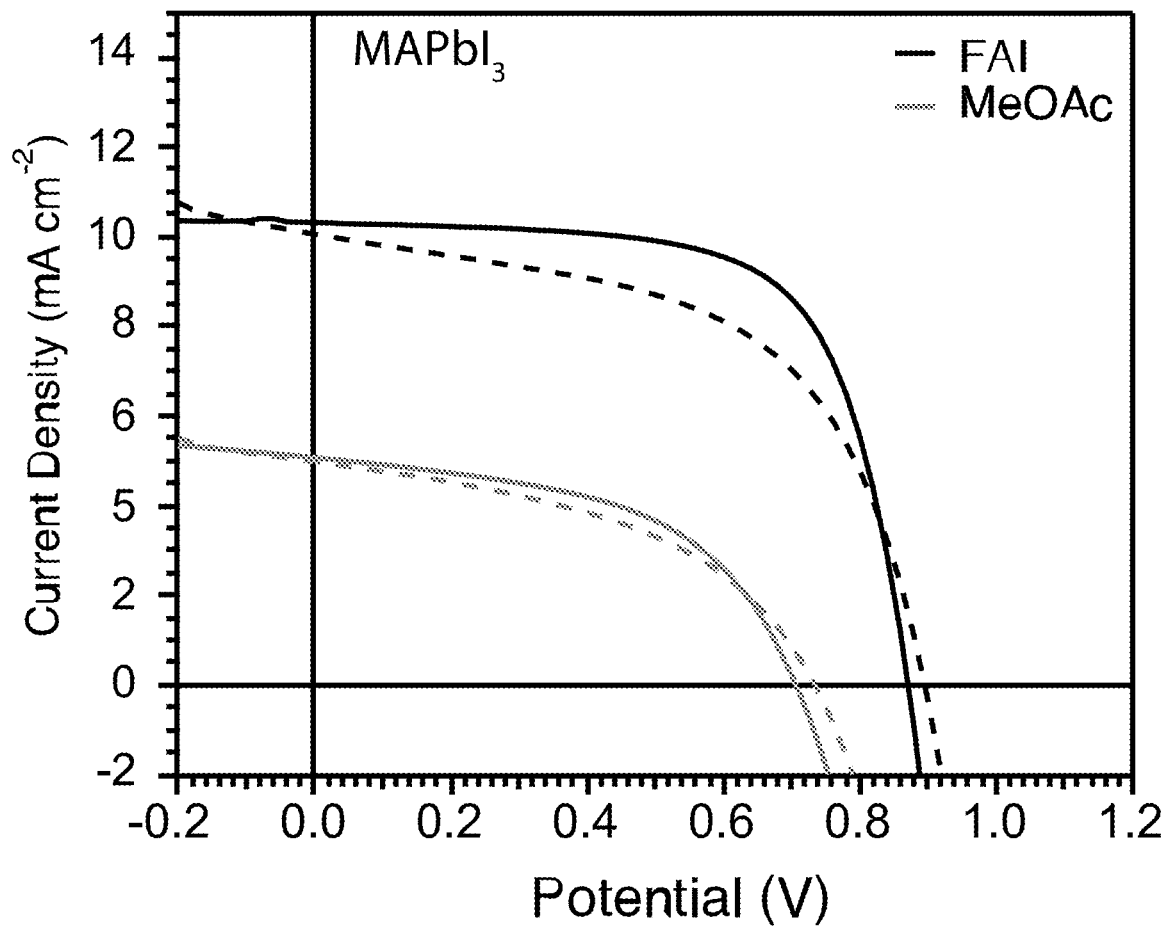
Figure 24C:
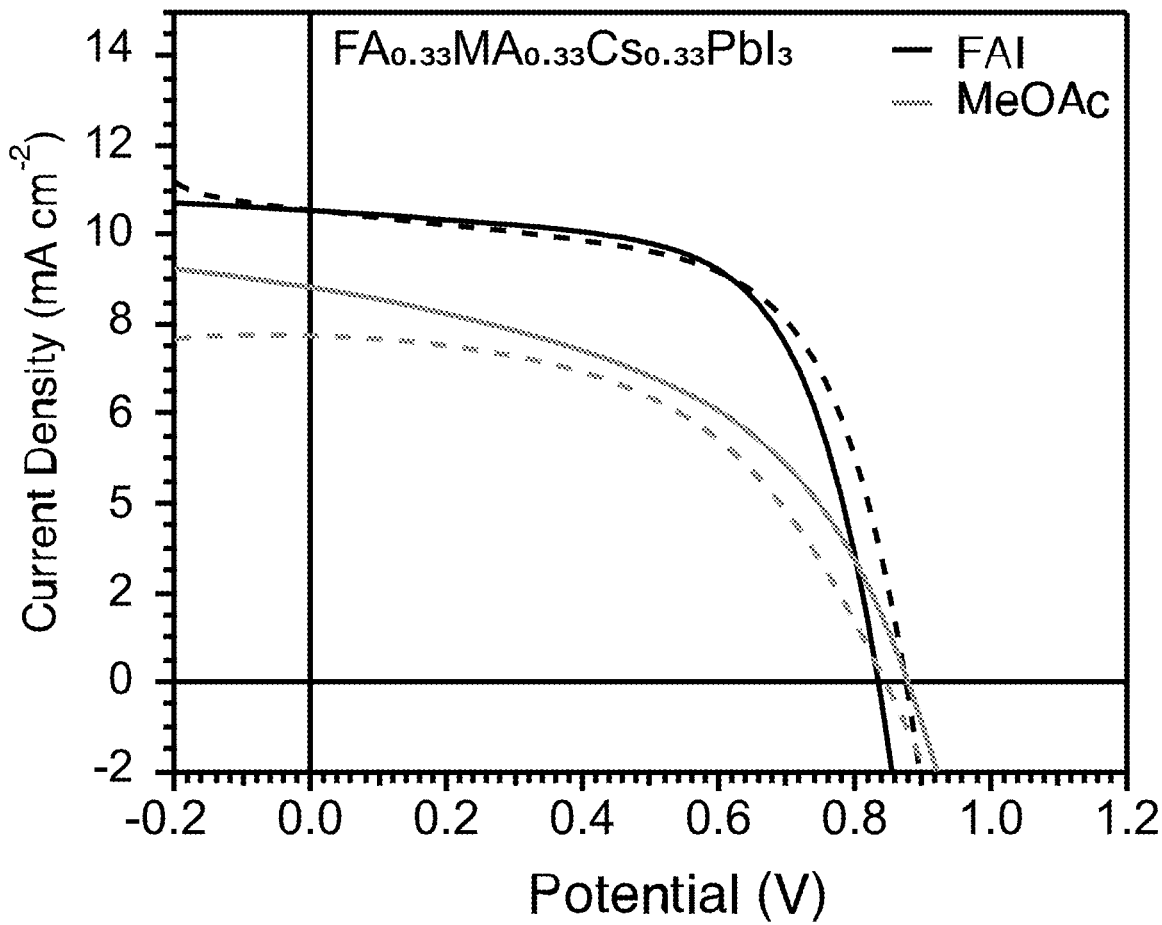

FIGS. 24A, 24B, and 24C compare voltage-current plots of three photovoltaic devices having the general device structure of an active layer made of two layers of nanocrystals (FIG. 24A—CsPbI$_3$, FIG. 24B—MAPbI$_3$, and FIG. 24C—FA$_{0.33}$MA$_{0.33}$Cs$_{0.33}$PbI$_3$) positioned between a layer of TiO$_2$ (acting as both an electron transfer layer and a first contact) and a hole transfer layer of Spiro-OMeTAD doped with lithium and 4-tert-butylpyridine (TBP). Positioned on the hole transfer layer was a second contact made of molybdenum oxide and aluminum. The triple A-cation perovskite NCs was produced according to the methods described above by mixing equal molar amounts of the three starting NC perovskites, CsPbI$_3$, MAPbI$_3$, and FAPbI$_3$. These results illustrate that the NCs are in the perovskite phase and function photovoltaically. The tables below summarize the performance metrics for each device. In some embodiments of the present disclosure, between each layer, the films were treated with MeOAc and after the film was deposited, an additional FAI (in MeOAc or ethylacetate) treatment was performed. Referring again to FIGS. 23A-23C, "MeOAc" refers to experiments not using the FAI treatment (only the MeOAc treatment), whereas "FAI" refers to experiments using the FAI treatment (both the MeOAc and FAI treatments). Without wishing to be bound by theory, the MeOAc may replace oleate with acetate, and the FAI may remove residual oleylammonium ligands with FA ions.

TABLE 2

Device Stack Metrics using CsPbI$_3$ NCs Active Layer

|  | Voc | Jsc | FF | PCE |
| --- | --- | --- | --- | --- |
| FAI | 1.11 | 12.81 | 0.752 | 10.68 |
| MeOAc | 1.13 | 12.02 | 0.741 | 10.08 |

TABLE 3

Device Stack Metrics using MAPbI$_3$ NCs Active Layer

|  | Voc | Jsc | FF | PCE |
| --- | --- | --- | --- | --- |
| FAI | 0.87 | 10.31 | 0.674 | 6.05 |
| MeOAc | 0.71 | 5.07 | 0.511 | 1.83 |

TABLE 4

Device Stack Metrics using FA$_{0.33}$MA$_{0.33}$Cs$_{0.33}$PbI$_3$ NCs Active Layer

|  | Voc | Jsc | FF | PCE |
| --- | --- | --- | --- | --- |
| FAI | 0.84 | 10.54 | 0.636 | 5.60 |
| MeOAc | 0.88 | 8.82 | 0.469 | 3.64 |

In conclusion, the examples above describe a methodology to synthesize colloidal $Cs_{1-x}FA_xPbI_3$ mixed composition NCs via a post-synthetic A-cation cation cross-exchange between $CsPbI_3$ and $FAPbI_3$ NCs. This method allows the synthesis of NCs with compositions that cannot be attained by direct synthesis, or in the bulk. The solar cell performance with these mixed composition perovskite NCs inks shows voltage approaching the SQ limit as compared to the bulk perovskite devices. This method, among other things, provides the opportunity to expand the library of tunable perovskite NCs via cation exchanges.

Methods:

Materials. Cesium Carbonate ($Cs_2CO_3$; 99.9%), Oleic Acid (OA; technical grade, 90%), Oleylamine (OlAm; technical grade, 70%), 1-Octadecene (1-ODE; technical grade, 90%), hexane (reagent grade, ≥95%), Octane (anhydrous, ≥99%), Methyl Acetate (MeOAc, anhydrous, 99.5%), Lead Nitrate ($Pb(NO_3)_2$, 99.999%), Ethyl Acetate (EtOAc, anhydrous, 99.8%), Cesium Iodide (CsI, 99.999%), Formamidinium Acetate (FA-acetate, 99%), Titanium Ethoxide (≥97%), Hydrochloric Acid (HCl; 37% in water), Titanium diisopropoxide bis(acetylacetonate) (TAA, 75 wt % in isopropanol), Chlorobenzene (anhydrous, 99.8%), Acetonitrile (anhydrous, 99.8%), Toluene (anhydrous, 99.8%), 4-tert-Butylpyridine (4-TBP; 96%), Dimethyl Formamide (DMF), Dimethyl Sulfoxide (DMSO) were purchased from Sigma-Aldrich. 2,2',7,7'-tetrakis(N,N-di-p methoxyphenylamine)-9,9'-spirobifluorene (spiro-OMeTAD; ≥99.5% was purchased from Lumtec. Bis(trifluoromethane)sulfonimide lithium salt (Li-TFSI). $PbI_2$ (99.9985%) was purchased from Alfa Aesar. Formamidium Iodide (FAI), was purchased from Dyesol.

Synthesis of Cs-oleate precursor. 1.25 mmol (0.407 g) of $Cs_2CO_3$, 20 ml 1-ODE and 1.25 ml OA were loaded into 3-necked round bottom flask and degassed under vacuum at 60° C. for 30 minutes. The temperature was then increased to 150° C. under $N_2$. Once the $Cs_2CO_3$ reacted completely with the OA, the temperature was reduced to 120° C. and kept at this temperature for injection.

Synthesis of FA-oleate precursor. 5 mmol (0.521 g) of FA-acetate and 10 ml OA were loaded into 3-necked round bottom flask and degassed under vacuum at 50° C. for 30 minutes. The temperature was then increased to 120° C. under $N_2$. Once the FA-acetate completely reacted to form a clear solution, the temperature was reduced to 80° C. and kept at this temperature for injection.

Synthesis of $CsPbI_3$ NCs. $CsPbI_3$ NCs were synthesized following methods known in the field. Briefly, 1.08 mmol (0.5 g) $PbI_2$ and 25 ml 1-ODE were degassed under vacuum at 120° C. for 30 minutes inside a three-necked round bottom flask. A mixture of 2.5 ml OA and 2.5 ml OlAm, preheated to 120° C., was injected into the reaction flask under vacuum. The mixture was briefly degassed until the $PbI_2$ dissolved to form a clear solution. Then the reaction mixture was heated to 180° C. under $N_2$ flow. At 180° C., 2 ml of the Cs-oleate solution was quickly injected into the $PbI_2$ mixture, and the reaction mixture was immediately quenched in an ice-water bath. To separate the $CsPbI_3$ NCs from the reaction liquor, 70 ml of MeOAc was added to the colloidal solution at room temperature and centrifuged at 7500 RPM for 5 minutes. The resulting precipitate was dispersed in 5 ml hexane, reprecipitated with 5 mL MeOAc and centrifuged again at 7500 RPM for 5 minutes. The resulting NCs were dispersed in 15 ml hexane and stored in the refrigerator until used. To prepare solutions for spin coating and cation exchange, the $CsPbI_3$ NCs in hexane were removed from the refrigerator and centrifuged at 7500 for 5 minutes. The precipitate was discarded. The hexane from the supernatant was evaporated, and the NCs were finally redispersed in 1-2 ml of octane.

Synthesis of $FAPbI_3$ NCs. The $FAPbI_3$ NCs were synthesized following methods known in the field. Briefly, 0.74 mmol (0.344 g) $PbI_2$ and 20 ml 1-ODE were degassed under vacuum at 120° C. for 30 minutes. A mixture of 4 ml OA and 2 ml OlAm, preheated to 120° C. was then injected into the $PbI_2$ mixture under vacuum. The mixture was briefly degassed under vacuum until the $PbI_2$ mixture became clear. Under $N_2$ flow, the temperature was reduced to 80° C. At 80° C., 5 ml of the FA-Oleate solution was swiftly injected into the $PbI_2$ mixture. After 5 seconds reaction time, the reaction mixture was quenched using an ice-water bath. After the mixture cooled to room temperature, 1 ml toluene and 5 ml MeOAc were added and the mixture was centrifuged at 8000 RPM for 30 mins. The resulting NC precipitate was dispersed in 7 ml toluene, reprecipitated with 5 mL MeOAc, and centrifuged at 8000 RPM for 10 minutes. The final precipitate was redispersed in 5-7 ml octane and stored under nitrogen for further use. The concentration of the $FAPbI_3$ NCs was adjusted to be comparable to that of the $CsPbI_3$ NC solution before synthesizing the mixed composition perovskites or fabricating devices.

Synthesis of $Cs_{1-x}FA_xPbI_3$ NCs. Colloidal solutions of $CsPbI_3$ and $FAPbI_3$ NCs dispersed in octane were mixed in different ratios to produce the desired Cs:FA stoichiometry. Before mixing, the absorption spectra of the individual samples were measured and the concentration was adjusted so that each solution had a similar optical density near the band edge. The mixture was either left to react for 48 hours at room temperature or reacted at different temperature (maximum 90° C.) for kinetics study.

Synthesis of $CsPb(I_{1-x}Br_x)_3$ NCs. 1.08 mmol of $PbX_2$ powder (mixture of $PbI_2$ and $PbBr_2$) was dissolved in octadecene in a 3-neck flask. The mixture was subjected to a vacuum environment and heated to 110° C. for 10 minutes. 2.5 mL of oleylamine and 2.5 mL oleic acid were heated to 130° C. and injected into the flask. This allows for dissolution of the lead salt; once the salt dissolves, the flask was subjected to a nitrogen environment and the solution was heated to 185° C. As soon as the solution temperature reached 185° C., a Cs-oleate precursor, at 130° C., was injected all at once into the flask. The Cs-oleate precursor was created by dissolving 407 mg of $Cs_2CO_3$ in 20 mL of octadecene and 1.25 mL of oleic acid. Proper dissolution of the Cs-oleate required heating to 150° C. Nucleation of $CsPbX_3$ quantum dots occurs nearly instantaneously as the Cs-oleate is injected into the lead salt solution. In order to maintain relative mono-dispersity of the quantum dots, the flask was cooled to 25-30° C. in an ice bath immediately following injection of the Cs-oleate. Extra ligands were removed from the quantum dot solution by centrifuging with anhydrous methyl acetate for 5 minutes at 3500 RPM. Multiple washing steps were required to produce high yield product.

Synthesis of $FAPb(I_{1-x}Br_x)_3$ NCs. 0.74 mmol of $PbX_2$ powder (mixture of $PbI_2$ and $PbBr_2$) were mixed in 25 mL of octadecene in a 3-neck flask. The mixture was degassed for 20 minutes at 120° C. Separately, 4 mL of oleic acid and 2 mL of oleylamine were mixed at 130° C. for 20 min. The oleic acid/oleylammine mixture was then injected into the Pb-salt flask to dissolve the Pb-salt. Once dissolved, the flask atmosphere was changed to nitrogen and the temperature was adjusted to a targeted reaction temperature. FA-oleate precursor was prepared by mixing 521 mg of FA-acetate in 10-20 mL oleic acid in a 3-neck flask, yielding a FA concentration of 0.25-0.50 mM. This solution was then degassed at 50° C. for 20 minutes, after which, the temperature was increased to 120° C. to induce complete dissolution of the FA-oleate. Once dissolved, the atmosphere of the 3-neck flask was changed to nitrogen before the injection process. The reaction temperature for $FAPb(I_{1-x}Br_x)_3$ QDs varied from linearly 80° C.-135° C. based on halide composition, with $FAPbBr_3$ synthesis occurring at 135° C. and $FAPbI_3$ at 80° C. 5-10 mL of the FA-oleate precursor was rapidly injected into the $PbX_2$ solution at a targeted temperature and the reaction flask was quickly quenched in an ice bath. To remove excess ligands, the reacted QDs were taken into 3 mL of toluene and then subsequently crashed out of solution by adding 5 mL of methyl acetate to the toluene suspension and centrifuging at 8000 RPM for 30 minutes. The supernatant was discarded and the resulting pellet was dispersed in 7 mL of toluene. The toluene based QD solution was mixed with 5 mL of methyl acetate and centrifuged at 8000 RPM for 10 minutes. The resulting supernatant was discarded and the pellet was dispersed in octane for use in characterization and device fabrication.

Synthesis of $FA_{1-x}Cs_xPb(I_{1-x}Br_x)_3$ NCs. First, $FAPbI_3$ and $CsPbBr_3$ QDs were synthesized using the methods outlined above. Then, $FAPbI_3$ and $CsPbBr_3$ QD solutions were mixed at 70° C. for 24 hours in a fixed Cs:FA molar ratio. To confirm the existence of single phase $FA_{1-x}Cs_xPb(I_{1-x}Br_x)_3$ QDs, the resultant nanocrystals were characterized via photoluminescence emission and UV-Vis-NIR absorbance spectroscopy to ensure the convergence of the luminescence peak and first exciton.

Characterization. UV-Vis absorption spectra were measured using a Shimadzu UV-3600 UV-VIS-NIR absorption spectrophotometer. Steady state PL emissions and PL excitation spectra were measured in a Horiba's Fluoromax-4 emission spectrophotometer. TEM images were obtained on a FEI T30 electron microscope with 300 kV accelerating voltage. For the time-resolved PL measurements (TRPL), the samples were excited with a pulsed Fianium continuum laser source with an excitation of 450 nm and repetition rate of 1 MHz, and the emission spectra were collected using a Hamamatsu streak camera (C10910-04). The XRD measurements were done on dropcast NC film using Rigaku's DMax diffractometer with $Cu-k_\alpha$ radiation (wavelength 1.5406 Å).

Perovskite NC Device Fabrication. All the solar devices were fabricated following methods known in the field. Briefly, a ~50 nm $TiO_2$ layer was deposited on patterned FTO coated glass substrate (Thin Film Devices, Inc.; pre-cleaned via sonication in iso-propanol, and then UV-Ozone treated for 10 minutes). The sol-gel $TiO_2$ was prepared by mixing 5 mL ethanol, 2 drops HCl, 125 μL deionized water, and 375 μL of titanium ethoxide, and stirred continuously for 48 hrs. The $TiO_2$ solution was filtered through a 0.20 μm polyvinylidene difluoride filter before use. The sol-gel $TiO_2$ was spin-cast on the FTO/glass substrate at 3000 RPM for 30 seconds, annealed at 450° C. for 30 minutes. 4 layers (~300 nm thick) of the NC absorber ink was then deposited layer-by-layer at 1000 RPM for 20 seconds followed by 2000 RPM for 5 seconds. The ligand exchange steps during the NC layer deposition involved dipping (for ~1-2 seconds) of the device in saturated solution of $Pb(NO_3)_2$ in MeOAc (prepared by sonicating 20 mg $Pb(NO_3)_2$ in 20 ml MeOAc for ~10 minutes, and then removing the excess salt by centrifuging at 3500 for 5 minutes) after each layer deposition followed by rinsing with neat MeOAc and dried immediately with a jet of dry air. After repeating these steps for 4-5 NC layers, the devices were finally soaked in a saturated solution of FAI in EtOAc (prepared by sonicating ~20 mg FAI salt in ~30 ml EtOAc for ~15 minutes, and then removing the excess salt by centrifuging at 3500 for 5 minutes) for ~10 seconds, followed by rinsing with neat MeOAc. The hole transporting materials was prepared by mixing 72.3 mg of spiro-OMeTAD, 28.8 ml of 4-TBP, 1 ml of chlorobenzene, and 17.5 ml of Li-TFSI stock solution (520 mg/ml in acetonitrile). The spiro-OMeTAD solution was then spincast on the NC absorber layer at 5000 RPM for 30 seconds. All deposition and ligand treatment procedures were performed in an ambient condition at relative humidity of ~25-30%. The devices were left in the dry box overnight before depositing the top electrodes. $MoO_x$ was deposited at a rate of 0.1-0.5 Å/s at a base pressure lower than $2 \times 10^{-7}$ Torr for a total thickness of 15 nm. Aluminum electrodes were evaporated at a rate ranging from 0.5-2 Å/s for a total thickness of 120 nm.

Perovskite Thin-film Device Fabrication. $FAPbI_3$ thin-film devices were fabricated using methods known in the field. Briefly, a thin compact $TiO_2$ layer with ~30 nm thickness was first spin cast (700 RPM for 10 seconds, 1000 RPM for 10 seconds and 2000 RPM for 30 seconds) on cleaned, patterned, FTO-coated glass substrates from a 0.2M TAA solution in 1-butanol. The $TiO_2$/FTO/glass substrate was then annealed at 130° C. for 5 minutes and at 450° C. for 60 minutes. A 0.7M stoichiometric FAI and $PbI_2$ solution in anhydrous DMF was prepared inside a glovebox and vortexed for 20 min at room temperature. The resulting clear, bright yellow solution was filtered through a 0.20 μm polyvinylidene difluoride filter and spin-cast inside a glovebox, on the compact $TiO_2$/FTO substrate by a consecutive three-step process: 500 RPM for 3 seconds, 3500 RPM for 10 seconds and 5000 RPM for 30 seconds. 1-2 seconds before the end of second step, a drop of toluene was gently placed on the spinning substrate. The resultant films were annealed at 170° C. for 1 min. For FA/Cs mixed perovskite compositions, absorber layers were deposited following methods known in the field. Briefly, inside a glove-box, stoichiometric amounts of FAI, CsI and $PbI_2$ were dissolved in a mixed solvent of DMSO and DMF (v/v=3/7) to obtain precursor solutions of $Cs_{1-x}FA_xPbI_3$. All the solutions were dissolved at room temperature by vortexing and they are filtered through 0.20 μm polyvinylidene difluoride filters before use. The solutions were then spincast on the $TiO_2$/FTO/glass substrate using the following recipe: (1) 100 RPM for 3 seconds, (2) 3500 RPM for 10 seconds, (3) 5000 RPM for 30 seconds. During (3), after 20 seconds, 1 mL of toluene was deposited on the spinning substrate. The films were annealed at 170° C. for 10 min. Further layers, including spiro-OMeTAD deposition and the electrode depositions, were similar to that of the NC devices mentioned above except gold electrodes were deposited instead of aluminum electrodes. All the depositions were done inside a nitrogen filled glove-box.

Device Characterizations. All the devices were tested using a Newport Oriel Sol3A solar simulator with a xenon lamp source inside a $N_2$-filled glovebox. A KG5 filtered Si reference diode was used to calibrate the lamp intensity to 100 mW/cm$^2$ (AM1.5) and minimize the spectral mismatch of the lamp source. Devices were illuminated through a metal aperture (0.058 cm$^2$). Stabilized power output was measured by holding the device at a constant voltage corresponding to the voltage at the maximum power point of a previous J-V scan. EQE measurements were taken using a Newport Oriel IQE200 system.

Calculation of Goldschmidt Tolerance Factor (GTF). The GTF's for all the mixed A-cation compositions of $Cs_{1-x}FA_xPbI_3$ were calculated using the following formula:

$$t = \frac{[x \cdot r_{Cs} + (1-x) \cdot r_{FA}] + r_X}{\sqrt{2}\,(r_{Pb} + r_X)}$$

where $r_i$ are the ionic radius of the individual species. The Shannon ionic radius for $Cs^+$, $Pb^{2+}$ and $I^-$ were used, while reported effective radius for $FA^+$ was used for the calculation: $r_{Cs}=188$ pm, $r_{Pb}=119$ pm, $r_I=220$ pm, and $r_{FA}=253$ pm.

Determination of Activation Energy. To calculate the activation energy for the A-cation exchange, $CsPbI_3$ and $FAPbI_3$ nanocrystal solutions (1:1 ratio) were mixed at 45, 60, 70, 80 and 90° C., and aliquots were taken at different time intervals for PL emission measurements. The PL emission spectra were then fitted with Gaussian functions to extract the peak emission energies. Before reaching a thermodynamically stable state with a single emission peak, the PL emission spectra of the intermediate aliquots could be resolved and fitted well with two Gaussians. The high energy peak (denoted $E_1$) is indicative of high Cs-containing mixed A-cation perovskites and the low energy peak ($E_2$) is indicative of high FA-containing mixed A-cation perovskites in an ensemble of nanocrystals. The shift of $E_1$ ($\Delta E_1$) and $E_2$ ($\Delta E_2$) from pure $CsPbI_3$ and pure $FAPbI_3$ emission positions, respectively, were found to be exponential as a function of time for all temperatures. The rate at which the emission energies (k) shift was extracted from exponential fitting. The activation energy, $E_a$, was then calculated using the Arrhenius equation:

$$k = A_o \exp\left[-\frac{E_a}{k_B T}\right] \text{ or, } \ln(k) = \left(-\frac{E_a}{k_B}\right)\frac{1}{T} + \ln(A_o)$$

where, $k_B$ is the Boltzmann constant, T is the absolute temperature, and $A_o$ is the pre-exponential factor.

EXAMPLES

Example 1. A method comprising: combining a first perovskite and a second perovskite, wherein: the first perovskite has a first composition comprising a first cation (A), a second cation (B), and a first anion (X), the second perovskite has a second composition comprising a third cation (A'), a fourth cation (B'), and a second anion (X'), and the combining results in the forming of a third perovskite having a third composition comprising at least three of A, A', B, B', X, or X'.

Example 2. The method of Example 1, wherein the first composition comprises at least one of $ABX_3$, $A_2BX_6$, or $A_3B_2X_9$.

Example 3. The method of Example 1, wherein the second composition comprises at least one of $A'B'X'_3$, $A'_2B'X'_6$, or $A'_3B'_2X'_9$.

Example 4. The method of Example 1, wherein the third perovskite composition comprises at least one of $A''B''X''_3$, $A''_2B''X''_6$, or $A''_3B''_2X''_9$, A'' comprises at least one of A or A', B'' comprises at least one of B or B', and X'' comprises at least one of X or X'.

Example 5. The method of Example 1, wherein: the third perovskite composition comprises at least one of $A''B''X''_3$, $A''_2B''X''_6$, or $A''_3B''_2X''_9$, A'' comprises A and A', B'' comprises at least one of B or B', and X'' comprises at least one of X or X'.

Example 6. The method of Example 5, wherein: the third perovskite composition comprises at least one of $A''B''X''_3$, $A''_2B''X''_6$, or $A''_3B''_2X''_9$, A'' comprises A and A', B'' comprises at least one of B or B', and X'' comprises X and X'.

Example 7. The method of Example 1, wherein X comprises a halogen.

Example 8. The method of Example 1, wherein X' comprises a halogen.

Example 9. The method of Example 1, wherein B comprises at least one of a Group 13 Element, a Group 14 Element, a Group 15 element, or a transition metal.

Example 10. The method of Example 1, wherein B' comprises at least one of a Group 13 Element, a Group 14 Element, a Group 15 element, or a transition metal.

Example 11. The method of Example 1, wherein A comprises at least one of an organic cation or an inorganic cation.

Example 12. The method of Example 1, wherein A' comprises at least one of an organic cation or an inorganic cation.

Example 13. The method of Example 11, wherein A comprises at least one of a Group 1 Element, an alkylammonium, or formamidinium (FA).

Example 14. The method of Example 12, wherein A' comprises at least one of a Group 1 Element, an alkylammonium, or formamidinium (FA).

Example 15. The method of Example 13, wherein the alkylammonium is methylammonium (MA).

Example 16. The method of Example 14, wherein the alkylammonium is methylammonium (MA).

Example 17. The method of Example 1, wherein: the first perovskite comprises a least one of $Cs_2BiAgCl_6$, $Cs_2CuBiI_6$, $Cs_2PbI_6$, $Cs_2SnI_6$, $Cs_3Sb_2I_9$, $FAPbI_3$, $CsPbI_3$, $MAPbI_3$, or $MAPbBr_3$, the second perovskite comprises a least one of $Cs_2BiAgCl_6$, $Cs_2CuBiI_6$, $Cs_2PbI_6$, $Cs_2SnI_6$, $Cs_3Sb_2I_9$, $FAPbI_3$, $CsPbI_3$, $MAPbI_3$, or $MAPbBr_3$, the first perovskite is different than the second perovskite.

Example 18. The method of Example 17, wherein the first perovskite comprises $CsPbI_3$ and the second perovskite comprises $FAPbI_3$.

Example 19. The method of Example 18, wherein the third perovskite comprises $Cs_{1-x}FA_xPbI_3$, and $0 \leq 1-x \leq 1$.

Example 20. The method of Example 19, wherein $0.5 \leq 1-x \leq 0.99$.

Example 21. The method of Example 17, wherein the first perovskite comprises $CsPbI_3$ or $CsPbBr_3$ and the second perovskite comprises $FAPbI_3$ or $FAPbBr_3$.

Example 22. The method of Example 21, wherein the third perovskite comprises $Cs_{1-x}FA_xPb(I_{1-y}Br_y)_3$, $0 \leq 1-x \leq 1$, and $0 \leq y \leq 1$.

Example 23. The method of Example 22, wherein $0.5 \leq 1-x \leq 0.99$.

Example 24. The method of Example 1, wherein: the second perovskite further comprises a fifth cation (A*), the third perovskite comprises $A_{1-x-y}A'_xA^*_yB_{1-a}B'_a(X_{1-z}X'_z)_3$, $0 < a \leq 1$, $0 < b \leq 1$, $0 < 1-x-y \leq 1$, $0 < y \leq 1$, and $0 < z \leq 1$.

Example 25. The method of Example 24, wherein: a=1 and the third perovskite comprises $A_{1-x-y}A'_xA^*_yB(X_{1-z}X'_z)_3$.

Example 26. The method of Example 25, wherein: y=1 and the third perovskite comprises $A_{1-x}A'_xB(X_{1-z}X'_z)_3$.

Example 27. The method of Example 26, wherein: z=1 and the third perovskite comprises $A_{1-x}A'_xBX_3$.

Example 28. The method of Example 1, wherein the first perovskite and the second perovskite are provided at a molar ratio of the first perovskite to the second perovskite between 0.1 to 1.0 and 10 to 1.0.

Example 29. The method of Example 28, wherein the ratio is between 0.1 to 1.0 and 1.0 to 1.0.

Example 30. The method of Example 28, wherein the ratio is between 1.0 to 1.0 and 10 to 1.0.

Example 31. The method of Example 1, wherein the combining is performed at a temperature between 15° C. and 150° C.

Example 32. The method of Example 1, wherein the combining is performed for a period of time between 1 hour and 24 hours.

Example 33. The method of Example 1, wherein at least one of the first perovskite or the second perovskite is in a colloidal solution.

Example 34. The method of Example 1, wherein at least one of the first perovskite or the second perovskite comprises a nanocrystal.

Example 35. The method of Example 34, wherein the third perovskite comprises a nanocrystal.

Example 36. The method of Example 1, wherein at least one of the first perovskite or the second perovskite is in the form of a first thin film.

Example 37. A perovskite comprising: $A_{1-x}A'_xBX_3$, wherein: A is a first cation, A' is a second cation, B is a third cation, X is a first anion, and $0<1-x\leq1$.

Example 38. The perovskite of Example 37, further comprising: a second anion (X') such that the perovskite comprises $A_{1-x}A'_xB(X_{1-z}X'_z)_3$, wherein $0<z\leq1$.

Example 39. The perovskite of Example 38, further comprising: a fourth cation (A*) such that the perovskite comprises $A_{1-x-y}A'_xA^*_yB(X_{1-z}X'_z)_3$, wherein $0<y\leq1$.

Example 40. The perovskite of Example 39, further comprising: a fifth cation (B') such that the perovskite comprises $A_{1-x-y}A'_xA^*_yB_{1-a}B'_a(X_{1-z}X'_z)_3$, wherein $0<a\leq1$.

Example 41. The perovskite of Example 37, wherein A comprises at least one of an organic cation or an inorganic cation.

Example 42. The perovskite of Example 37, wherein A' comprises at least one of an organic cation or an inorganic cation.

Example 43. The perovskite of Example 41, wherein A comprises at least one of a Group 1 Element, an alkylammonium, or formamidinium (FA).

Example 44. The perovskite of Example 42, wherein A' comprises at least one of a Group 1 Element, an alkylammonium, or formamidinium (FA).

Example 45. The perovskite of Example 43, wherein the alkylammonium is methylammonium (MA).

Example 46. The perovskite of Example 44, wherein the alkylammonium is methylammonium (MA).

Example 47. The perovskite of Example 39, wherein A* comprises at least one of an organic cation or an inorganic cation.

Example 48. The perovskite of Example 47, wherein A* comprises at least one of a Group 1 Element, an alkylammonium, or formamidinium (FA).

Example 49. The perovskite of Example 48, wherein the alkylammonium is methylammonium (MA).

Example 50. The perovskite of Example 37, wherein B comprises at least one of a Group 13 Element, a Group 14 Element, a Group 15 element, or a transition metal.

Example 51. The perovskite of Example 40, wherein B' comprises at least one of a Group 13 Element, a Group 14 Element, a Group 15 element, or a transition metal.

Example 52. The perovskite of Example 37, wherein X comprises a halogen.

Example 53. The perovskite of Example 38, wherein X' comprises a halogen.

Example 54. The perovskite of Example 39 comprising $Cs_{1-x-y}FA_xMA_yPb(I_{1-z}Br_z)_3$.

Example 55. The perovskite of Example 38 comprising at least one of $Cs_{1-y}MA_yPb(I_{1-z}Br_z)_3$, $Cs_{1-x}FA_xPb(I_{1-z}Br_z)_3$, or $FA_{1-y}MA_yPb(I_{1-z}Br_z)_3$.

Example 56. The perovskite of Example 37 comprising at least one of $Cs_{1-y}MA_yPbI_3$, $Cs_{1-x}FA_xPbI_3$, $FA_{1-y}MA_yPbI_3$, $Cs_{1-y}MA_yPbBr_3$, $Cs_{1-x}FA_xPbBr_3$, or $FA_{1-y}MA_yPbBr_3$.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A perovskite comprising:
   $Cs_{1-x}A'_xPbX_3$, wherein:
   A' is a cation selected from the group consisting of formamidinium (FA), an alkylammonium, hydrazinium, acetylammonium, imidazolium, guanidinium, and mixtures thereof,
   X is an anion selected from the group consisting of chloride, bromide, iodide, and mixtures thereof, and
   wherein $0.5<1-x<1.0$, and wherein $0<x<0.5$.

2. The perovskite of claim 1, wherein the alkylammonium is selected from the group consisting of methylammonium (MA), ethylammonium, propylammonium, butylammonium, dimethylammonium, and mixtures thereof.

3. The perovskite of claim 2, comprising:
   $Cs_{1-x-y}FA_xMA_yPb(I_{1-z}Br_z)_3$, wherein:
   wherein $0.5<1-x-y<1.0$, and wherein $0\leq z\leq1$.

4. The perovskite of claim 2, comprising:
   at least one of $Cs_{1-x}MA_xPb(I_{1-z}Br_z)_3$ or $Cs_{1-x}FA_xPb(I_{1-z}Br_z)_3$, wherein:
   $0\leq z\leq1$.

5. The perovskite of claim 2, comprising at least one of $Cs_{1-x}MA_xPbI_3$, $Cs_{1-x}FA_xPbI_3$, $Cs_{1-x}MA_xPbBr_3$, or $Cs_{1-x}FA_xPbBr_3$.

6. The perovskite of claim 1, wherein the perovskite is characterized by photoluminescence having a peak emission wavelength between about 680 nm and about 775 nm.

7. A perovskite comprising:
$Cs_{1-x}A'_xPbX_3$, wherein:
the perovskite comprises a nanocrystal having a characteristic length between about 650 nm and about 800 nm,
A' is a cation selected from the group consisting of formamidinium (FA), an alkylammonium, hydrazinium, acetylammonium, imidazolium, guanidinium, and mixtures thereof,
X is an anion selected from the group consisting of chloride, bromide, iodide, and mixtures thereof, and
wherein $0.5<1-x<1.0$, and wherein $0<x<0.5$.

8. The perovskite of claim 7, wherein the alkylammonium is selected from the group consisting of methylammonium (MA), ethylammonium, propylammonium, butylammonium, dimethylammonium, and mixtures thereof.

9. The perovskite of claim 8, comprising:
$Cs_{1-x-y}FA_xMA_yPb(I_{1-z}Br_z)_3$, wherein:
wherein $0.5<1-x-y<1.0$, and wherein $0\le z\le 1$.

10. The perovskite of claim 8, comprising:
at least one of $Cs_{1-x}MA_xPb(I_{1-z}Br_z)_3$ or $Cs_{1-x}FA_xPb(I_{1-z}Br_z)_3$, wherein:
$0\le z\le 1$.

11. The perovskite of claim 8, comprising at least one of $Cs_{1-x}MA_xPbI_3$, $Cs_{1-x}FA_xPbI_3$, $Cs_{1-x}MA_xPbBr_3$, or $Cs_{1-x}FA_xPbBr_3$.

12. A method comprising:
combining a first perovskite and a second perovskite, wherein:
the first perovskite has a first composition comprising $CsPbX_3$,
the second perovskite has a second composition comprising $A'PbX'_3$, and
the combining results in the forming of a third perovskite having a third composition comprising $Cs_{1-x}A'_xPb(X_{1-z}X'_z)_3$,
A' is a cation selected from the group consisting of formamidinium (FA), an alkylammonium, hydrazinium, acetylammonium, imidazolium, guanidinium, and mixtures thereof,
X is an anion selected from the group consisting of chloride, bromide, and iodide,
X' is an anion selected from the group consisting of chloride, bromide, and iodide,
wherein $0.5<1-x<1.0$, and wherein $0<x<0.5$, and wherein $0\le z\le 1$.

13. The method of claim 12, wherein:
the first perovskite comprises a least one of $CsPbI_3$, $CsPbBr_3$, or $CsPbCl_3$, and
the second perovskite comprises a least one of $FAPbI_3$, $FAPbBr_3$, $FAPbCl_3$, $MAPbI_3$, $MAPbBr_3$, or $MAPbCl_3$.

14. The method of claim 13, wherein the third perovskite comprises $Cs_{1-x}FA_xPb(I_{1-z}Br_z)_3$.

15. The method of claim 12, wherein the first perovskite and the second perovskite are provided at a molar ratio of the first perovskite to the second perovskite between 0.1 to 1.0 and 10 to 1.0.

* * * * *